United States Patent
Jang et al.

(10) Patent No.: US 11,892,495 B2
(45) Date of Patent: Feb. 6, 2024

(54) INSULATION MONITORING DEVICE AND CONTROL METHOD THEREFOR

(71) Applicants: LS ELECTRIC CO., LTD., Anyang-Si (KR); CHUNGBUK NATIONAL UNIVERSITY INDUSTRY-ACADEMIC COOPERATION FOUNDATION, Cheongju-si (KR); DONGWOO ELECTRIC CORP., Pyeongtaek-si (KR)

(72) Inventors: Suhyeong Jang, Anyang-si Gyeonggi-do (KR); Jongphil Hong, Dalbit-ro Sejong-si (KR); Pyungjung Kim, Pyeongtaek-si Gyeonggi-do (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 0 days.

(21) Appl. No.: 17/756,611

(22) PCT Filed: Apr. 2, 2020

(86) PCT No.: PCT/KR2020/004502
§ 371 (c)(1),
(2) Date: May 27, 2022

(87) PCT Pub. No.: WO2021/107289
PCT Pub. Date: Jun. 3, 2021

(65) Prior Publication Data
US 2022/0413033 A1    Dec. 29, 2022

(30) Foreign Application Priority Data

Nov. 28, 2019  (KR) .......................... 10-2019-0156141
Dec. 30, 2019  (KR) .......................... 10-2019-0178611
Dec. 31, 2019  (KR) .......................... 10-2019-0179996

(51) Int. Cl.
*H01H 31/12* (2006.01)
*G01R 31/12* (2020.01)
*G01R 31/14* (2006.01)

(52) U.S. Cl.
CPC .......... *G01R 31/1245* (2013.01); *G01R 31/14* (2013.01)

(58) Field of Classification Search
CPC ...... G01R 31/025; G01R 31/14; G01R 31/18; G01R 31/40; G01R 31/52; G01R 31/1245; G01R 31/1272
See application file for complete search history.

(56) References Cited

U.S. PATENT DOCUMENTS

| 10,175,288 B2 * | 1/2019 | Pritelli ................ G01R 31/006 |
| 2007/0210805 A1 * | 9/2007 | Kawamura ............ G01R 31/44 324/541 |

(Continued)

FOREIGN PATENT DOCUMENTS

| DE | 10105200 C1 | 9/2002 |
| EP | 0654673 B1 | 7/2002 |

(Continued)

OTHER PUBLICATIONS

International Search Report for related International Application No. PCT/KR2020/004502; report dated Jun. 3, 2021; (5 pages).

(Continued)

*Primary Examiner* — Thang X Le
(74) *Attorney, Agent, or Firm* — K&L Gates LLP

(57) ABSTRACT

Insulation monitoring may be provided by a signal generation unit for applying a pulse signal to an electric line; a signal measurement unit for measuring the voltage of an applied pulse signal from the ground, when the pulse signal is applied to the ground through insulation resistance; an average voltage calculation unit for calculating the average (Continued)

voltage of the voltages measured during a period depending on sampling intervals; and a control unit for calculating the sampling intervals on the basis of an initial sampling interval and a preset time multiple, calculating the average voltage during the sampling period according to the calculated sampling intervals, and, according to whether the difference between calculated first and second average voltages measured before the first average voltage is within a first error range, detecting the first average voltage as a normal voltage, or calculating the sampling intervals by applying different time multiples thereto.

23 Claims, 25 Drawing Sheets

(56) References Cited

U.S. PATENT DOCUMENTS

| | | | | |
|---|---|---|---|---|
| 2018/0313885 | A1* | 11/2018 | Bilic | H01B 17/56 |
| 2019/0227110 | A1* | 7/2019 | Lindsey | G01R 31/085 |
| 2021/0148993 | A1* | 5/2021 | Takamatsu | G01R 31/52 |
| 2021/0293896 | A1* | 9/2021 | Kubokawa | G01R 31/52 |

FOREIGN PATENT DOCUMENTS

| | | |
|---|---|---|
| JP | H09318696 A | 12/1997 |
| JP | H116854 A | 1/1999 |
| JP | 2010151576 A | 7/2010 |
| JP | 2011185890 A | 9/2011 |
| JP | 2015197308 A | 11/2015 |
| KR | 20100007445 A | 1/2010 |
| KR | 100979285 B1 | 8/2010 |
| KR | 20110094431 A | 8/2011 |
| KR | 20190030831 A | 3/2019 |

OTHER PUBLICATIONS

Written Opinion for related International Application No. PCT/KR2020/004502; report dated Jun. 3, 2021; (7 pages).
Notice of Allowance of Korean Patent Application No. 10-2019-0179996; action dated Feb. 22, 2021; (2 pages).
Notice of Allowance of Korean Patent Application No. 10-2019-0178611; action dated Feb. 1, 2021; (3 pages).
Notice of Allowance of Korean Patent Application No. 10-2019-0156141; action dated Dec. 24, 2020; (3 pages).
Office Action for related Japanese Application No. 2022-557631; action dated Jun. 6, 2023; (2 pages).
Extended European Search Report for related European Application No. 20893395.2; action dated Nov. 17, 2023; (14 pages).

* cited by examiner (a)

(b)

INSULATION MONITORING DEVICE AND CONTROL METHOD THEREFOR

CROSS-REFERENCE TO RELATED APPLICATIONS

This application is the National Stage filing under 35 U.S.C. 371 of International Application No. PCT/KR2020/004502, filed on Apr. 2, 2020, which claims the benefit of earlier filing date and right of priority to Korea utility model Application No. 10-2019-0156141 filed Nov. 28, 2019; Korean utility model Application No. 10-2019-0178611 filed Dec. 30, 2019; and Korea utility model Application No. 10-2019-0179996 filed Dec. 31, 2019, the contents of which are all hereby incorporated by reference herein in their entirety.

The present disclosure relates to an insulation monitoring device for preventing a fault by detecting a ground fault and the like in advance in an ungrounded (IT: Insulation Terra) power system, and a method for controlling the same.

BACKGROUND

Insulation Terra (IT) grounding is a method in which none of electric lines are grounded and only an enclosure of a load is grounded. The IT grounding method has the advantage of ensuring a continuous operation of a system because there is time to find a site where a ground fault has occurred without stopping the operation of the system even when the ground fault occurs in any one of the electric lines.

However, since the system can be operated even when the ground fault occurs, it is necessary to continuously monitor an insulation state of the electric lines even when the system is in operation. Accordingly, the International Electro-technical Commission (IEC) 61557 mandates the installation of an insulation monitoring device capable of monitoring the insulation state of the electric lines.

Accordingly, in Korea as well, technical standards for electrical equipment have been announced in Announcement No. 2019-667 of the Ministry of Trade, Industry and Energy on Nov. 21, 2019, to install appropriate protection and control devices such as IMD in electrical storage devices using secondary batteries.

The insulation monitoring device is disposed between the ground and an electric line, and forms a circuit between the electric line and the ground by an insulation resistance disposed between the electric line and the ground, and includes a pulse signal generation unit for injecting a signal into the circuit, and a detection resistor for detecting a voltage according to a pulse wave signal. The insulation monitoring device then measures and analyzes a voltage across the detection resistor to detect a steady-state voltage (in a steady insulation state), and calculates a value (magnitude) of insulation resistance based on the detected voltage, thereby monitoring the insulation state of the electric line.

However, such a typical insulation monitoring device has a problem in that the voltage measured from the detection resistor is analyzed according to a fixed time multiple to detect the steady-state voltage. As a result, a time required to detect the steady-state voltage becomes longer, which causes an increase in a time required to calculate and display the value of the insulation resistance, that is, a response time of the insulation monitoring device.

In addition, the typical insulation monitoring device removes noise generated in a pulse wave signal, which is measured through the circuit between the electric line and the ground, merely by using a single analog resistor capacitor (RC) filter, which is vulnerable to noise inside the monitoring device and noise of an analog-to-digital converted detection voltage.

On the other hand, the typical insulation monitoring device determines sampling periods while gradually increasing a sampling time according to a fixed time multiple to detect the steady-state voltage, and detects an average voltage calculated in a current sampling period as the steady-state voltage when a difference between average voltages calculated in the respective sampling periods is less than or equal to a preset error.

However, in the case of detecting the steady-state voltage only based on the average voltage, there is a problem that a voltage which is not in a stabilized state is determined as a stabilized voltage when the difference between the average voltages is calculated to be less than or equal to the preset error due to fluctuations in the voltage value in a state where a sampling time interval is set to be short at the beginning of detection. In this case, since the voltage is not stabilized, a voltage higher than an actual stabilized voltage may be determined as the stabilized voltage, which may cause a problem in that the value of the insulation resistance is incorrectly measured.

On the other hand, in order to accurately calculate the value of the insulation resistance, it is necessary to invert the polarity of a pulse signal to calculate the steady-state voltage. In this case, when the polarity of the pulse signal is inverted, a voltage becomes temporarily unstable due to a surge caused by a voltage difference of the inverted pulse signal. And when a predetermined time elapses, the voltage is stabilized again. The value of the insulation resistance may be calculated by the stabilized voltage. Accordingly, the insulation monitoring device determines sampling periods while gradually increasing a sampling time according to a fixed time multiple in order to detect the voltage in the stabilized state, that is, the steady-state voltage, and detects an average voltage calculated in a current sampling period as the steady-state voltage when a difference between the average voltages calculated in the respective sampling periods is less than or equal to a preset error, so as to minimize a time required for detecting the steady voltage after the pulse signal is inverted and thereby minimize a time for calculating the value of the insulation resistance.

On the other hand, the typical insulation monitoring device determines whether the voltage is in the stabilized state according to the difference between the average voltages. Therefore, the insulation monitoring device calculates the difference between the average voltages regardless of an elapsed time after the inversion of the pulse signal. As a result, the calculation of the difference between the average voltages is repeatedly carried out even though the voltage is extremely unstable immediately after the pulse signal is inverted. In this case, a significant difference between the average voltages may be calculated as the voltage is unstable. This may cause the calculation of the average voltage to be repeatedly performed even while the voltage is severely unstable.

As such, the typical insulation monitoring device calculates the difference between the average voltages regardless of the elapsed time after the inversion of the pulse signal. Such unnecessary measurement processes are repeated, which cause an increase in power consumption.

SUMMARY OF INVENTION

The present disclosure is to solve the aforementioned problems, and an aspect of the present disclosure is to provide an insulation monitoring device capable of more shortening a detection time of a steady-state voltage so as to have a shorter response time by way of changing a time multiple for detecting the steady-state voltage according to a voltage analyzed from a detection resistor, and a method for controlling the insulation monitoring device to further improve a response time of the insulation monitoring device.

In addition, the present disclosure is to solve the aforementioned problems, and an aspect of the present disclosure is to provide an insulation monitoring device capable of calculating a value of insulation resistance more accurately by removing noise from an inside of the insulation monitoring device or from an analog-digital converted detection voltage, and a method for controlling the same.

The present disclosure is to solve the aforementioned problems, and an aspect of the present disclosure is to provide an insulation monitoring device capable of preventing a case where a voltage in an unstable state is determined as a steady-state voltage, and a method for controlling the same.

The present disclosure is to solve the aforementioned problems, and an aspect of the present disclosure is to provide an insulation monitoring device capable of reducing power consumption by preventing repetition of unnecessary measurement processes, and a method for controlling the same.

Also, an aspect of the present disclosure is to provide an insulation monitoring device capable of calculating an optimized idle time by detecting a stabilized voltage according to an applied pulse signal in the shortest time without performing unnecessary measurement processes according to a change in measured voltage, and a method for controlling the same.

In order to achieve those aspects of the subject matter disclosed herein, there is provided an insulation monitoring device which includes insulation resistance disposed between an electric line of a system and a ground. The device may include a signal generation unit configured to apply a pulse signal having a voltage of a predetermined magnitude to the electric line, a signal measurement unit connected to the ground and configured to measure a voltage of the pulse signal applied from the ground when the pulse signal applied to the electric line is applied to the ground through the insulation resistance, an average voltage calculation unit configured to calculate an average voltage of voltages measured by the signal measurement unit during a sampling period according to a set sampling interval, and a control unit configured to calculate a sampling interval based on an initial sampling interval and a preset time multiple, calculate an average voltage as a first average voltage during a sampling period according to the calculated sampling interval, and detect the calculated first average voltage as a steady-state voltage according to whether a difference between the calculated first average voltage and a second average voltage calculated before the first average voltage is within a preset first error range, or update the sampling interval by applying a different time multiple according to the difference between the first average voltage and the second average voltage.

In one implementation, the control unit may be configured to update a sampling interval of a sampling period for calculating a next average voltage according to a first time multiple when the difference between the first average voltage and the second average voltage exceeds a preset second error range, and update the sampling interval of the sampling period for calculating the next average voltage according to a second time multiple when the difference between the first average voltage and the second average voltage is equal to or less than the preset second error range. The second time multiple may have a value smaller than the first time multiple, and the second error range may be larger than the first error range.

In one implementation, the first time multiple and the second time multiple may be 1.66 and 1.33, respectively, and the first error range and the second error range may be 1% and 5% of the second average voltage, respectively.

In one implementation, the control unit may determine the initial sampling interval according to one of an initial value calculated according to internal resistance of the insulation monitoring device, and a period of a preset noise frequency, which is greater than another.

In one implementation, the device may further include a memory configured to store information related to different sampling intervals corresponding to a plurality of different time constants, respectively. The control unit may calculate a first sampling interval according to one of an initial value calculated according to internal resistance of the insulation monitoring device, and a period of a preset noise frequency, which is greater than another, determine a plurality of interval determination time points for calculating a slope of a voltage measured by the signal measurement unit based on the first sampling interval, calculate a ratio between a first slope according to a voltage difference between interval determination time points including a plurality of first sampling intervals and a second slope according to a voltage difference between other interval determination time points including the plurality of first sampling intervals, and determine one of the different sampling intervals as the initial sampling interval based on a time constant corresponding to the calculated slope ratio.

In one implementation, when the first average voltage is determined as a steady-state voltage according to a type of the applied pulse signal, the control unit may control the signal generation unit to invert the pulse signal to a predetermined another type of pulse signal according to whether there is a steady-state voltage according to the predetermined another type of pulse signal, and control the signal measurement unit and the average voltage calculation unit to detect the steady-state voltage according to the another type of pulse signal.

In one implementation, the control unit may calculate a value of the insulation resistance based on steady-state voltages according to different types of pulse signals when there is the steady-state voltage according to the predetermined another type of pulse signal.

In one implementation, the control unit may control the signal generation unit, the signal measurement unit, and the average voltage calculation unit to check whether a preset number of insulation resistance values are calculated, and calculate the insulation resistance value again when the insulation resistance values less than the preset number are calculated. The control unit may then calculate an average value of the calculated insulation resistance values so as to determine a final value of the insulation resistance when the preset number of insulation resistance values are calculated as a result of the check.

In one implementation, the control unit may control the signal generation unit, the signal measurement unit, and the average voltage calculation unit to calculate a difference between the calculated insulation resistance values when the preset number of insulation resistance values are calculated, change a noise frequency according to a preset ratio when the calculated difference exceeds a preset threshold value, and calculate the preset number of insulation resistance values again according to the changed noise frequency.

In one implementation, the control unit may check whether a period of the noise frequency is less than a preset minimum value when the final value of the insulation resistance is finally determined based on an average value of the preset number of insulation resistance values, and determine the period of the noise frequency as the minimum value when the period of the noise frequency is less than the preset minimum value.

In one implementation, the signal measurement unit may include a detection resistor, an amplifier to amplify a voltage difference across the detection resistor, an Analog-to-Digital Converter (ADC) to convert the voltage difference amplified by the amplifier into a digital voltage value and input the converted voltage value to the control unit, and at least one of a first analog filter disposed between the detection resistor and the amplifier to remove noise from a voltage applied across the detection resistor, and a second analog filter connected between the amplifier and the ADC to remove noise from the voltage difference amplified by the amplifier.

In one implementation, the ADC may include a converter to convert the amplified voltage difference into a digital voltage value, and a digital filter disposed between the converter and the control unit to remove noise from digital voltage values input to the control unit.

In order to achieve those aspects of the subject matter disclosed herein, there is provided a method for controlling an insulation monitoring device comprising insulation resistance disposed between an electric line of a system and a ground. The method may include: applying a pulse signal having a voltage of a predetermined magnitude to the electric line; determining an initial sampling interval; calculating a sampling interval according to the determined initial sampling interval, calculating an average voltage during a sampling period according to the calculated sampling interval, and calculating an average voltage during a sampling period according to a sampling interval updated according to a first time multiple; detecting whether a difference between a currently calculated first average voltage and a second average voltage measured before the first average voltage is within a preset first error range; identifying the first average voltage as a steady-state voltage according to the applied pulse signal or updating the sampling interval by applying a different time multiple according to the difference between the first average voltage and the second average voltage, as a result of the detection; repeatedly performing steps of calculating the average voltage during the sampling period according to the updated sampling interval, detecting whether the difference between the voltages is within the preset first error range until the steady-state voltage is identified, and updating the sampling interval by applying the different time multiple; detecting whether there is a steady-state voltage according to a pre-identified another type of pulse signal when the steady-state voltage is identified; inverting the pulse signal to the pre-identified another type of pulse signal when the pre-identified another type of pulse signal is present as a result of detecting whether there is the steady-state voltage according to the pre-identified another type of pulse signal, and identifying a steady-state voltage according to the another type of pulse signal by re-performing from the step of determining the initial sampling interval to the repeatedly-performing step; and calculating a value of the insulation resistance based on steady-state voltages according to different types of pulse signals when the pre-identified another type of pulse signal is present as a result of the detection of the step of detecting whether there is the steady-state voltage according to the pre-identified another type of pulse signal.

In one implementation, the updating the sampling interval by applying the different time multiple may include updating the sampling interval according to a first time multiple when the difference between the first average voltage and the second average voltage exceeds a preset second error range, and updating the sampling interval according to a second time multiple when the difference between the first average voltage and the second average voltage is equal to or less than the preset second error range. The second time multiple may have a value smaller than the first time multiple, and the second error range may be larger than the first error range.

In one implementation, the determining the initial sampling interval may be configured to calculate the initial sampling interval according to one of an initial value calculated according to internal resistance of the insulation monitoring device, and a period of a preset noise frequency, which is greater than another.

An insulation monitoring device according to an implementation may include a signal generation unit configured to apply a pulse signal having a voltage of a predetermined magnitude to an electric line, a signal measurement unit connected to a ground and configured to measure a voltage of the pulse signal applied from the ground when the pulse signal applied to the electric line is applied to the ground through the insulation resistance, an average voltage calculation unit configured to calculate an average voltage of voltages measured by the signal measurement unit during a sampling period according to a set sampling interval, and a control unit configured to calculate a sampling interval based on an initial sampling interval and a preset time multiple, calculate an average voltage as a first average voltage during a sampling period according to the calculated sampling interval, performing a tuning process for comparing the calculated first average voltage with a second average voltage calculated before the first average voltage, and detect the second average voltage as a steady-state voltage according to whether a time elapsed from a sampling starting time point is a predetermined time or longer when the difference between the average voltages is within a preset error range, or re-performing the tuning process.

In one implementation, the control unit may perform a primary tuning process according to a preset first time multiple, perform a secondary tuning process for determining a sampling interval of a sampling period for calculating an average voltage according to a second time multiple different from the first time multiple when the difference between the first average voltage and the second average voltage is equal to or less than a preset first error range according to a result of the primary tuning, and detect the second average voltage as a steady-state voltage according to whether the predetermined time has elapsed from a starting time point of the second tuning when the difference between the first average voltage and the second average voltage is equal to or less than a preset steady-state voltage error according to a result of the secondary tuning.

In one implementation, the control unit may terminate the primary tuning when the difference between the first average voltage and the second average voltage is equal to or less than the preset first error as the result of the primary tuning, determine at least one reference point based on a starting time point of the primary tuning, the initial sampling interval, and a termination time point of the primary tuning, to calculate a plurality of voltage slopes based on a voltage difference between voltages according to the determined at least one reference point, and calculate a time constant based on a slope ratio according to the calculated voltage slopes, to determine the predetermined time based on the calculated time constant.

In one implementation, when the primary tuning is terminated, the control unit may determine a starting time point of the primary tuning, a point of time that the initial sampling interval has elapsed from the starting time point, a termination time point of the primary tuning, a point of time before the initial sampling interval from the termination time point of the primary tuning, as the reference points, and calculate a slope ratio according to Equation based on the determined reference points.

$$\text{First slope} = \frac{\text{Second voltage} - \text{Starting voltage}}{\text{Second reference point} - \text{Starting point}} \quad [\text{Equation}]$$

$$\text{Second slope} = \frac{\text{Third voltage} - \text{First voltage}}{\text{third reference point} - \text{First reference point}}$$

$$\text{Slope ratio} = \frac{\text{Second slope}}{\text{First slope}}$$

where the starting point denotes a point of time at which the sampling is started, the first reference point denotes a point of time that an initial sampling interval has elapsed from the starting point, the third reference point denotes a termination time point of the primary tuning, and the second reference point denotes a point of time before the initial sampling interval from the third reference point.

The start voltage denotes a voltage of the starting point, the first voltage denotes a voltage of the first reference point, the second voltage denotes a voltage of the second reference voltage, and the third voltage denotes a voltage of the third reference point.

In one implementation, the control unit may calculate a time constant T according to an operation result of a natural logarithm (ln) with respect to the slope ratio and a time interval between the first reference point and the starting point, and determine the predetermined time based on a preset multiple of the calculated time constant.

In one implementation, the control unit may calculate the time constant according to whether the calculated slope ratio is equal to or greater than a preset threshold value, and reset the initial sampling interval based on the calculated time constant and Equation below when the time constant is calculated, to perform the second tuning process based on the reset initial sampling interval.

$$t_n = -\ln(1-0.01) \times \tau \quad [\text{Equation}]$$

where tn denotes the reset initial sampling interval and T denotes the time constant.

In one implementation, the control unit may perform the second tuning process based on the initial sampling interval when the time constant is not calculated according to a result of comparing the calculated slope ratio and the threshold value.

In one implementation, the control unit may control the signal generation unit to increase an amplitude of the pulse signal when the time constant is not calculated.

In one implementation, the insulation monitoring device may further include a coupler resistor including a plurality of resistors connected in parallel to each electric line of the system, and a coupler resistor including switches for connecting some of the plurality of resistors to each electric line. The control unit may control the switches to connect the plurality of resistors in parallel to each electric line when the time constant is not calculated.

In one implementation, the insulation monitoring device may further include a signal measurement unit including a first electric path including a first detection resistor and a second detection resistor, a second electric path not including the second detection resistor, and a changeover switch forming a circuit by being connected to the first detection resistor through one of the first electric path and the second electric path and configured to detect a voltage of the applied pulse signal based on a voltage across at least one detection resistor. The control unit may control the changeover switch to form a circuit by connecting the first detection resistor to the second electric path when the time constant is not calculated.

In one implementation, the control unit may calculate a time constant according to an operation result of a natural logarithm (ln) with respect to a preset minimum slope ratio and a time interval between a starting time point of the primary tuning and a point of time that the initial sampling interval has elapsed from the starting time point.

A method for controlling an insulation monitoring device according to an implementation may include: applying a pulse signal having a voltage of a predetermined magnitude to an electric line; determining an initial sampling interval; performing primary tuning of calculating a sampling interval based on the initial sampling interval and a first time multiple, calculate an average voltage as an average voltage during a sampling period according to the calculated sampling interval, and comparing the calculated first average voltage and a second average voltage calculated before the first average voltage; detecting whether a difference between the first average voltage and the second average voltage is within a preset first error range as a result of the primary tuning; terminating the primary tuning and performing secondary tuning of calculating a sampling interval based on a preset sampling interval and a second time multiple, calculating an average voltage as a third average voltage during a sampling period according to the calculated sampling interval, and comparing the calculated third average voltage and a fourth average voltage calculated before the third average voltage; detecting whether a difference between the third average voltage and the fourth average voltage is within a steady voltage error range as a result of the secondary tuning; detecting whether a predetermined time has elapsed from a starting time point of the secondary tuning when the difference between the third average voltage and the fourth average voltage is within the steady voltage error range, to detect the third average voltage as a steady-state voltage according to the applied pulse signal when the predetermined time has elapsed; and repeatedly performing the secondary tuning when the difference between the third average voltage and the fourth average voltage exceeds the steady voltage error range as a result of the secondary tuning or when a predetermined time has not elapsed from the starting time point of the secondary tuning.

In one implementation, the performing the secondary tuning may include determining at least one reference point based on a starting time point of the primary tuning, the initial sampling interval, and a termination time point of the primary tuning, calculating a plurality of voltage slopes based on a voltage difference between voltages according to the determined at least one reference point and calculating a slope ratio according to the plurality of calculated voltage slopes, and calculating a time constant based on the calculated slope ratio, and determining the predetermined time according to the calculated time constant.

In one implementation, the determining the predetermined time may include detecting whether the calculated slope ratio is equal to or greater than a preset threshold value, calculating the time constant when the slope ratio is equal to or greater than the threshold value, and resetting the initial sampling interval based on the calculated time constant and Equation below when the time constant is calculated. The performing the secondary tuning may be configured to perform the secondary tuning process based on the reset initial sampling interval.

$$t_n = -\ln(1-0.01) \times \tau \quad \text{[Equation]}$$

where $t_n$ denotes the reset initial sampling interval and $\tau$ denotes the time constant.

In one implementation, the performing the secondary tuning may be configured to perform the secondary tuning based on the initial sampling interval when the time constant is not calculated.

In one implementation, the detecting the steady-state voltage according to the applied pulse signal may further include calculating a value of the insulation resistance based on a detected steady-state voltage when the steady-state voltage according to the applied pulse signal is detected. The calculating the value of the insulation resistance may further include increasing the slope ratio when the time constant is not calculated. The increasing the slope ratio may be configured to increase an amplitude of the pulse signal.

In one implementation, the insulation monitoring device may further include a coupler resistor including a plurality of resistors connected in parallel to each electric line of the system, and a coupler resistor including switches for connecting some of the plurality of resistors to each electric line. The increasing the slope ratio may further include controlling the switches to connect the plurality of resistors in parallel to each electric line.

In one implementation, the insulation monitoring device may further include a signal measurement unit including a first electric path including a first detection resistor and a second detection resistor, a second electric path not including the second detection resistor, and a changeover switch forming a circuit by being connected to the first detection resistor through one of the first electric path and the second electric path and configured to detect a voltage of the applied pulse signal based on a voltage across at least one detection resistor. The increasing the slope ratio may be configured to control the changeover switch to form a circuit by connecting the first detection resistor to the second electric path.

In one implementation, the calculating the time constant may further include calculating the time constant according to an operation result of a natural logarithm (ln) with respect to a preset minimum slope ratio and a time interval between a starting time point of the primary tuning and a point of time that the initial sampling interval has elapsed from the starting time point.

An insulation monitoring device according to an implementation may include a signal generation unit configured to apply a pulse signal having a voltage of a predetermined magnitude to an electric line, a signal measurement unit connected to a ground and configured to measure a voltage of the pulse signal applied from the ground when the pulse signal applied to the electric line is applied to the ground through the insulation resistance, an average voltage calculation unit configured to calculate an average voltage of voltages measured by the signal measurement unit during a sampling period according to a set sampling interval, and a control unit configured to calculate a sampling interval based on an initial sampling interval and a preset time multiple, calculate an average voltage as a first average voltage during a sampling period according to the calculated sampling interval, performing a tuning process for calculating a difference between the calculated first average voltage and a second average voltage calculated before the first average voltage, and detect the first average voltage as a steady-state voltage when the difference between the average voltages satisfies a preset steady voltage error. The control unit may switch an operation state into a power saving mode for a preset idle time when the difference between the first average voltage and the second average voltage satisfies a preset error condition, and resume a tuning process of detecting the steady-state voltage by calculating the average voltages when the idle time elapses.

In one implementation, the control unit may perform a primary tuning process according to a preset first time multiple, and switch the operation state to the power saving mode for the idle time when the difference between the first average voltage and the second average voltage is less than or equal to a preset first error. The control unit may then perform a secondary tuning process of determining a sampling interval of a sampling period for calculating an average voltage according to a second time multiple different from the first time multiple when the tuning process is resumed.

In one implementation, the control unit may terminate the primary tuning when the difference between the first average voltage and the second average voltage is equal to or less than the preset first error as a result of the primary tuning, determine at least one reference point based on a starting time point of the primary tuning, the initial sampling interval, and a termination time point of the primary tuning, to calculate a plurality of voltage slopes based on a voltage difference between voltages according to the determined at least one reference point, and calculate a time constant based on a slope ratio according to the calculated voltage slopes, to determine the idle time based on the calculated time constant.

In one implementation, the control unit may determine whether the time constant is calculated according to a result of comparing the calculated slope ratio with a preset threshold value, and further calculate a value of leakage capacitance according Equation below based on the calculated time constant when the insulation resistance is calculated according to a steady-state voltage detected after the idle time determined according to the time constant has elapsed.

$$C_e = \frac{\tau}{(R_e \| R_i)} \quad \text{[Equation]}$$

where $\tau$ denotes the time constant, Re denotes a value of the insulation resistance, Ri denotes a value of internal resistance of the insulation monitoring device, and the threshold value denotes a minimum value of a calculation range in which the leakage capacitance can be calculated.

In one implementation, the control unit may determine whether the time constant is calculated according to a result of comparing the calculated slope ratio with the preset threshold value, and perform the secondary tuning process based on the initial sampling interval and the second time multiple when the time constant is not calculated according to the comparison result.

In one implementation, the control unit may control the signal generation unit to increase an amplitude of a test pulse based on whether the time constant is calculated when the insulation resistance is calculated based on the detected steady-state voltage.

In one implementation, the insulation monitoring device may further include a coupler resistor including a plurality of resistors connected in parallel to each electric line of the system, and a coupler resistor including switches for connecting some of the plurality of resistors to each electric line. The control unit may control the switches to connect the plurality of resistors in parallel to each electric line when the time constant is not calculated.

In one implementation, the insulation monitoring device may further include a signal measurement unit including a first electric path including a first detection resistor and a second detection resistor, a second electric path not including the second detection resistor, and a changeover switch forming a circuit by being connected to the first detection resistor through one of the first electric path and the second electric path and configured to detect a voltage of the applied pulse signal based on a voltage across at least one detection resistor. The control unit may control the changeover switch to form a circuit by connecting the first detection resistor to the second electric path when the time constant is not calculated.

In one implementation, the control unit may determine whether the time constant is calculated according to a result of comparing the calculated slope ratio with the preset threshold value, and calculate the time constant according to an operation result of a natural logarithm (ln) with respect to a preset minimum slope ratio and a time interval between a starting time point of the primary tuning and a point of time that the initial sampling interval has elapsed from the starting time point.

A method for controlling an insulation monitoring device according to an implementation may include: applying a pulse signal having a voltage of a predetermined magnitude to an electric line; determining an initial sampling interval; performing primary tuning of calculating a sampling interval based on the initial sampling interval and a first time multiple, calculate an average voltage as a first average voltage during a sampling period according to the calculated sampling interval, and comparing a calculated first average voltage and a second average voltage calculated before the first average voltage; repeatedly performing the primary tuning when the difference between the first average voltage and the second average voltage exceeds a preset first error range as a result of the primary tuning; determining at least one reference point when the difference between the first average voltage and the second average voltage is within the first error range as the result of the primary tuning, and calculating a slope ratio based on voltage slopes according to a voltage difference between voltages according to the at least one reference point; calculating a time constant based on the calculated slope ratio; switching an operation state of the insulation monitoring device to an idle state for an idle time determined according to the calculated time constant; checking whether the idle time has elapsed, to switch the operation state to an active state according to a result of the check; performing a secondary tuning of calculating a sampling interval based on a reset initial sampling interval and a second time multiple when the operation state is switched to the active state, calculating an average voltage as a third average voltage during a sampling period according to the calculated sampling interval, and comparing the calculated third average voltage and a fourth average voltage calculated before the third average voltage; detecting the third average voltage as a steady-state voltage according to the applied pulse signal when the difference between the third average voltage and the fourth average voltage is within a steady voltage error range as a result of the secondary tuning; and repeatedly performing the secondary tuning when the difference between the third average voltage and the fourth average voltage exceeds the steady voltage error range as the result of the secondary tuning.

In one implementation, the switching the operation state of the insulation monitoring device to the idle state may include determining the idle time based on a preset multiple of the calculated time constant, and switching an operation mode of the insulation monitoring device to a power saving mode for the determined idle time.

In one implementation, the detecting the third average voltage as the steady-state voltage according to the applied pulse signal may further include calculating a value of insulation capacitance based on the calculated time constant.

In one implementation, the calculating the time constant may further include calculating the time constant according to an operation result of a natural logarithm (ln) with respect to a preset minimum slope ratio and a time interval between a starting time point of the primary tuning and a point of time that the initial sampling interval has elapsed from the starting tome point.

Hereinafter, effects of an insulation monitoring device and a method for controlling the same according to the present disclosure will be described.

According to at least one of the implementations, a detection time of a steady-state voltage can be further shortened by applying a time multiple having a smaller value based on a result of analyzing a voltage measured from a detection resistor.

According to at least one of the implementations, an initial time interval that is more appropriate for a detected voltage can be set based on a result of analysis of a slope of a voltage measured from a detection resistor, thereby more reducing a detection time of a steady-state voltage.

According to at least one of the implementations, a filter for removing digital noise or noise from an analog-to-digital converted detection voltage can be further provided, to more effective remove such noise, thereby more accurately calculating a value of insulation resistance.

According to at least one of the implementations, an average voltage can be calculated from each sampling period determined according to a preset time multiple, and a steady-state voltage can be determined from average voltages, which satisfy a steady voltage error condition, only when the average voltages satisfying the steady voltage error condition after a predetermined time elapses from a sampling starting time point are calculated, thereby preventing an error that the steady-state voltage is determined in a state in which a voltage is not stabilized.

In addition, a first slope and a second slope can be calculated based on the sampling starting time point, a preset sampling time interval, and a point of time at which the preset error condition is satisfied, and a length of the predetermined time for delaying the determination of the steady-state voltage can be determined based on a time constant determined according to a ratio of the calculated slopes, thereby optimizing the length of the predetermined time for delaying the determination of the steady-state voltage.

According to at least one of the implementations, an average voltage can be calculated from each sampling period determined according to a preset time multiple, and a time constant can be calculated when the calculated average voltages satisfy a preset error condition, and an operation state of the insulation monitoring device can be switched to an idle state for a predetermined time based on the calculated time constant. This can prevent unnecessary measurement processes from being performed during while a voltage is in an unstable state. This can reduce power consumption of the insulation monitoring device.

In addition, a first slope and a second slope can be calculated based on the sampling starting time point, a preset sampling time interval, and a point of time at which the preset error condition is satisfied, and a length of a time for which the insulation monitoring device is switched to an idle state can be determined based on a time constant determined according to a ratio of the calculated slopes. This can minimize a time required for detecting a steady-state voltage according to a pulse signal while minimizing power consumption of the insulation monitoring device.

DETAILED DESCRIPTION

Figure 1:
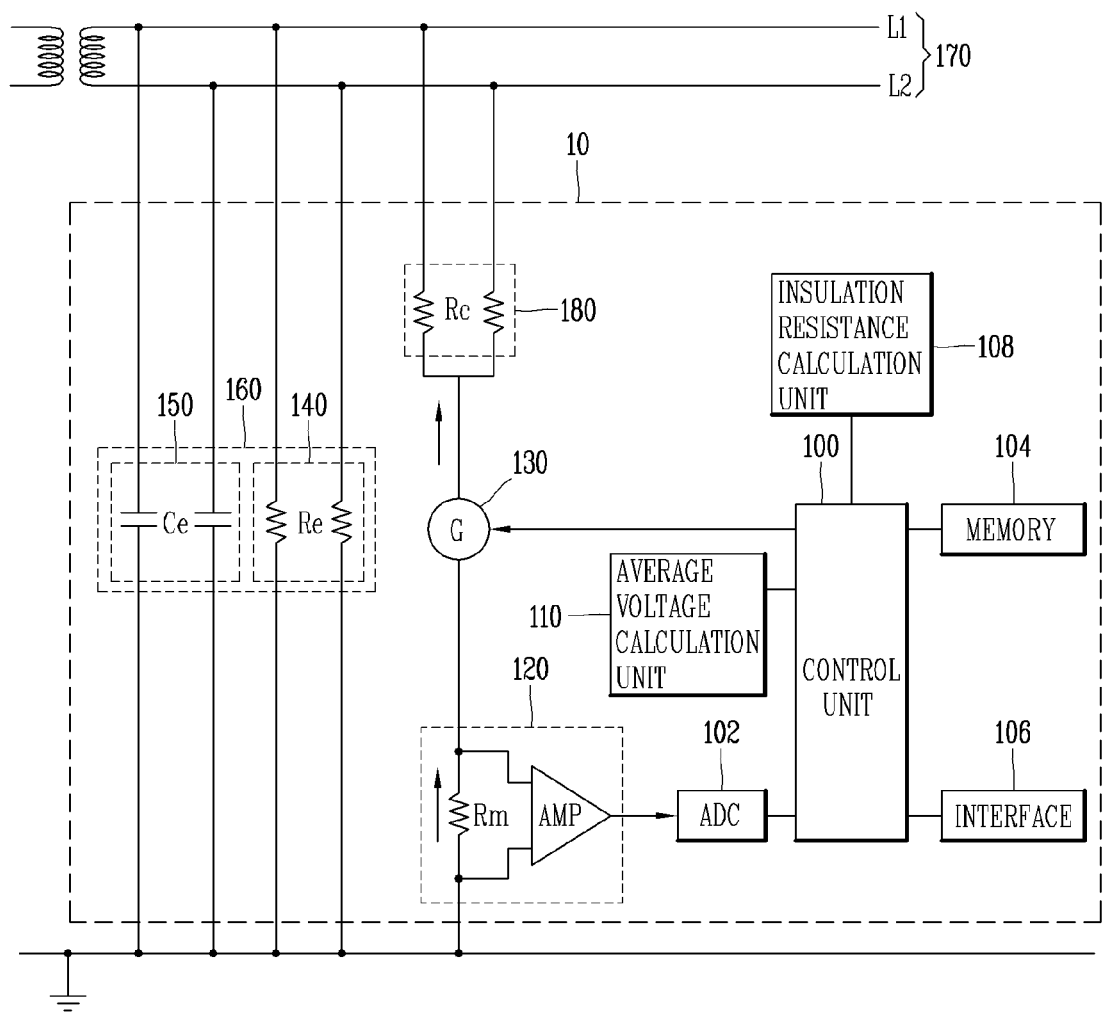
FIG. 1 is a block diagram illustrating a structure of an insulation monitoring device in accordance with an implementation of the present disclosure.

It is noted that the technical terms used herein are used only to describe specific implementations and are not intended to limit the invention. A singular representation used herein may include a plural representation unless it represents a definitely different meaning from the context. In this specification, the terms "comprising" and "including" should not be construed to necessarily include all of the elements or steps disclosed herein, and should be construed not to include some of the elements or steps thereof, or should be construed to further include additional elements or steps.

In describing the technology disclosed in this specification, if a detailed explanation for a related known function or construction is considered to unnecessarily divert the gist of the present disclosure, such explanation has been omitted but would be understood by those skilled in the art.

In describing each figure, like reference numerals will be used for like elements. It will be understood that although the terms first, second, etc. may be used herein to describe various elements but those elements should not be limited by the terms. These terms are generally only used to distinguish one element from another.

Terms such as those defined in a commonly used dictionary should be interpreted as having a meaning consistent with the meaning in the context of the related art, and should not be interpreted as an ideal or excessively formal meaning unless explicitly defined in the present application.

FIG. 1 is a block diagram illustrating a structure of an insulation monitoring device 10 in accordance with an implementation of the present disclosure.

Referring to FIG. 1, an insulation monitoring device 10 according to an implementation may include a coupler resistor (Rc) 180 connected to electric lines (hereinafter, an electric line) 170 of a system, a signal generation unit 130 for applying a pulse signal to the electric line 170 through the coupler resistor 180, insulation resistance (Re) 140 between the electric line 170 and the ground, a signal measurement unit 120 including a detection resistor Rm connected to the ground, an analog-to-digital converter (ADC) 102 connected to the signal measurement unit 120 to convert a voltage measured in the signal measurement unit 120 into a digital value, an average voltage calculation unit 110 for receiving the digital value converted in the ADC 102 to calculate an average voltage according to the pulse signal applied to the electric line 170 during a preset sampling period, a control unit 100 for controlling other components connected thereto, calculating a sampling interval for deciding the sampling period, and detecting a plurality of steady-stage voltages according to the applied pulse signal based on a plurality of average voltages calculated in the average voltage calculation unit 110, and an insulation resistance calculation unit 108 for calculating a value of the insulation resistance 140 based on the plurality of steady-stead voltages detected by the control unit 100. The insulation monitoring device 10 may further include a memory 104 for storing various data input to or output from the control unit 100, and an interface 106.

Meanwhile, although FIG. 1 illustrates an example in which the electric line 170 of the system is a single-phase electric line, the electric line 170 of the system may alternatively be configured as a multi-phase electric line. For example, the electric line 170 of the system may be three-phase electric lines (R, S, T). In this case, the coupler resistor 180 may include resistors disposed on the multi-phase electric lines, for example, respectively on R-phase electric line, S-phase electric line, and T-phase electric line for three-phase electric lines.

FIG. 1 illustrates the insulation monitoring device 10 having various components, but it may be understood that implementing all of the illustrated components is not a requirement. Greater or fewer components may alternatively be implemented.

Hereinafter, a detailed description thereof will be given. The signal generation unit 130 may generate a pulse signal having a positive (+) voltage or a negative (−) voltage under the control of the control unit 100. For example, the signal generation unit 130 may apply a signal having a positive voltage of a predetermined magnitude to the electric line 170 according to the control of the control unit 100, and apply a signal having a negative voltage of the same magnitude to the electric line 170 according to the control of the control unit 100. Accordingly, a signal in which the positive voltage and the negative voltage cross each other, that is, a pulse signal may be applied to the electric line 170 under the control of the control unit 100.

As illustrated in FIG. 1, the electric line 170 and the ground may be connected to each other to form a circuit. Here, the insulation resistance (Re) 140 may be disposed between the electric line 170 and the ground.

Here, a capacitor (Ce) 150 may be further disposed between the electric line 170 and the ground, to generate an insulating impedance 160 between the electric line 170 and the ground together with the insulation resistance 140.

Meanwhile, the pulse signal applied from the signal generation unit 130 to the electric line 170 may be input to the signal measurement unit 120 through the circuit formed between the electric line 170 and the ground. Here, the signal measurement unit 120 may include a detection resistor Rm, and detect a voltage of the pulse signal applied to the electric line 170 according to the insulation resistance 140 on the basis of a voltage across both ends of the detection resistor Rm. The voltage may be amplified through an amplifier Amp so as to be applied to the ADC 102.

Then, the ADC 102 may convert an analog voltage detected by the signal measurement unit 120 into a digital value. In addition, the voltage converted into the digital value may be input to the control unit 100.

In addition, the average voltage calculation unit 110 may receive the digitized voltage value input from the ADC 102 under the control of the control unit 100. The average voltage calculation unit 110 may then calculate an average voltage of voltages measured by the signal measurement unit 120 during a sampling period according to a sampling interval set by the control unit 100.

In addition, the control unit 100 may control other components connected thereto, and may control an overall operation of the insulation monitoring device 10 according to the implementation. The control unit 100 may also provide or process appropriate information or functions for a user by processing signals, data, information and the like, which are input or output by the aforementioned various components.

Meanwhile, when a voltage is changed from a positive voltage to a negative voltage or a pulse signal is changed from a negative voltage to a positive voltage, a surge may occur due to the sudden change of the pulse signal. Accordingly, the control unit 100 may determine whether the voltage is stabilized by determining a sampling interval and detecting changes in voltages measured by the signal measurement unit 120 according to the decided sampling interval. The control unit 100 may determine a voltage measured when the voltage is stabilized as a steady-state voltage according to the pulse signal applied to the electric line 170, that is, as a voltage from which the influence of the surge has disappeared.

Here, when it is determined that the voltage is not stabilized, the control unit 100 may increase the sampling interval gradually by multiplying a previous sampling interval by a preset time multiple greater than 1 to determine the next sampling interval. According to this adaptive sampling interval setting, the sampling interval may become longer as a time for which the voltage is not stabilized increases.

On the other hand, after the sampling interval is decided in this way, when a difference between voltages detected at the decided sampling interval is out of a stabilization level, the sampling interval is unconditionally increased according to a preset time multiple, so the difference between the voltages detected at the sampling interval is not great. In spite of this, even when the difference slightly deviates from the stabilization level, the sampling interval may be determined to be long according to the preset time multiple.

Accordingly, the control unit 100 of the insulation monitoring device 10 according to the implementation may change the time multiple for calculating the sampling interval according to the difference between the voltages detected at the sampling interval. Accordingly, as the voltage is closer to the stabilized state, that is, when the difference between the voltages detected at the sampling interval is less than a predetermined value, the next sampling interval may be determined according to a time multiple which is smaller than the preset time multiple, which may result in less increasing the sampling interval. This can decrease a corresponding sampling period (a time for which voltages are measured at the sampling interval, hereinafter, referred to as a sampling period), and shorten a time required for a stabilized voltage to be found.

However, a currently found stabilized voltage may be a stabilized voltage according to a currently applied pulse signal, that is, any one of a positive pulse signal and a negative pulse signal. Then, the control unit 100 may control the signal generation unit 130 to invert the pulse signal, and repeat the aforementioned processes to detect a stabilized voltage according to the inverted pulse signal.

When a steady-state voltage (positive steady-state voltage) according to a positive pulse signal and a steady-state voltage (negative steady-state voltage) according to a negative pulse signal are all detected, the control unit 100 may apply the detected positive steady-state voltage and negative steady-state voltage to the insulation resistance calculation unit 108.

The insulation resistance calculation unit 108 may then calculate the value of the insulation resistance 140 between the electric line 170 and the ground based on the positive steady-state voltage and the negative steady-state voltage applied from the control unit 100, under the control of the control unit 100. To this end, the insulation resistance calculation unit 108 may calculate an amplitude of a voltage according to the pulse signal based on the applied positive steady-state voltage and negative steady-state voltage, and calculate the value of the insulation resistance 140 based on the calculated amplitude of the voltage.

The memory 104 may store data to support various functions of the insulation monitoring device 10. The memory 104 may store data and instructions for the operation of the insulation monitoring device 10. The memory 104 may also temporarily or permanently store data input to the control unit 100 and data output from the control unit 100.

The interface 106 may include various components for interaction with the user. In one example, the interface 106 may include a display including a display module to display various types of data according to the operation of the insulation monitoring device 10 on the display. For example, the display may output information related to the insulation resistance calculated by the insulation resistance calculation unit 108 or information related to the positive steady-state voltage, the negative steady-state voltage, and the calculated amplitude of the voltage. Meanwhile, since the insulation monitoring device 10 continuously calculates the value of the insulation resistance, the display may output the value of the insulation resistance over time in the form of a graph, so as to display the changes in value of the insulation resistance in real time.

Also, the interface 106 may include at least one input unit for receiving an input from the user. In one example, the input unit may include at least one hardware key or touch key. Alternatively, when the display is implemented as a touch screen, the display may also be used as the input unit.

Meanwhile, the interface 106 may further include a communication unit (not illustrated) for performing wireless or wired communication with a preset user terminal. The communication unit may notify the user terminal of information related to a ground fault when the ground fault of the electric line 170 occurs. Here, the ground fault of the electric line 170 may be detected by the control unit 100 of the insulation monitoring device 10 and may be detected according to the calculated insulation resistance value.

Hereinafter, a more detailed description will be given of the operation process of calculating a value of insulation resistance between the electric line 170 and the ground in the insulation monitoring device 100 having the configuration of FIG. 1, with reference to a plurality of flowcharts.

Figure 2:
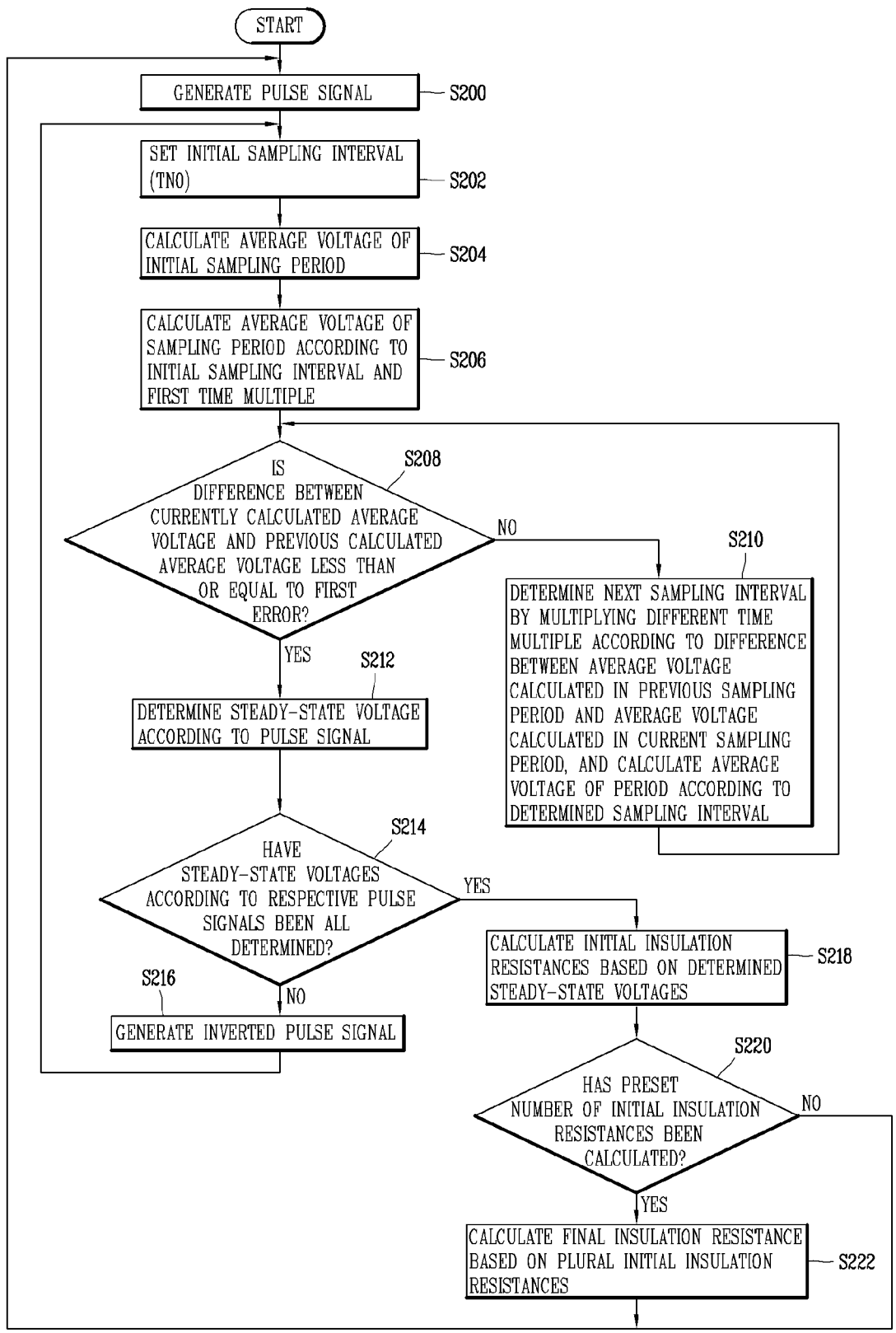
FIG. 2 is a flowchart illustrating an operation process of calculating insulation resistance in the insulation monitoring device in accordance with the implementation.
Figure 3:
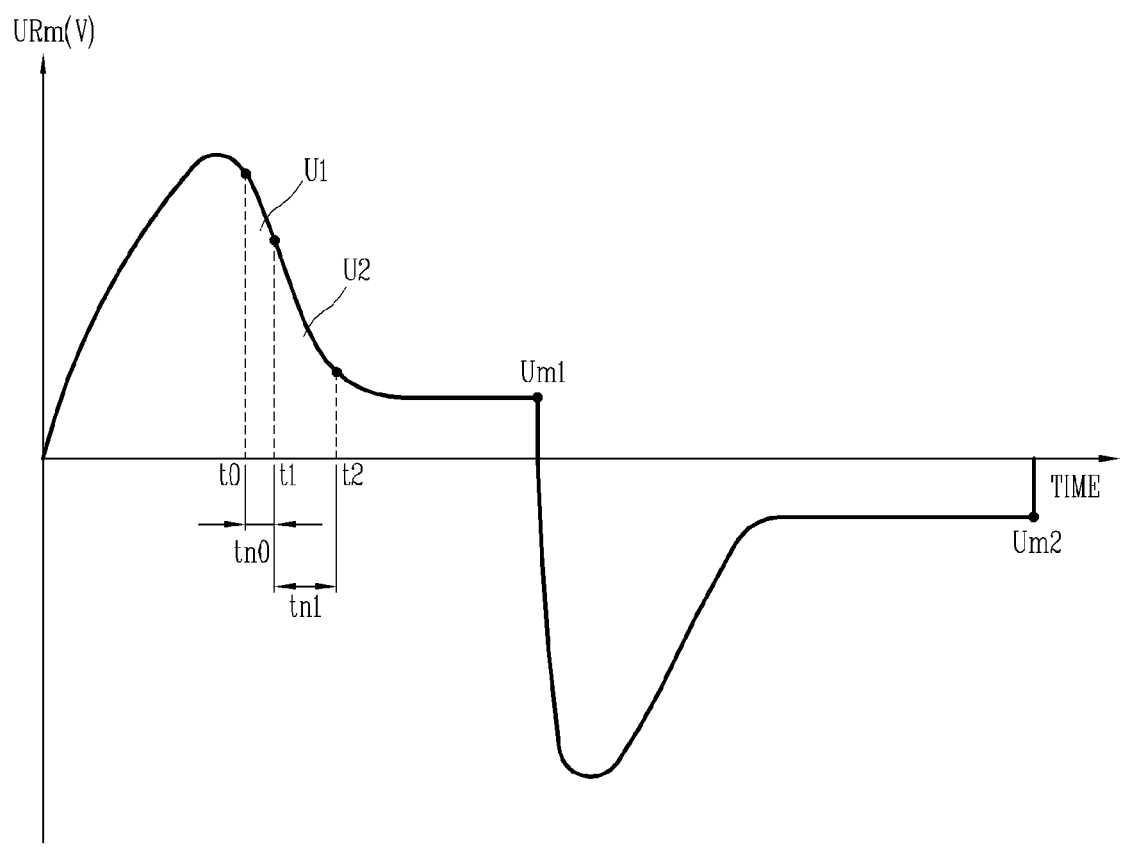
FIG. 3 is an exemplary diagram illustrating an example of setting an initial measurement sampling interval for measuring a steady-state voltage in the insulation monitoring device in accordance with the implementation.

First, FIG. 2 is a flowchart illustrating an operation process of calculating insulation resistance in the insulation monitoring device 10 in accordance with the implementation. Also, FIG. 3 is an exemplary diagram illustrating an example of setting an initial measurement sampling interval for measuring a steady-state voltage in the insulation monitoring device in accordance with the implementation.

First, referring to FIG. 2, the control unit 100 of the insulation monitoring device 10 may control the signal generation unit 130 to generate a pulse signal having a predetermined voltage (S200). Then, the signal generation unit 130 may generate a signal (pulse signal) having a positive voltage or a negative voltage of a predetermined magnitude under the control of the control unit 100, and apply the generated signal to the electric line 170 through the coupler resistor Rc.

When the pulse signal is generated in step S200, the control unit 100 may determine an initial sampling interval tn0 (S202). For example, the control unit 100 may determine an initial value tk according to Equation 1 below, and determine the initial sampling interval tn0 according to one of a period of a noise frequency and the initial value tk which is greater than the other.

$$t_k = -\ln(1-0.01) \times R_i \times C_{emax} \qquad \text{[Equation 1]}$$

where Ri denotes internal resistance of the insulation monitoring device 10, and Cemax denotes the maximum capacitance of the capacitor 150 disposed between the electric line 170 and the ground.

Here, the internal resistance Ri of the insulation monitoring device 10 may be determined according to a predetermined value or an actual internal resistance measurement result of the insulation monitoring device 10. In addition, the Cemax may be a value determined according to the capacitor 150 disposed between the electric line 170 and the ground, and may be predetermined by the user. Meanwhile, the noise frequency may also be a value estimated in advance by the user.

Meanwhile, when the initial sampling interval tn0 is determined in step S202, the control unit 100 may determine a starting point t0 for measuring a voltage URm detected through the detection resistor Rm of the signal measurement unit 120. The control unit 100 may determine a point of time that a predetermined time has elapsed from an inversion of a previous pulse signal as the starting point to.

On the other hand, when the starting point t0 is determined, the control unit 100 may determine a sampling period from the starting point t0 to a point of time t1 that the initial sampling interval tn0 has elapsed as a sampling period, namely, an initial sampling period according to the initial sampling interval. The control unit 100 may control the average voltage calculation unit 110 to calculate an average voltage U1, U2 by averaging voltages detected during the initial sampling period (S204).

Meanwhile, when the average voltage U1 of the initial sampling period is calculated, the control unit 100 may determine the next sampling period tni+1 based on the initial sampling interval tn0, tni and a preset first time multiple. Here, the control unit 100 may determine the next sampling interval tn1, tni+1 by multiplying the initial sampling interval tn0 by the first time multiple. The control unit 100 may then control the average voltage calculation unit 110 to calculate an average voltage U2, Ui+1 by averaging voltages detected during the sampling period from the point of time t1 to a point of time t2 that the next sampling interval tn1 has elapsed from the point of time t1 (S206).

Meanwhile, in step S206, the control unit 100 may calculate a difference between the currently calculated average voltage Ui+1 and the previously calculated average voltages U1, Ui. The control unit 100 may then determine whether the calculated difference is equal to or less than a preset value, that is, a first error (S208). Here, the first error may be a relative error for determining whether the current voltage is a voltage in a stabilized state according to a result of comparing the average voltage values.

In one example, the first error may be a voltage corresponding to 1% of the currently calculated average voltage Ui+1. In this case, the control unit 100 may determine that the voltage detected in the signal measurement unit 120 is in the stabilized state when the difference between the currently calculated average voltage Ui+1 and the previously calculated average voltage U1, Ui is equal to or less than 1% of the currently calculated average voltage Ui+1, while determining that the voltage detected in the signal measurement unit 120 is not in the stabilized state when the difference exceeds 1% of the currently calculated average voltage Ui+1.

On the other hand, when it is determined in step S208 that the voltage is not stabilized as the difference between the currently calculated average voltage Ui+1 and the previously calculated average voltage Ui exceeds the first error, the control unit 100 may determine the next sampling interval based on a time multiple having a different value according to the difference between the currently calculated average voltage Ui+1 and the previously calculated average voltage Ui.

In one example, when the difference between the currently calculated average voltage Ui+1 and the previously calculated average voltage Ui exceeds a preset second error, the control unit 100 may determine the next sampling interval by multiplying the currently determined sampling interval by the first time multiple.

On the other hand, as illustrated in FIG. 3, the reason why the voltage is not stabilized is due to a surge phenomenon caused by a sudden voltage change. Therefore, after the voltage suddenly increases or decreases immediately after the pulse signal is inverted, the voltage may less change and enter a stabilized state as time elapses. Accordingly, when the change in voltage is less than or equal to a preset level, it may be determined that the voltage is close to the stabilized state.

Accordingly, it may be determined whether the voltage approaches the stabilized state according to the difference between the currently calculated average voltage Ui+1 and the previously calculated average voltage Ui. Therefore, when the difference between the currently calculated average voltage Ui+1 and the previously calculated average voltage Ui is less than or equal to the preset second error, the control unit 100 may determine that the voltage approaches the stabilized state, and determine the next sampling interval by multiplying the currently determined sampling interval by a second time multiple having a smaller value than the first time multiple.

When the next sampling interval is determined by multiplying the second time multiple as described above, the sampling interval may less increase because the second time multiple has the smaller value than the first time multiple. Therefore, when the difference between the currently calculated average voltage Ui+1 and the previously calculated average voltage Ui is less than or equal to the preset second error, the sampling interval may be more shortened than the sampling interval determined according to the first time multiple.

On the other hand, when the next sampling interval is determined by multiplying a different time multiple according to the difference between the currently calculated average voltage Ui+1 and the previously calculated average voltage Ui, the control unit 100 may calculate an average voltage during a sampling period according to the determined next sampling interval (i=i+1). In this case, the newly calculated average voltage may be a currently calculated average voltage Ui+2, (Ui+1, i=i+1) (S210). Here, when a voltage according to a negative pulse signal is measured, a calculated average voltage may also have a negative value, and thus a difference between the average voltages may be a difference between absolute values of the average voltages.

Then, the control unit 100 may go back to step S208 to calculate a difference between the currently calculated average voltage Ui+2 and the previously calculated average voltage Ui+1, (Ui, i=i+1)), and perform the step S210 again depending on whether the calculated difference is equal to or less than the first error.

Hereinafter, a detailed description will be given of the operation process of differently calculating the sampling interval by applying the different time multiple according to the calculated difference between the average voltages in step S210, with reference to FIGS. 4A and 4B.

Meanwhile, when it is determined in S208 that the difference between the currently calculated average voltage Ui+1 and the previously calculated average voltage Ui is less than or equal to the first error, the control unit 100 may determine that the voltage detected in the signal measurement unit 120 is in the stabilized state.

The control unit 100 may then determine the currently calculated average voltage Ui+1 as a voltage in a stabilized state according to a currently generated pulse signal (S212). That is, when the currently generated pulse signal is a positive pulse signal, the control unit 100 may determine the currently calculated average voltage Ui+1 as a positive steady-state voltage. On the other hand, when the currently generated pulse signal is a negative pulse signal, the control unit 100 may determine the currently calculated average voltage Ui+1 as a negative steady-state voltage (S212).

When the steady-state voltage according to the currently generated pulse signal is determined in step S212, the control unit 100 may detect whether the steady-state voltages according to the respective positive and negative pulse signals have all been determined (S214).

As a result of the detection in step S214, when the steady-state voltage according to any one of the positive pulse signal or the negative pulse signal is not detected, the control unit 100 may control the signal generation unit 130 to invert the pulse signal (S216). Then, the signal generation unit 130 may apply a pulse signal having an inverted voltage of the same magnitude to the electric line 170. Accordingly, the voltage detected in the signal measurement unit 120 may become unstable again due to a surge caused by the voltage inversion.

Then, the control unit 100 may repeat the process from step S202 to step S212 again according to the inverted pulse signal. In addition, if both the steady-state voltages according to the positive and negative pulse signals have been determined as a result of the detection in step S214, the control unit 100 may control the insulation resistance calculation unit 108 to calculate initial insulation resistance based on the determined steady-state voltages (S218).

In step S218, the control unit 100 may calculate an average value of the currently determined steady-state voltages according to Equation 2 below. The control unit 100 may also calculate initial insulation resistance based on the average steady-state voltages, which are calculated by Equation 2, according to Equation 3.

[Equation 2]

where Um denotes an average steady-state voltage, Um1

$$U_m = \frac{U_{m1} - U_{m2}}{2}$$

denotes a steady-state voltage according to a positive pulse signal, and Um2 denotes a steady-state voltage according to a negative pulse signal.

$$R_{e1} = \frac{U_p \times R_m}{U_m} - R_i \qquad \text{[Equation 3]}$$

where Re1 denotes first initial insulation resistance, Up denotes an amplitude of a pulse signal, Rm denotes resistance of a detection resistor, and Ri denotes internal resistance of the insulation monitoring device.

When the initial insulation resistance (the value of the initial insulation resistance) is calculated in step S218, the control unit 100 may check whether the initial insulation resistance has been calculated as many as a preset number (S220). And when it is checked in step S220 that the preset number of initial insulation resistances is not calculated, the control unit 100 may go back to step S200 and repeat the process from step S200 to step S218.

On the other hand, when it is checked in step S220 that the preset number of initial insulation resistances is calculated, the control unit 100 may calculate the final insulation resistance based on the preset number of initial insulation resistances, that is, a plurality of initial insulation resistances (S222). Here, the step S222 may be a step of calculating an average value of the plurality of initial insulation resistances.

Meanwhile, in step S222, when the value of the final insulation resistance is calculated, the control unit 100 may display the calculated value of the final insulation resistance through the interface 106. The control unit 100 may then go back to step S200 to repeat the process from step S200 to S222, so as to monitor an insulation state between the electric line 170 and the ground according to the calculated value of the insulation resistance.

Figure 4A:
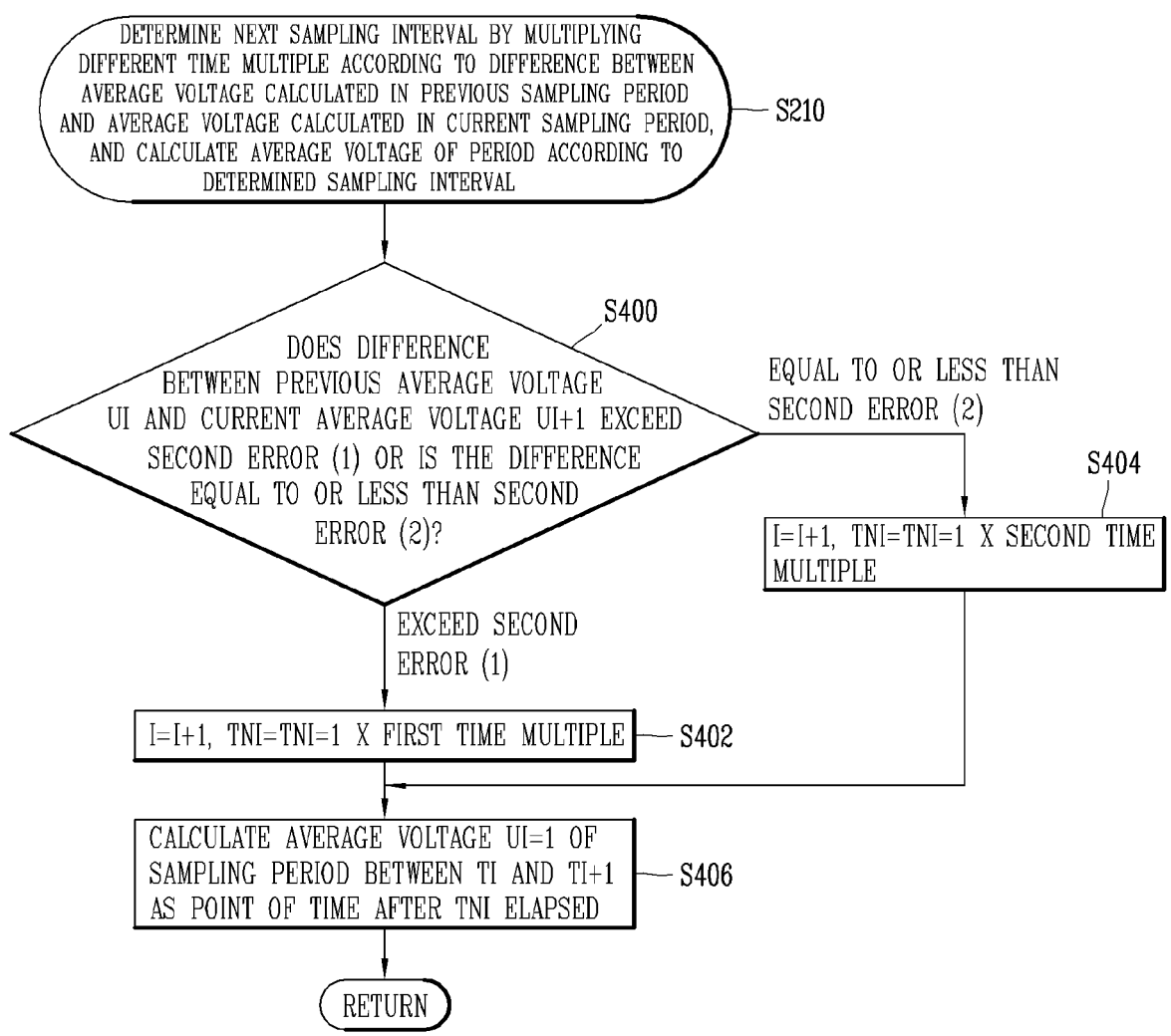
FIG. 4A is a flowchart illustrating in more detail a process of determining a sampling interval of a next sampling period according to a difference between average voltages in the insulation monitoring device in accordance with the implementation.

FIG. 4A is a flowchart illustrating in more detail the process of determining the sampling interval of the next sampling period according to the difference between the average voltages in the insulation monitoring device 10 in accordance with the implementation. FIG. 4B illustrates an example of determining the sampling interval based on a second time multiple, and FIG. 4C illustrates an example of determining the sampling interval based on a first time multiple.

First, referring to FIG. 4A, the control unit 100 of the insulation monitoring device 10 according to the implementation may detect whether the calculated difference between the average voltages exceeds the second error or is less than the second error when it is determined in step S208 that the current calculated average voltage Ui+1 and the previously calculated average voltage Ui exceeds the first error (S400).

Here, the second error may be a criterion for determining whether a point of time at which the current average voltage has been calculated is close to a point of time at which the voltage is stabilized. That is, as illustrated in FIG. 3, after the voltage rapidly increases or decreases immediately after the pulse signal is inverted, the voltage change may decrease over time and enters a stable state. Therefore, if the voltage change is less than a preset level, it can be determined that the voltage approaches the stabilized state.

Accordingly, the control unit 100 may determine whether a point of time at which the current average voltage has been calculated is close to a point of time at which the voltage is stabilized on the basis of whether the difference between the currently calculated average voltage Ui+1 and the previously calculated average voltage Ui is equal to or less than the second error. That is, when the difference between the currently calculated average voltage Ui+1 and the previously calculated average voltage Ui is equal to or less than the second error, the control unit 100 may determine that the point of time at which the current average voltage has been calculated sufficiently approaches the point of time at which the voltage is stabilized.

Accordingly, when the difference between the currently calculated average voltage Ui+1 and the previously calculated average voltage Ui is less than the second error, the control unit 100 may determine the next sampling interval tni (i=i+1) by multiplying a sampling interval tni−1 of a sampling period, in which the calculation of the current average voltage is completed, by the second time multiple which is smaller than the preset first time multiple (S404).

The first time multiple and the second time multiple may have a value greater than 1, and may be determined according to results of a plurality of experiments performed in relation to the present disclosure. The first time multiple may preferably be set to 1.66, and in this case, the second time multiple may be set to 1.33 which is smaller than the first time multiple. In the following description, it will be assumed that the first time multiple has the value of 1.66 and the second time multiple has the value of 1.33 for convenience of explanation.

However, it is a matter of course that the present disclosure is not limited thereto. Accordingly, the first time multiple may have any other value as long as it has a value greater than 1, and the second time multiple may also have a value smaller than the first time multiple as long as it has a value greater than 1.

Figure 4B:
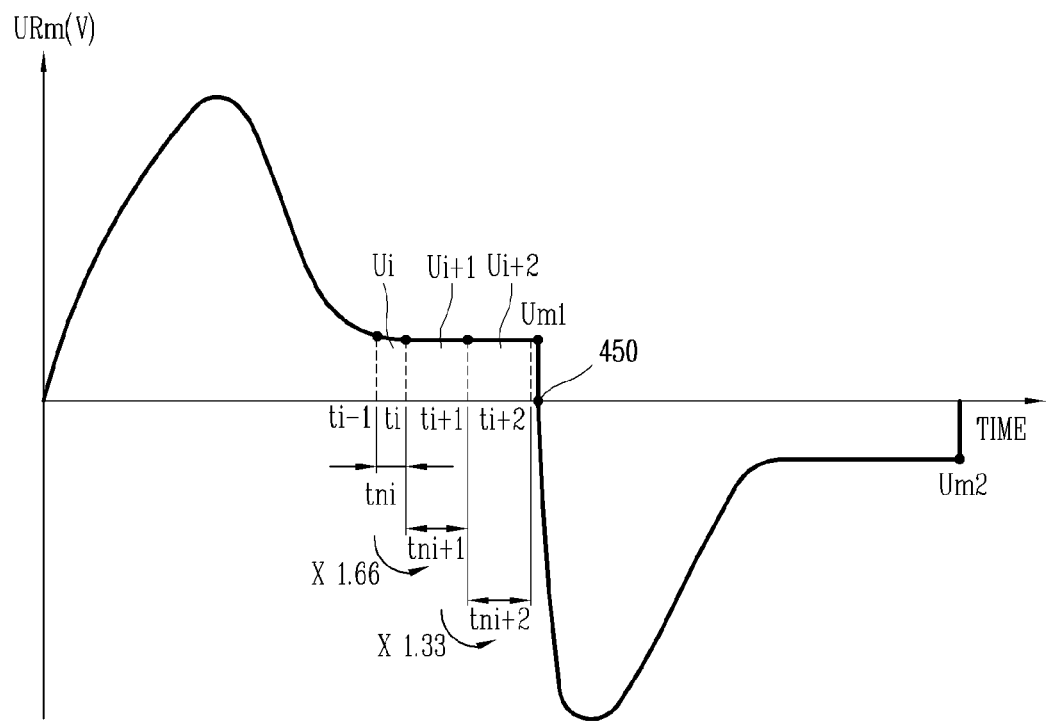
FIGS. 4B and 4C are exemplary diagrams illustrating examples of determining sampling intervals based on different time multiples according to a difference between average voltages in the process of FIG. 4A.
Figure 4C:
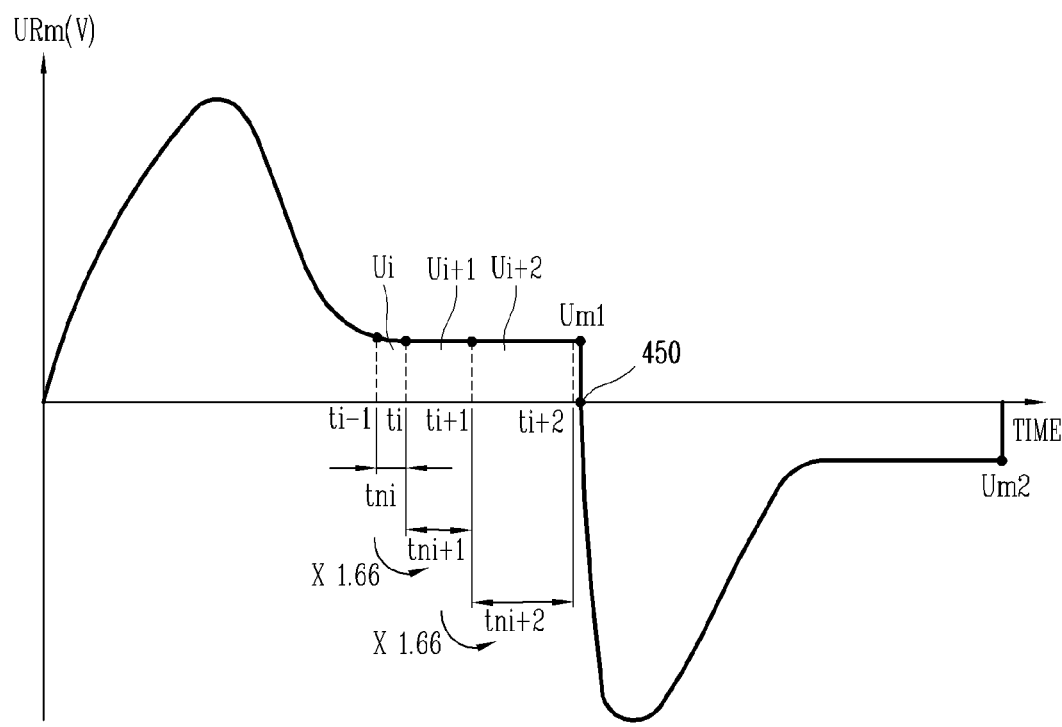

Meanwhile, FIG. 4B illustrates the case where the difference between the currently calculated average voltage Ui+1 and the previously calculated average voltage Ui is equal to or less than the second error when the first time multiple is 1.66 and the second time multiple is 1.33.

Referring to FIG. 4B, when the difference between the currently calculated average voltage Ui+1 and the previously calculated average voltage Ui is less than or equal to the second error, the control unit 100 may go to step S404 of FIG. 4A to determine the next sampling interval tni+2 by multiplying the current sampling interval tni+1 by the second time multiple, that is, 1.33. Accordingly, as illustrated in FIG. 4B, after the sampling period according to the next sampling interval tni+2 has elapsed and the average voltages are compared, the steady-state voltage Um1 according to the positive pulse signal may be determined. Since the control unit 100 can invert the pulse signal in step S216 of FIG. 2, the pulse signal inversion may be carried out at an inversion time point 450.

Meanwhile, FIG. 4C illustrates the case in which the sampling interval is determined according to the fixed first time multiple, unlike FIG. 4B.

In this case when the difference between the currently calculated average voltage Ui+1 and the previously calculated average voltage Ui is less than or equal to the second error, the control unit 100 may determine the next sampling interval tni+2 by multiplying the current sampling interval tni+1 by the first time multiple, that is, 1.66. Accordingly, as illustrated in FIG. 4C, after the sampling period according to the next sampling interval tni+2 has elapsed and the average voltages are compared, the steady-state voltage Um1 according to the positive pulse signal may be determined. In this case, as illustrated in FIG. 4C, since the first time multiple is greater than the second time multiple, the next sampling interval tni+2 may be determined to be longer, and accordingly, the inversion time point 450 at which the pulse signal inversion occurs may be more delayed.

On the other hand, as a result of the detection in step S400 of FIG. 4A, when the difference between the currently calculated average voltage Ui+1 and the previously calculated average voltage Ui exceeds the second error, the control unit 100 may determine that the point of time at which the current average voltage has been calculated does not approach the point of time at which the voltage is stabilized. The control unit 100 may then determine the next sampling interval tni (i=i+1) by multiplying the preset first time multiple and a sampling interval tni−1 of a sampling period in which the calculation of the current average voltage has been completed (S402).

On the other hand, when the next sampling interval tni (i=i+1) is determined in step S402 or S404, the control unit 100 may control the average voltage calculation unit 110 to calculate an average voltage of a sampling period between the point of time ti according to the determined sampling interval and a point of time ti+1 that the sampling interval determined in step S402 or S404 has elapsed (S406). The control unit 100 may go back to step S206 of FIG. 2 to calculate the difference between the currently calculated average voltage Ui+1 and the previously calculated average voltage Ui.

On the other hand, in step S208 of FIG. 2, the control unit 100 may redetermine whether the voltage approaches the stabilized state according to the difference between the currently calculated average voltage Ui+1 and the previously calculated average voltage Ui. Therefore, when the difference between the currently calculated average voltage Ui+1 and the previously calculated average voltage Ui is less than or equal to the preset second error, the control unit 100 may determine that the voltage is close to the stabilized state, and determine the next sampling interval by multiplying the currently determined sampling interval by the second time multiple having the smaller value than the first time multiple.

Meanwhile, the second error may have a greater ratio value than the first error so that it can have a greater value than the first error. For example, when the first error is determined to be 1% of the currently calculated average voltage Ui+1, the second error may be determined to be 5% greater than 1%. The second error may be a value determined according to results of a plurality of experiments performed in relation to the present disclosure, and may have a value greater or smaller than 5%.

Meanwhile, the control unit 100 of the insulation monitoring device 10 may alternatively determine the initial sampling interval tn0 according to a slope of a voltage measured by the signal measurement unit 120. Since the slope of the measured voltage may vary depending on a register capacitance (RC) time constant, the RC time constant may be predicted by reflecting the slope. That is, since the initial sampling interval tn0 can be determined differently based on the predicted RC time constant, a more suitable initial sampling interval can be determined.

Figure 5:
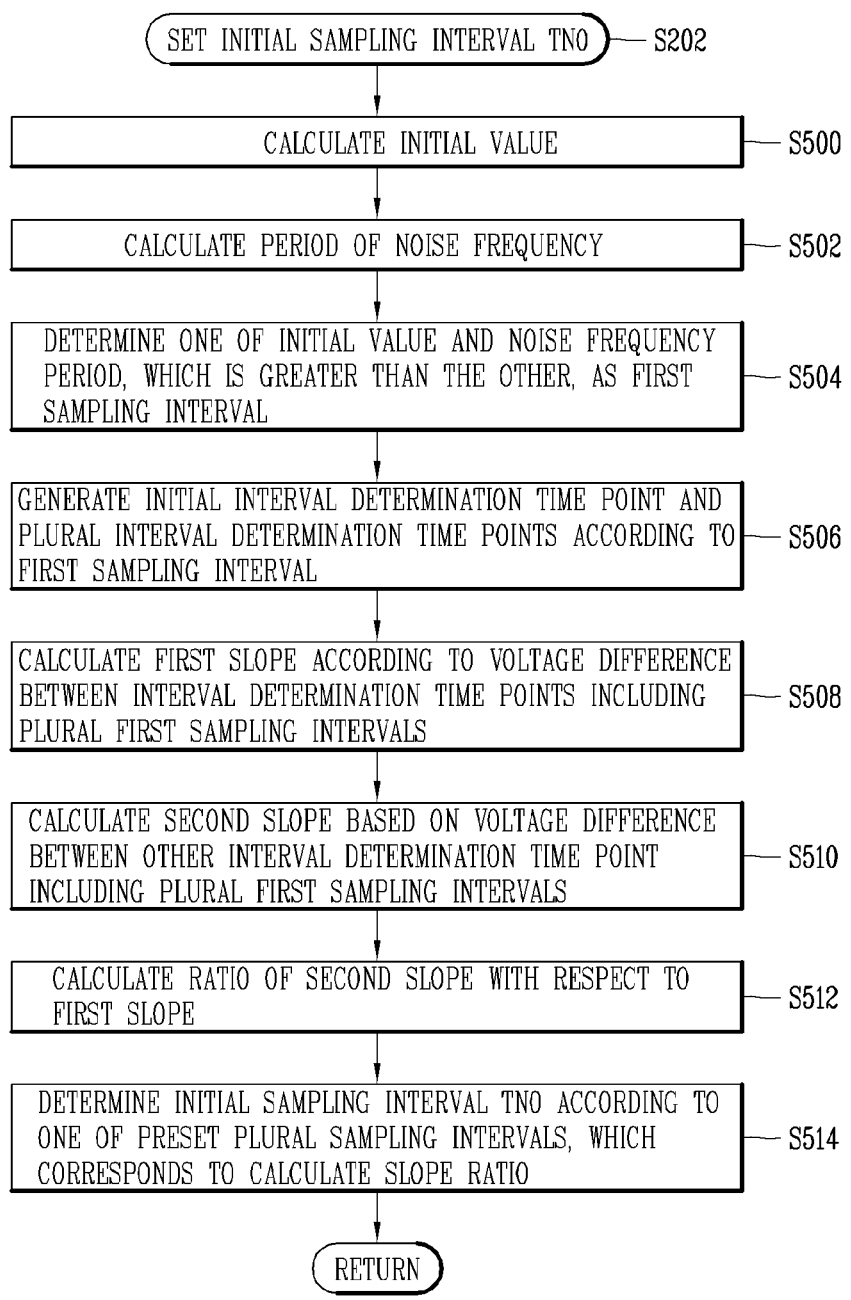
FIG. 5 is a flowchart illustrating in more detail a process of determining an initial sampling interval in the insulation monitoring device in accordance with the implementation.
Figure 6:
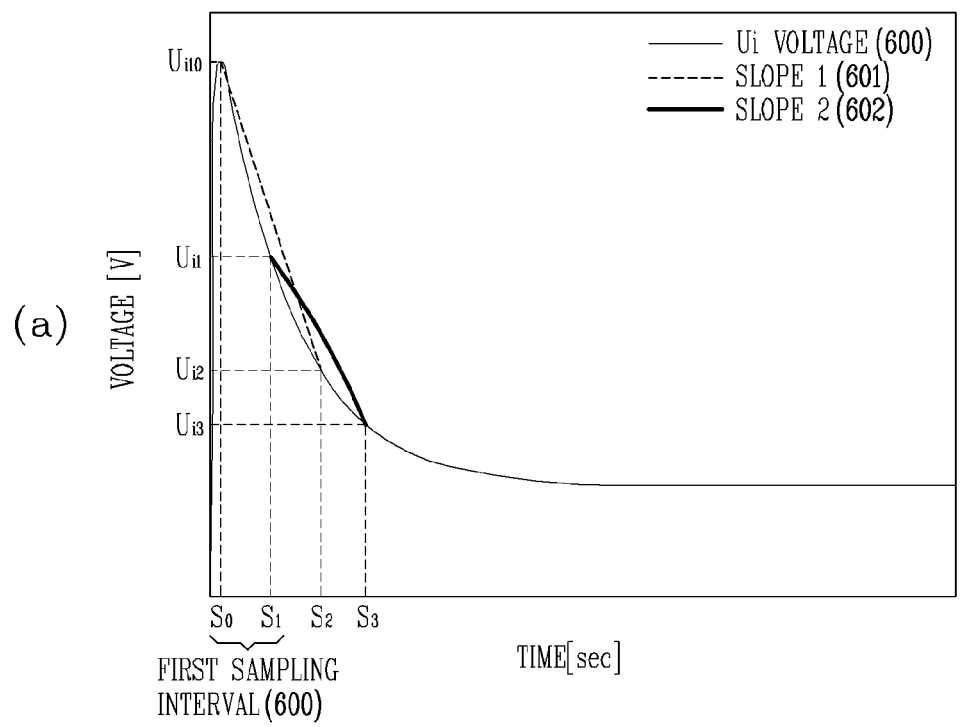
FIG. 6 is an exemplary diagram illustrating an example of determining an initial sampling interval based on a voltage slope ratio calculated according to the process of FIG. 5.
Figure 6:
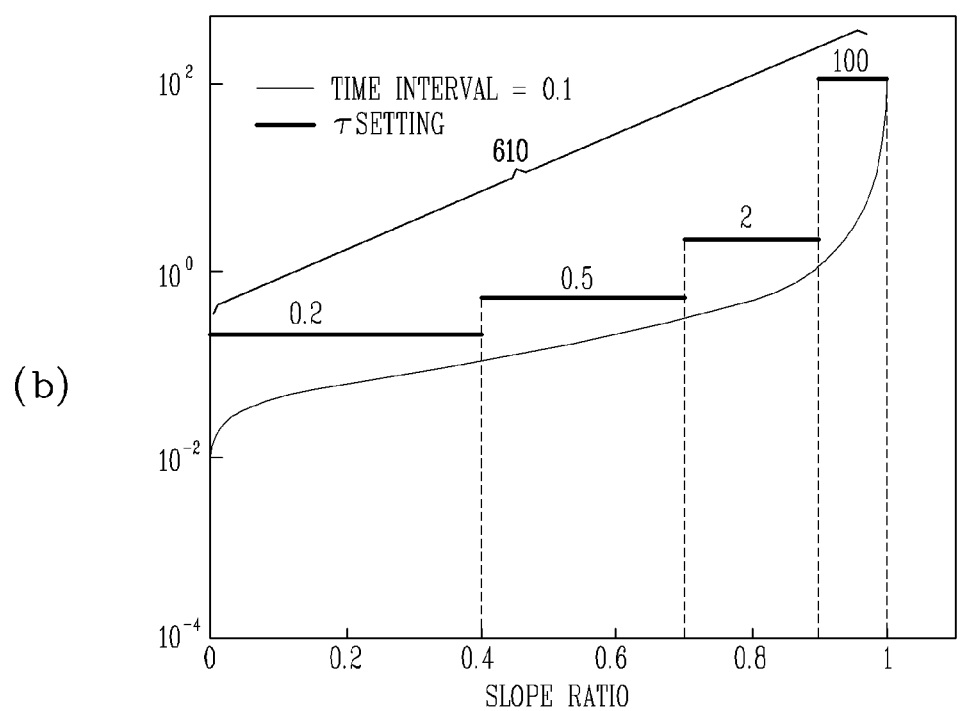

FIG. 5 is a flowchart illustrating in more detail the process of determining the initial sampling interval in the insulation monitoring device 10 in accordance with the implementation. FIG. 6 is an exemplary diagram illustrating an example of determining the initial sampling interval based on a voltage slope ratio calculated according to the process of FIG. 5.

First, referring to FIG. 5, the control unit 100 of the insulation monitoring device 10 may determine an initial value tk according to Equation 1 (S500). The control unit 100 may then calculate a period of a noise frequency (S502). Here, the noise frequency may be a value estimated in advance by the user. When the period of the noise frequency is calculated, the control unit 100 may determine one of the initial value tk and the period of the noise frequency, which is greater than the other, as a first sampling interval (S504).

Meanwhile, when the first sampling interval is determined in step S504, the control unit 100 may determine an initial interval determination time point S0 for calculating the voltage slope. Here, the initial interval determination time point may be a point of time that a preset time has elapsed from a pulse signal inversion time point. In addition, the preset time may be a time that has been checked as the most suitable time according to a plurality of experiments related to the present disclosure.

On the other hand, when the initial interval determination time point S0 is determined, the control unit 100 may set a plurality of interval setting time points S0 to S3, which include the initial interval determination time point S0, according to the first sampling interval 600, from the initial interval determination time S0 (S506).

In addition, the control unit 100 may calculate a first slope according to a voltage difference between the interval setting time points including a preset number of first sampling intervals, that is, the plurality of first sampling intervals 600 (S508). Referring to (a) of FIG. 6, when the preset number is two, the control unit 100 may first detect a second interval setting time point S2, which includes two sampling intervals 600 from the initial interval determination time point S0. The control unit 100 may also calculate the first slope 601 based on a difference between a voltage detected at the initial interval setting time point S0 and a voltage detected at the second interval setting time point S2.

In addition, the control unit 100 may calculate a second slope according to a voltage difference between other interval setting time points including a preset number of first sampling intervals, that is, the plurality of first sampling intervals 600 (S510). Referring to FIG. 6, when the preset number is two, the control unit 100 may detect a third interval setting time point S3, which includes two sampling intervals 600 from another initial interval determination time point, namely, the first interval setting time point S1. The control unit 100 may also calculate the second slope 602 based on a difference between a voltage detected at the first interval setting time point S1 and a voltage detected at the third interval setting time point S3.

Meanwhile, when the first slope 601 and the second slope 602 are calculated through steps S508 and S510, the control unit 100 may calculate a ratio (slope ratio) between the calculated slopes (S512). For example, the control unit 100 may calculate a ratio of the second slope to the first slope, and calculate the slope ratio.

When the slope ratio is calculated in step S512, the control unit 100 may detect any one sampling interval corresponding to the slope ratio calculated in step S512 from among the plurality of preset sampling intervals. The control unit 100 may determine the initial sampling interval tn0 according to the detected sampling interval (S514).

Here, the plurality of preset sampling intervals may be predetermined to correspond to a plurality of different RC time constants 610, respectively. As illustrated in (b) of FIG. 6, slope ratios corresponding to different RC time constants (r in FIG. 6) may be predetermined. To this end, the memory 104 may include information related to the plurality of RC time constants T corresponding to the different slope ratios, respectively, and information related to the plurality of sampling intervals corresponding to the information on the different RC time constants T.

Accordingly, the control unit 100 may detect an RC time constant τ corresponding to the slope ratio calculated in step S512, and determine the initial sampling interval tn0 by detecting any one sampling interval corresponding to the detected RC time constant τ from among the plurality of preset sampling intervals.

Meanwhile, in the description of FIG. 2, the calculation of the final insulation resistance based on the plurality of insulation resistances in step S222 when the plurality of initial insulation resistances are calculated has been described. However, when a difference between the plurality of insulation resistances is equal to or greater than a preset threshold value, the control unit 100 may not calculate the final insulation resistance according to the currently calculated initial insulation resistances.

Figure 7:
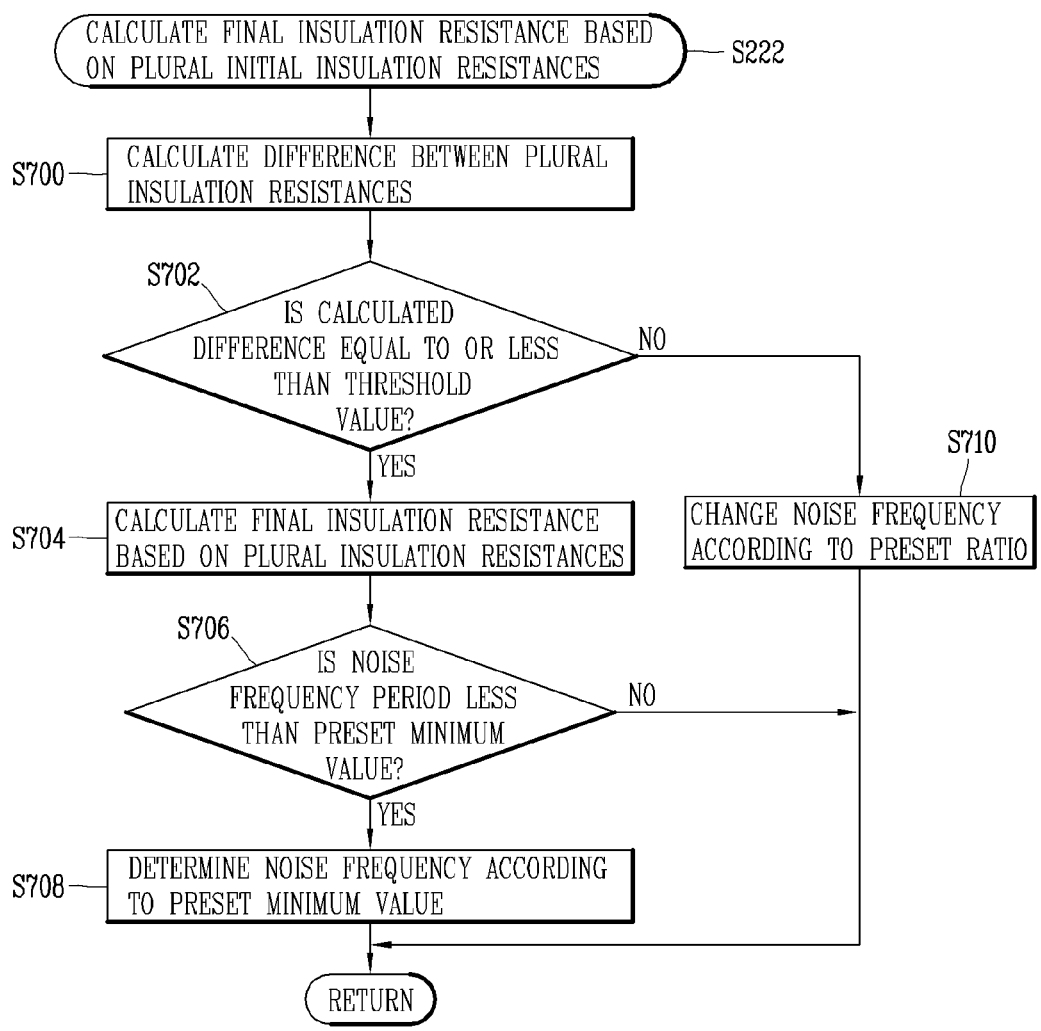
FIG. 7 is a flowchart illustrating an operation process of calculating final insulation resistance based on a preset number of initial insulation resistances calculated according to the process of FIG. 2 in the insulation monitoring device.

FIG. 7 is a flowchart illustrating an operation process of calculating final insulation resistance based on a preset number of initial insulation resistances calculated according to the process of FIG. 2 in the insulation monitoring device.

Referring to FIG. 7, the insulation monitoring device 10 according to the implementation may first calculate a difference between a preset number of initial insulation resistance values, that is, a plurality of initial insulation resistance values (S700). For example, when the preset number is two, the control unit 100 may calculate a difference between a first initial insulation resistance Re1 and a second initial insulation resistance Re2 successively calculated after the first initial insulation resistance Re1 is calculated.

On the other hand, when the difference between the plurality of initial insulation resistance values exceeds the preset threshold value, the control unit 100 may change the noise frequency according to a preset ratio (S710).

For example, the control unit 100 may reduce the noise frequency by 50%, and may recalculate the initial insulation resistance based on the reduced noise frequency. In this case, as the noise frequency is reduced to ½, the period of the noise frequency may be doubled, so that the initial sampling interval tn0 can be changed according to the length of a noise frequency period.

For example, as the length of the noise frequency period is doubled, the initial sampling interval tn0 may be greater than the initial value tk calculated in Equation 1. In this case, the initial sampling interval tn0 may be determined as the length of the noise frequency period.

Alternatively, referring to FIGS. 5 and 6, when the length of the noise frequency period is increased to be greater than the initial value tk, the first sampling interval 600 may be changed to the increased noise frequency period. Accordingly, the interval setting time points determined according to the first sampling interval 600 can be changed, and thus slopes for calculating the slope ratio can also be changed. In this case, since the RC time constant can be changed when the slope ratio is changed, the initial sampling interval tn0 determined to correspond to the RC time constant can also be changed.

Meanwhile, when the noise frequency is changed, the control unit 100 may perform the process of FIG. 2 again. When the preset number of initial insulation resistances is calculated again, the control unit 100 may recalculate the difference between the initial insulation resistances in step S700 of FIG. 7, and may redetermine whether the difference exceeds the threshold value.

The previous description has been given under the assumption that the reduction ratio of the noise frequency is 50%, but this is merely illustrative for convenience of description, and the present disclosure may not be limited thereto. That is, of course, the noise frequency may be reduced according to another reduction ratio other than 50%.

Meanwhile, when the difference between the plurality of initial insulation resistance values is less than or equal to the preset threshold value, the control unit 100 may calculate the final insulation resistance based on a preset number of initial insulation resistances which is currently calculated (S706). For example, the control unit 100 may calculate the final insulation resistance by calculating an average of the preset number of initial insulation resistances.

When the final insulation resistance is calculated, the control unit 100 may check whether a currently set noise frequency period is less than a preset minimum value (S706). For example, as illustrated in step S710, when the difference between the preset number of initial insulation resistances exceeds the preset threshold value, the control unit 100 may reduce the noise frequency and re-detect the preset number of initial insulation resistances based on the reduced noise frequency. Therefore, the noise frequency can be continuously reduced according to the difference between the detected initial insulation resistances. And initial insulation resistances according to the reduced noise frequency may be detected.

In the case where the final insulation resistance is calculated, when the currently set noise frequency period is less than the preset minimum value as a result of the check in step S706, the control unit 100 may determine the noise frequency according to the preset minimum value (S708). Accordingly, in the insulation monitoring device 10, when the final insulation resistance is calculated, the noise frequency can be determined to be a frequency higher than or equal to the preset minimum value. The control unit 100 may then perform the process of FIG. 2 again to continuously monitor the insulation state between the electric line 170 and the ground.

Figure 8:
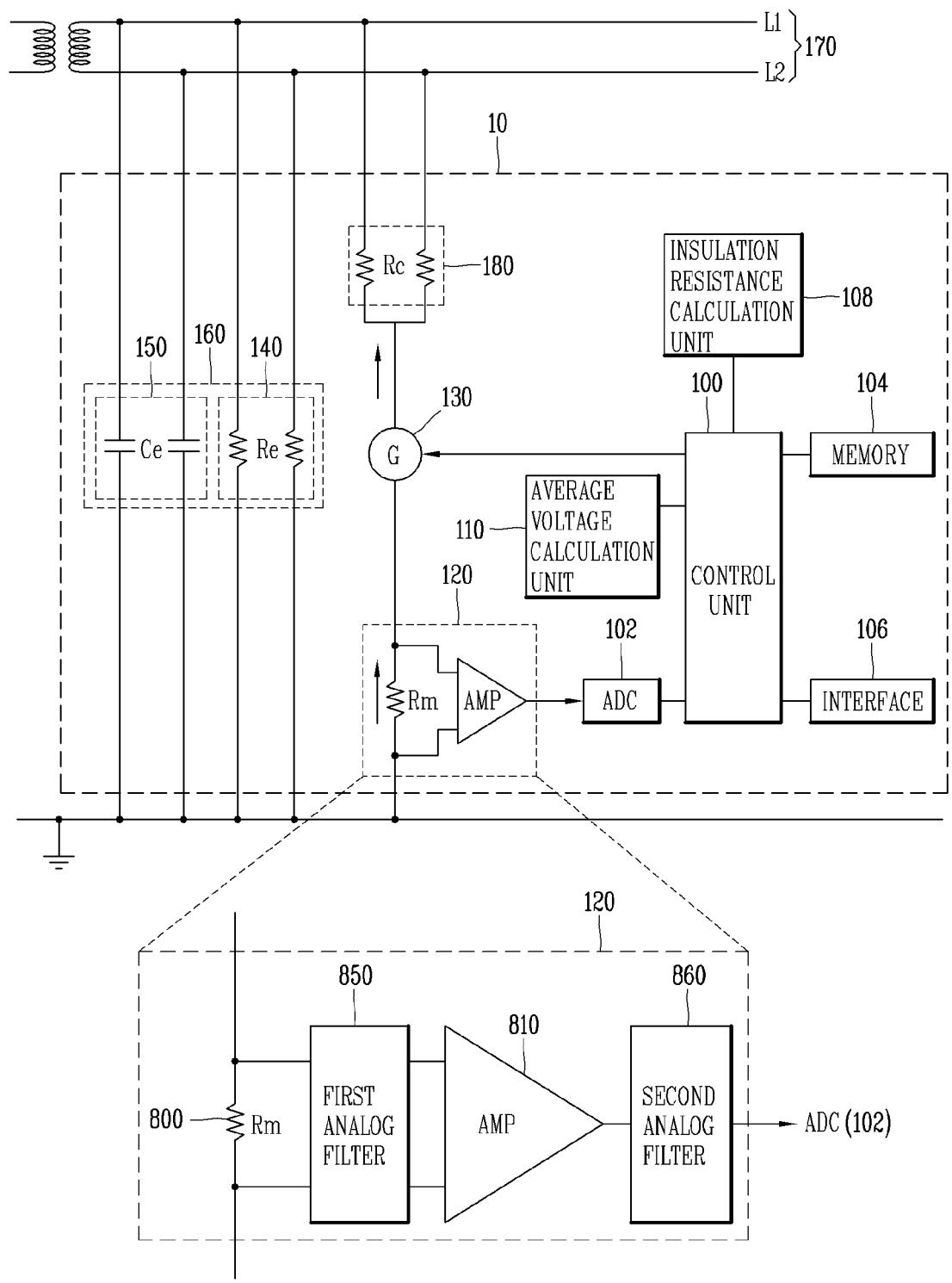
FIG. 8 is a block diagram illustrating a configuration of an insulation monitoring device including a signal measurement unit further provided with an analog filter in accordance with an implementation.
Figure 9:
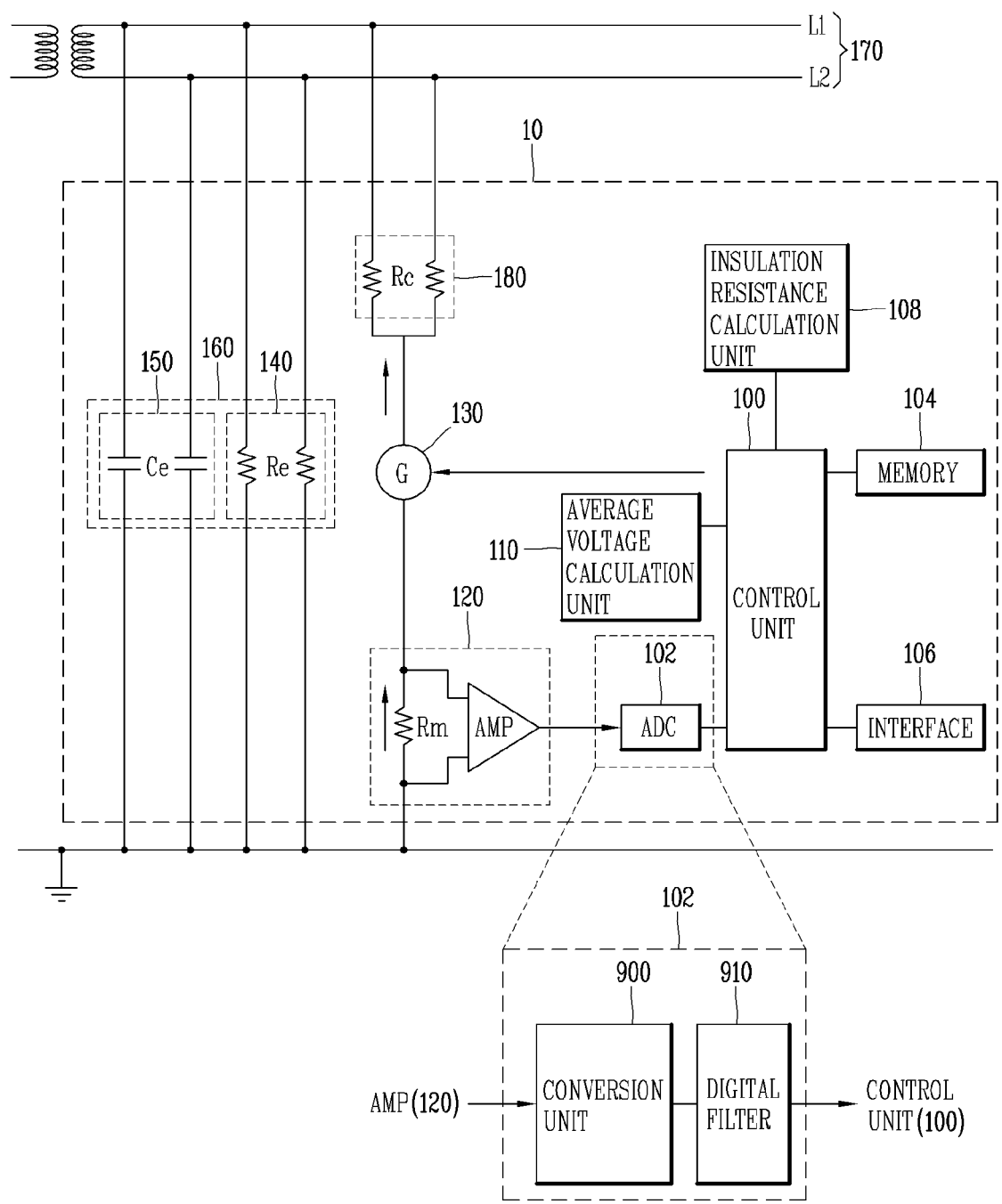
FIG. 9 is a block diagram illustrating a configuration of an insulation monitoring device including an ADC further provided with a digital filter in accordance with an implementation.

On the other hand, the insulation monitoring device 10 according to the implementation may further include at least one of a filter for removing noise from a voltage detected in the signal measurement unit 120, and a filter for removing noise from a measurement voltage converted into a digital value in the insulation monitoring device 10. FIGS. 8 to 9 are block diagrams illustrating the structure of the insulation monitoring device according to the implementation further including the at least one filter.

Referring first to FIG. 8, the signal measurement unit 120 may include a first analog filter 850 that is a filter for removing noise from a voltage detected across both ends of the detection resistor Rm. The first analog filter 850 may be located between the both ends of the detection resistor Rm and an AMP 810. The signal measurement unit 120 may further include a second analog filter 860 located between the AMP 810 and the ADC 102.

In this case, the first analog filter 850 may remove noise from a voltage detected by the detection resistor Rm, and the second analog filter 860 may remove noise from the measurement voltage of the signal measurement unit 120, amplified through the AMP 810. Accordingly, when fine noise without being removed by the first analog filter 850 is amplified through the AMP 810, such noise can be removed by the second analog filter 860, thereby inputting a more accurate measurement voltage into the ADC 102.

Meanwhile, the first analog filter 850 and the second analog filter 860 may be hardware filters, and may have different characteristics in passband, cutoff band, roll-off, phase delay, and the like.

Meanwhile, FIG. 9 is a block diagram illustrating a configuration of an insulation monitoring device including an ADC 102 further provided with a digital filter in accordance with an implementation.

Referring to FIG. 9, the ADC 102 may be a filter for removing noise existing inside the insulation monitoring device 10, and may include a conversion unit 900 that converts an analog measurement value amplified by the AMP 810 into a digital value, and a digital filter 910 located between the conversion unit 900 and the control unit 100.

The digital filter 910 may be located between the conversion unit 900 and the control unit 100 to remove noise from the voltage measurement values input to the control unit 100. Accordingly, noise inside the insulation monitoring device 10 can be removed. The digital filter 910 may be a software filter, and have properties, such as cutoff frequency, order, and the like which vary depending on characteristics of noise components existing inside the insulation monitoring device 10.

Hereinafter, a more detailed description will be given of the operation process of calculating a value of insulation resistance between the electric line 170 and the ground in an insulation monitoring device 10 according to a second implementation, with reference to a plurality of flowcharts.

Figure 10A:
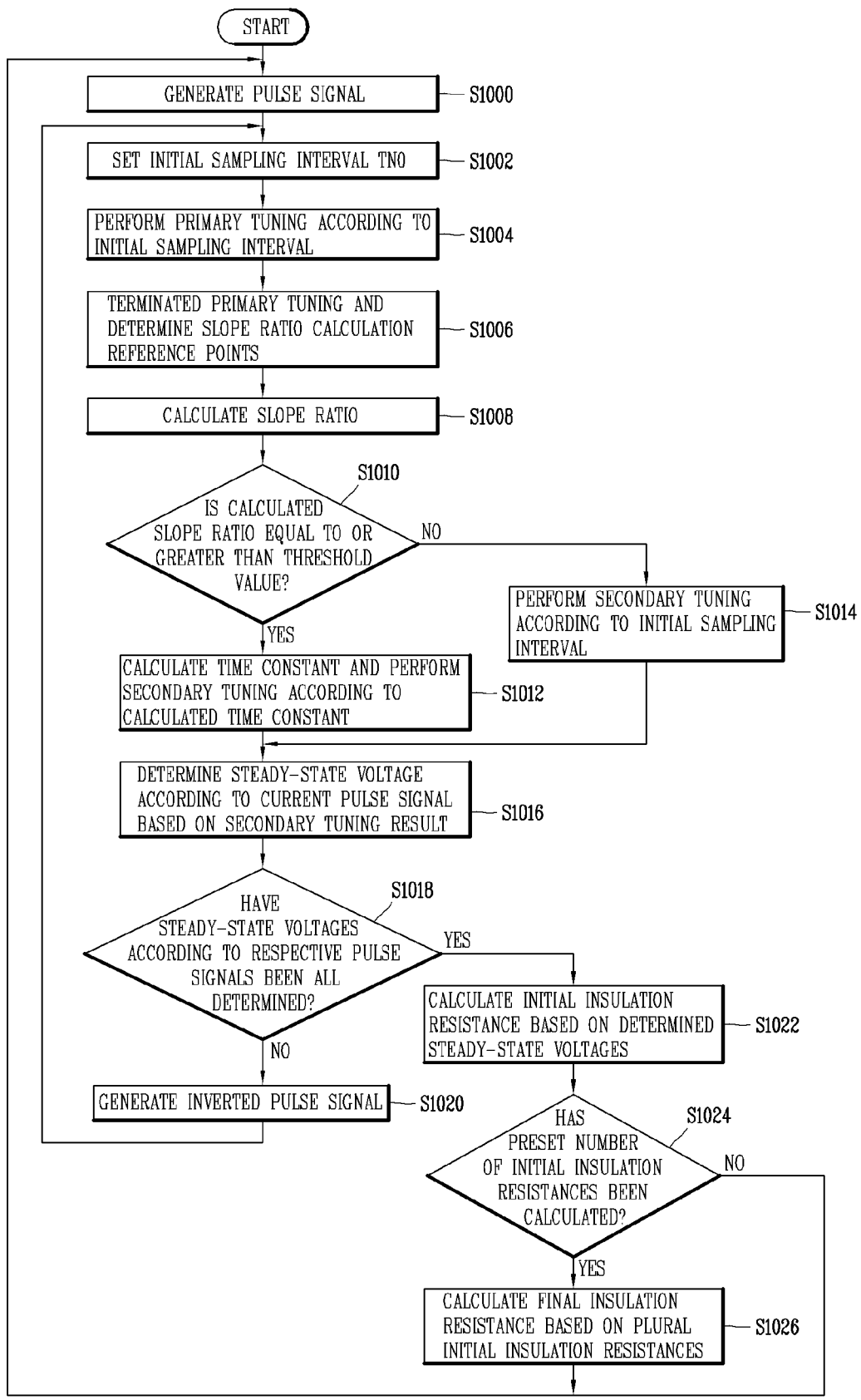
FIG. 10A is a flowchart illustrating an operation process of calculating insulation resistance in an insulation monitoring device in accordance with a second implementation.
Figure 10B:
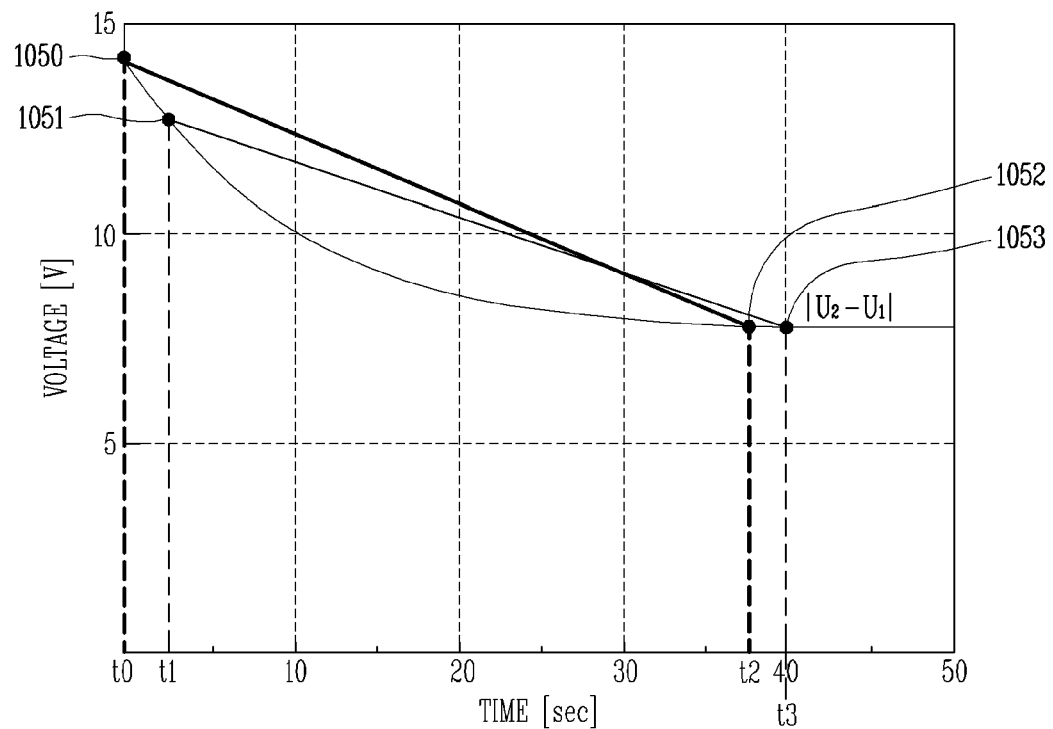
FIG. 10B is an exemplary diagram illustrating an example of calculating a slope ratio in the process of FIG. 10A.

First, FIG. 10A is a flowchart illustrating an operation process of calculating insulation resistance in an insulation monitoring device 10 in accordance with a second implementation. Also, FIG. 10B is an exemplary diagram illustrating an example of calculating a slope ratio during the process of FIG. 10A.

First, referring to FIG. 10A, the control unit 100 of the insulation monitoring device 10 according to the second implementation may control the signal generation unit 130 to generate a pulse signal having a predetermined voltage (S1000). Then, the signal generation unit 130 may generate a signal (pulse signal) having a positive voltage or a negative voltage of a predetermined magnitude under the control of the control unit 100, and apply the generated signal to the electric line 170 through the coupler resistor Rc.

When the pulse signal is generated in step S1000, the control unit 100 may determine an initial sampling interval tn0 (S1002). For example, the control unit 100 may determine an initial value tk according to Equation 1, and determine the initial sampling interval tn0 according to the initial value tk.

Here, the control unit 100 may also determine the initial sampling interval tn0 according to one of the noise frequency period and the initial value tk which is greater than the other.

Meanwhile, when the initial sampling interval tn0 is determined in step S1002, the control unit 100 may determine a starting point t0, namely, the initial sampling starting point for measuring a voltage URm detected through the detection resistor Rm of the signal measurement unit 120. In this case, the control unit 100 may determine a point of time that a predetermined time has elapsed from an inversion of a previous pulse signal as the starting point t0.

Meanwhile, when the starting point t0 is determined, the control unit 100 may perform a primary tuning process from the starting point t0 based on the initial sampling interval tn0 (S1004).

In step S1004, the control unit 100 may determine a period from the starting point t0 to a point of time that the initial sampling interval tn0 has elapsed as a sampling period. In addition, the control unit 100 may calculate an average voltage with respect to voltages measured during the determined sampling period. The control unit 100 may then determine the length of the next sampling period based on the length of the current sampling period and a preset first time multiple, and determine the next sampling period according to the determined length. In addition, the control unit 100 may recalculate an average voltage with respect to voltages measured during the determined sampling period. The control unit 100 may compare the currently calculated average voltage with the average voltage calculated in the previous sampling period, and calculate a difference between the average voltages.

Depending on whether the calculated difference is less than or equal to a preset first error, the control unit 100 may recalculate the average voltage by redetermining the next sampling period and re-compare the calculated average voltage with the previously calculated average voltage, or terminate the primary tuning process. Meanwhile, the first time multiple used in the first tuning process may have a value of '1'.

When the primary tuning process is terminated, the control unit 100 may determine reference points for calculating a slope ratio based on the voltage measured at a point of time that the primary tuning is terminated and the initial sampling interval (S1006). The control unit 100 may calculate the slope ratio based on the determined reference points (S1008).

FIG. 10B illustrates an example in which reference points are determined to calculate the slope ratio and voltages for calculating the slope ratio are determined.

Referring to FIG. 10B, when the primary tuning is terminated, the control unit 100 may determine the starting point t0 at which sampling is started, a point of time t1 (i.e., t1=t0+tn0) that the initial sampling interval tn0 has elapsed from the starting point t0, a point of time t3 at which the primary tuning is terminated as the difference between the average voltages is less than or equal to the first error, and a point of time t2 before the initial sampling interval from the point of time t3 at which the primary tuning is terminated, to be respective reference points (i.e., the starting point t0, a first reference point t1, a second reference point t2, and a third reference point t3) for calculating the slope ratio.

When the reference points are determined in this way, the control unit 100 may detect voltages according to the determined reference points.

First, the control unit 100 may calculate a voltage difference between a voltage (starting voltage) 1050 measured at the starting point t0 and a voltage (second voltage) 1052 measured at the second reference point t2. The control unit 100 may calculate a first slope by dividing the calculated voltage difference by a time between the starting point t0 and the second reference point t2.

In addition, the control unit 100 may calculate a voltage difference between a voltage (first voltage) 1051 measured at the first reference point t1 and a voltage (third voltage) 1053 measured at the third reference point t3. The control unit 100 may calculate a second slope by dividing the calculated voltage difference by a time between the first reference point t1 and the third reference point t3. The control unit 100 may calculate the slope ratio by calculating a ratio of the second slope to the first slope. Equation 4 below expresses the process of calculating the slope ratio as an equation.

$$\text{First slope} = \frac{\text{Second voltage} - \text{Starting voltage}}{\text{Second reference point} - \text{Starting point}} \quad [\text{Equation 4}]$$

$$\text{Second slope} = \frac{\text{Third voltage} - \text{First voltage}}{\text{Third reference point} - \text{First reference point}}$$

$$\text{Slope ratio} = \frac{\text{Second slope}}{\text{First slope}}$$

where the starting point denotes a point of time at which the initial sampling is started, the first reference point denotes a point of time that the initial sampling interval has elapsed from the starting point, the third reference point denotes a point of time at which the primary tuning is terminated, and the second reference point denotes a point of time before the initial sampling interval from the third reference point.

The starting voltage may denote a voltage of the starting point, the first voltage denotes a voltage of the first reference point, the second voltage denotes a voltage of the second reference point, and the third voltage denotes a voltage of the third reference point.

When the slope ratio is calculated in step S1008, the control unit 100 may calculate a time constant T according to the calculated slope ratio. Here, the time constant may indicate an expected time until the voltage reaches a steady state. For example, the time constant r, as expressed by Equation 5 below, may be calculated according to a ratio between an operation result of a natural logarithm (ln) for the calculated slope ratio and a time interval between the first reference point and the starting point.

$$\tau = \left| \frac{\text{First reference point} - \text{Starting point}}{\ln\left(\frac{\text{Second slope}}{\text{First slope}}\right)} \right| \quad [\text{Equation 5}]$$

Meanwhile, when the time constant r is calculated according to Equation 5, the control unit 100 may reset the initial sampling interval according to the calculated time constant. In addition, the control unit 100 may perform secondary tuning based on the reset initial sampling interval and a second time multiple different from the first time multiple.

The secondary tuning may be a tuning process using a time multiple different from that of the primary tuning process. Here, the second time multiple may have a greater value than the first time multiple. For example, the second time multiple may have a value of 1.33. In this case, as the second tuning time continues, the sampling period set according to the second time multiple may gradually extend.

When the secondary tuning is performed, the control unit 100 may set a point of time at which the primary tuning is finished as a starting time point of the secondary tuning. The control unit 100 may also determine a period from the starting time point of the secondary tuning to a point of time that the reset initial sampling interval has elapsed from the starting time point of the secondary tuning, to be the sampling period for the secondary tuning. In addition, the control unit 100 may calculate an average voltage with respect to voltages measured during the determined sampling period. The control unit 100 may then determine the length of the next sampling period according to a time calculated based on the length of the current sampling period and the second time multiple, and determine the next sampling period according to the determined length. In addition, the control unit 100 may recalculate an average voltage with respect to voltages measured during the determined sampling period. The control unit 100 may compare the currently calculated average voltage with the average voltage calculated in the previous sampling period, and calculate a difference between the average voltages.

Depending on whether the calculated difference is less than or equal to a preset steady voltage error, the control unit 100 may recalculate an average voltage by redetermining the next sampling period and re-compare the calculated average voltage with the previously calculated average voltage, or determine the currently calculated average voltage as a steady-state voltage according to the pulse signal generated in step S1000.

When the steady-state voltage is determined, the control unit 100 may determine whether a predetermined time determined according to the time constant has elapsed from the starting time point at which the secondary tuning is started. In addition, if the predetermined time has not elapsed, the control unit 100 may ignore the current determination result of the steady-state voltage, redetermine the next sampling section, recalculate the average voltage, and re-compare the calculated average voltage with the previously calculated average voltage. On the other hand, when the predetermined time has elapsed, the control unit 100 may determine the currently calculated average voltage as the steady-state voltage according to the pulse signal generated in step S1000.

That is, when the pulse signal generated in step S1000 is a positive pulse signal, the control unit 100 may determine the currently calculated average voltage as a positive steady-state voltage. On the other hand, when the pulse signal generated in step S1000 is a negative pulse signal, the control unit 100 may determine the currently calculated average voltage as a negative steady-state voltage.

However, when calculating the time constant T as in Equation 3, the ratio of the second slope to the first slope may converge to 1 as the difference between the first slope and the second slope is smaller. Then, since ln is 1 and the denominator becomes 0 in Equation 5, it may be difficult to calculate the time constant τ. Accordingly, the control unit 100 may further perform the process of determining whether the slope ratio calculated in step S1008 is equal to or greater than a preset threshold value (S1010). In addition, the time constant τ may be calculated only when the slope ratio is greater than the preset threshold value.

In this case, the control unit 100 may perform a secondary tuning process of resetting a sampling interval for the secondary tuning based on the calculated time constant, determining a sampling period according to the reset sampling interval, and calculating an average voltage (S1012). When the difference between the calculated average voltage and the average voltage calculated in the previous sampling period is equal to or less than a steady voltage error, the control unit 100 may determine the currently calculated average voltage as the steady-state voltage according to the pulse signal generated in step S1000 based on whether a predetermined time determined according to the time constant has elapsed (S1016). A description will be given later in more detail of the process of calculating the time constant according to the calculated slope ratio and performing the secondary tuning based on the calculated time constant when the calculated slope ratio is equal to or greater than a threshold value, with reference to FIG. 13A.

On the other hand, when the calculated slope ratio is less than the threshold value as a result of the determination in step S1010, the control unit 100 may perform the secondary tuning process without calculating the time constant (S1014). In this case, the secondary tuning process may be performed based on the initial sampling interval set in step S1002 and the second time multiple. The control unit 100 may proceed to step S1016 according to whether the difference between the calculated average voltage and the average voltage calculated in the previous sampling period is equal to or less than the steady voltage error, to determine the currently calculated average voltage as the steady-state voltage according to the pulse signal generated in step S1000. A process of performing the secondary tuning according to the preset initial sampling interval when the calculated slope ratio is less than the threshold value will be described in detail later with reference to FIG. 14.

When the steady-state voltage according to the currently generated pulse signal is determined in step S1016, the control unit 100 may detect whether the steady-state voltages according to the positive and negative pulse signals have all been determined (S1018).

As a result of the detection in step S1018, when the steady-state voltage according to any one of the positive pulse signal or the negative pulse signal is not detected, the control unit 100 may control the signal generation unit 130 to invert the pulse signal (S1020). Then, the signal generation unit 130 may apply a pulse signal having an inverted voltage of the same magnitude to the electric line 170. Accordingly, the voltage detected in the signal measurement unit 120 may become unstable again due to a surge caused by the voltage inversion.

Then, the control unit 100 may repeat the process from step S1002 to step S1016 again according to the inverted pulse signal. In addition, if both the steady-state voltages according to the positive and negative pulse signals have been determined as a result of the detection in step S1018, the control unit 100 may control the insulation resistance calculation unit 108 to calculate initial insulation resistance based on the determined steady-state voltages (S1022).

In step S1022, the control unit 100 may calculate an average value of the currently determined steady-state voltages according to Equation 2. The control unit 100 may also calculate the initial insulation resistance based on the average steady-state voltages, which are calculated by Equation 2, according to Equation 3.

On the other hand, when the initial insulation resistance (the value of the initial insulation resistance) is calculated in step S1022, the control unit 100 may check whether the initial insulation resistance has been calculated as many as a preset number (S1024). And when it is checked in step S1024 that the preset number of initial insulation resistances is not calculated, the control unit 100 may go back to step S1000 and repeat the process from step S1000 to step S1022.

On the other hand, when it is checked in step S1024 that the preset number of initial insulation resistances is calculated, the control unit 100 may calculate final insulation resistance based on a preset number of initial insulation resistances, that is, a plurality of initial insulation resistances (S1026). Here, the step S1026 may be a step of calculating an average value of the plurality of initial insulation resistances.

Meanwhile, in step S1026, when the value of the final insulation resistance is calculated, the control unit 100 may display the calculated value of the final insulation resistance through the interface 106. The control unit 100 may go back to step S1000 and repeat the process from step S1000 to step S1026 to calculate the insulation resistance value. The insulation state between the electric line 170 and the ground can be monitored according to the calculated insulation resistance value.

Figure 11:
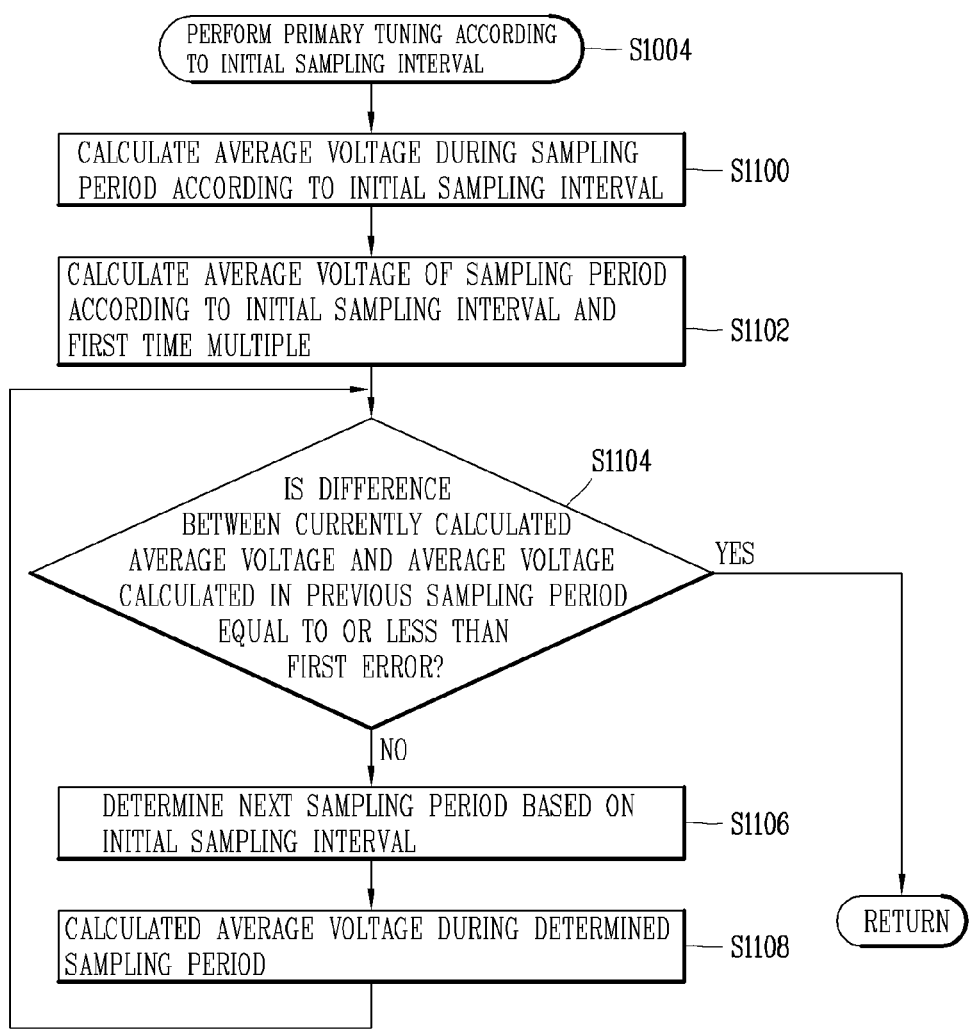
FIG. 11 is a flowchart illustrating a primary tuning process for detecting average voltages satisfying a preset error condition from sampling periods determined according to an initial sampling interval in the insulation monitoring device according to the second implementation.
Figure 12:
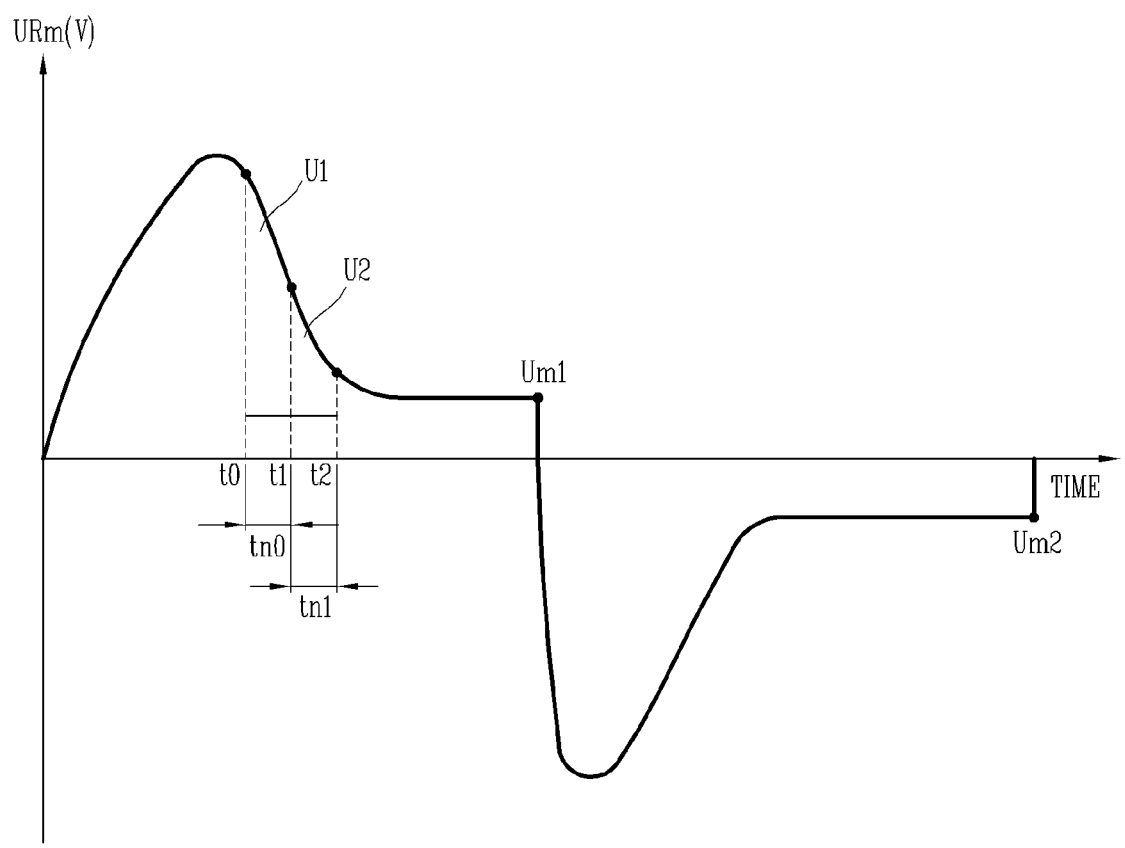
FIG. 12 is an exemplary diagram illustrating the sampling periods set according to the initial sampling interval for measuring a steady-state voltage in the insulation monitoring device in accordance with the second implementation.

FIG. 11 is a flowchart illustrating a primary tuning process for detecting average voltages satisfying a preset error condition from sampling periods determined according to an initial sampling interval in the insulation monitoring device 10 according to the second implementation. FIG. 12 is an exemplary diagram illustrating the sampling periods set according to the initial sampling interval for measuring a steady-state voltage in the insulation monitoring device 10 in accordance with the second implementation.

First, referring to FIG. 11, the control unit 100 may determine a sampling period according to the initial sampling interval tn0 calculated in step S1002 of FIG. 10A, and control the average voltage calculation unit 110 to calculate an average voltage U1 (=Ui) by averaging the voltages detected during the determined sampling period (S1100).

Meanwhile, when the average voltage U1 of the initial sampling period is calculated, the control unit 100 may determine the next sampling period tni+1 based on the initial sampling interval tn0 (=tni) and a preset first time multiple. Here, the control unit 100 may determine the next sampling interval tn1 (=tni+1) by multiplying the initial sampling interval tn0 by the first time multiple. The control unit 100 may then control the average voltage calculation unit 110 to calculate an average voltage U2 (=Ui+1) by averaging voltages detected during the sampling period from the point of time t1 to a point of time t2 that the next sampling interval tn1 has elapsed from the point of time t1 (S1102).

The control unit 100 may calculate a difference between the currently calculated average voltage U2 (=Ui+1) and the previously calculated to average voltages U1 (=Ui). The control unit 100 may then determine whether the calculated difference is equal to or less than a preset value, that is, a first error (S1104). Here, the first error may be a relative error for determining whether the current voltage is a voltage in a stabilized state according to a result of comparing the average voltage values. For example, the first error may be a voltage corresponding to 1% of the currently calculated average voltage Ui+1.

Meanwhile, when it is determined in S1104 that the difference between the currently calculated average voltage Ui+1 and the previously calculated average voltage Ui exceeds the first error, the control unit 100 may determine the next sampling interval based on the first time multiple. The control unit 100 may determine a sampling period according to the determined sampling interval (S1106). In addition, the control unit 100 may re-detect an average voltage of voltages detected during the determined sampling period (S1108). The control unit 100 may go to step S1104 to recalculate a difference between the currently calculated average voltage, namely, the average voltage calculated in step S1108, and the average voltage calculated in the previous sampling period, and re-determine whether the calculated difference is less than or equal to the first error. That is, when the difference between the calculated average voltages exceeds the first error as a result of the determination in step S1104, the process of determining the sampling period and calculating the average voltage may be repeatedly performed. In this case, when the first time multiple is set to 1 as described above, as illustrated in FIG. 12, sampling periods having the same time interval may be set and an average of voltages detected during the same time period may be calculated as an average voltage of the corresponding sampling period.

On the other hand, when it is determined in S1104 that the difference between the currently calculated average voltage $U_{i+1}$ and the previously calculated average voltage $U_i$ is equal to or less than the first error, the control unit 100 may go to step S1006 of FIG. 10A so as to terminate the primary tuning process. In addition, reference points for calculating the slope ratio may be determined.

Figure 13A:
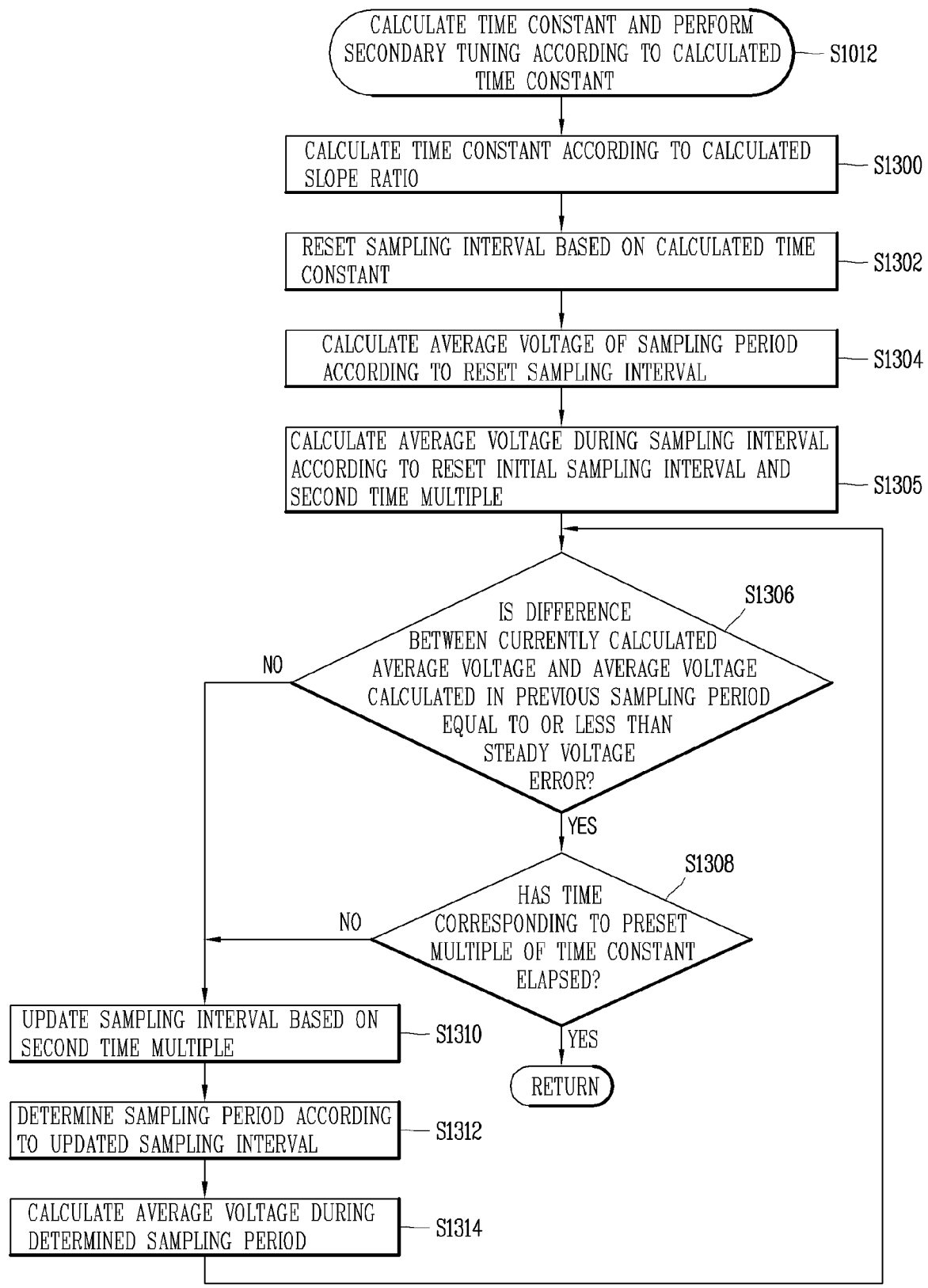
FIG. 13A is a flowchart illustrating a secondary tuning process for calculating a time constant according to a calculated slope ratio and detecting average voltages satisfying a steady voltage error condition from sampling periods determined according to the calculated time constant in the insulation monitoring device according to the second implementation.
Figure 13B:
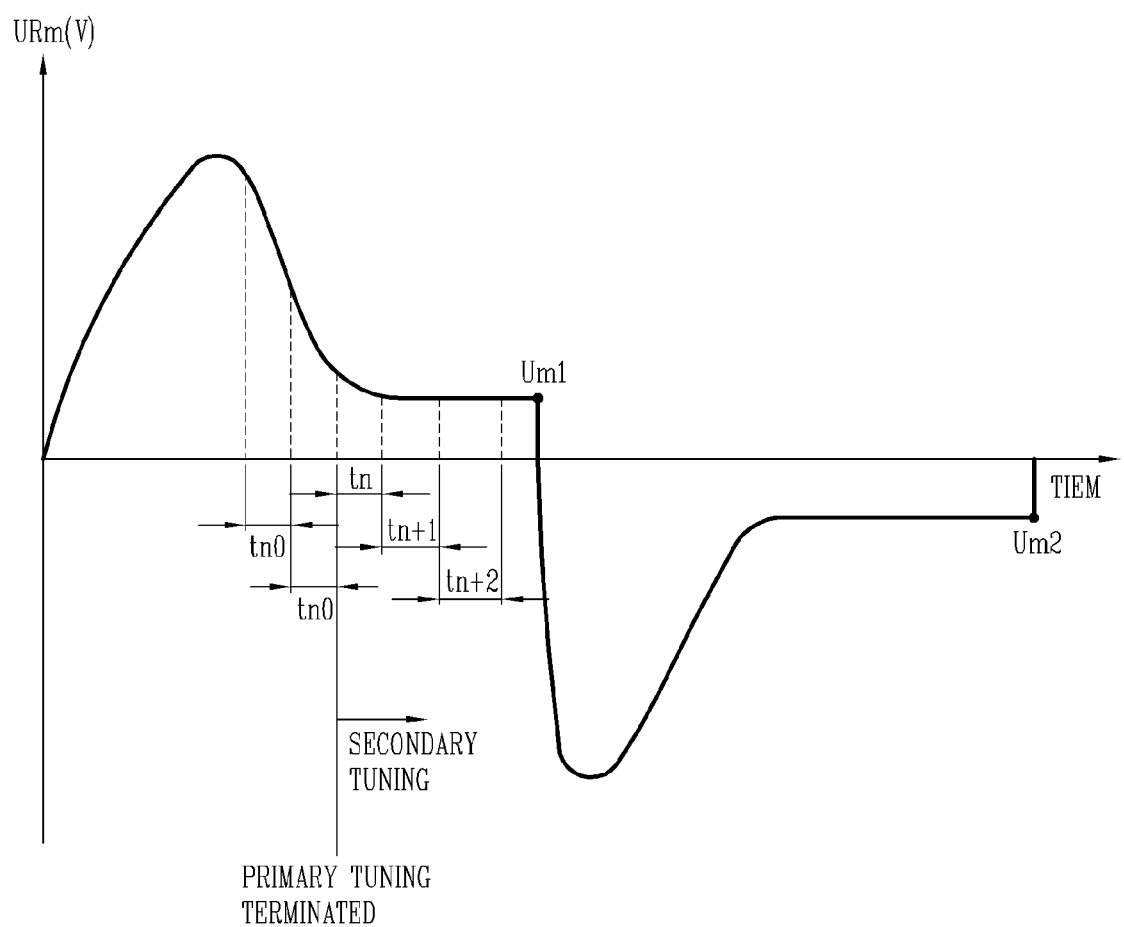
FIG. 13B is an exemplary diagram illustrating the sampling periods set according to the secondary tuning in the insulation monitoring device in accordance with the second implementation.

FIG. 13A is a flowchart illustrating a secondary tuning process for calculating a time constant according to a calculated slope ratio and detecting average voltages satisfying a steady voltage error condition from sampling periods determined according to the calculated time constant in the insulation monitoring device 10 according to the second implementation. Also, FIG. 13B is an exemplary diagram illustrating the sampling periods set according to the secondary tuning in the insulation monitoring device 10 in accordance with the second implementation.

First, referring to FIG. 13A, the control unit 100 of the insulation monitoring device 10 according to the second implementation may calculate a time constant according to the calculated slope ratio when the slope ratio calculated in step S1010 of FIG. 10A is equal to or greater than a preset threshold value (S1300). The step S1300 may be a step of calculating the time constant from the calculated slope ratio according to Equation 5.

When the time constant is calculated in step S1300, the control unit 100 may reset the initial sampling interval to be used in the secondary tuning process based on the calculated time constant (S1302). For example, the control unit 100 may determine the reset initial sampling interval tn according to Equation 6 below.

$$t_n = -\ln(1-0.01) \times \tau \qquad \text{[Equation 6]}$$

where tn denotes a reset initial sampling interval and $\tau$ denotes a time constant.

In addition, the control unit 100 may set a sampling period according to the reset initial sampling interval and calculate an average of voltages detected during the set sampling period (S1304). The control unit 100 may determine the next sampling period for the secondary tuning by multiplying the sampling period according to the reset initial sampling interval by a preset second time multiple, and calculate an average voltage during the determined sampling period (S1305).

FIG. 13B illustrates an example of performing the secondary tuning after the primary tuning is terminated. In one example, when the first time multiple for the primary tuning is 1, as illustrated in FIG. 13B, sampling periods set during the primary tuning may be periods set according to the same time interval.

In this state, when the initial sampling interval is reset as the primary tuning is terminated, the control unit 100 may set the initial sampling period tn according to the reset initial sampling interval, and detect an average voltage of voltages detected during the initial sampling period tn. In addition, the control unit 100 may set the next sampling interval tn+1 based on the initial sampling interval, that is, a time interval (length) during the initial sampling period and the preset second time multiple, and calculate an average voltage of voltages detected during the next sampling interval tn+1.

Then, the control unit 100 may calculate a difference between the currently calculated average voltage (the average voltage calculated during the sampling period tn+1) and the average voltage calculated in the previous sampling period tn, and detect whether the calculated difference between the average voltages is less than or equal to a preset steady voltage error (S1306). When the calculated difference between the average voltages is less than or equal to the preset steady voltage error, the control unit 10 may determine whether a predetermined time corresponding to a preset multiple of the currently calculated time constant has elapsed from a point of time at which the secondary tuning is started, namely, the starting time point of the secondary tuning (S1308).

When the predetermined time corresponding to the preset multiple of the time constant has elapsed as a result of the determination in step S1308, the control unit 100 may go to step S1016 of FIG. 10A, to determine the currently calculated voltage as a stabilized voltage, namely, a steady-state voltage according to the pulse signal generated in step S1000 of FIG. 10A.

On the other hand, when the difference between the average voltages calculated in step S1306 exceeds the steady voltage error or when the predetermined time has not elapsed according to a result of the determination in step S1308 even if the difference between the average voltages calculated in step S1306 is less than or equal to the steady voltage error, the control unit 100 may update the sampling interval based on the length of the currently set sampling period and the second time multiple (S1310). The control unit 100 may re-determine the next sampling period tn+2 according to the updated sampling interval (S1312).

In this case, the second time multiple may be a value greater than 1 (e.g., 1.33). Accordingly, as illustrated in FIG. 13B, the length (time) of the next sampling period tn+1 may be longer than that of the initial sampling period tn, and the length of the next sampling period tn+2 may be longer than that of the previous sampling period tn+1.

Meanwhile, the control unit 100 may recalculate an average voltage during the sampling period tn+2 determined according to the updated sampling interval (S1314). The control unit 100 may then go back to step S1306, to re-calculate the difference between the currently calculated average voltage (the average voltage calculated during the sampling period tn+2) and the previously calculated average voltage (the average voltage calculated during the sampling period tn+1). The control unit 100 may go back to step S518 according to the calculated difference between the average voltages, to re-determine whether the predetermined time has elapsed or go to step S1310 to update the sampling interval based on the length of the currently set sampling period and the second time multiple.

Figure 14:
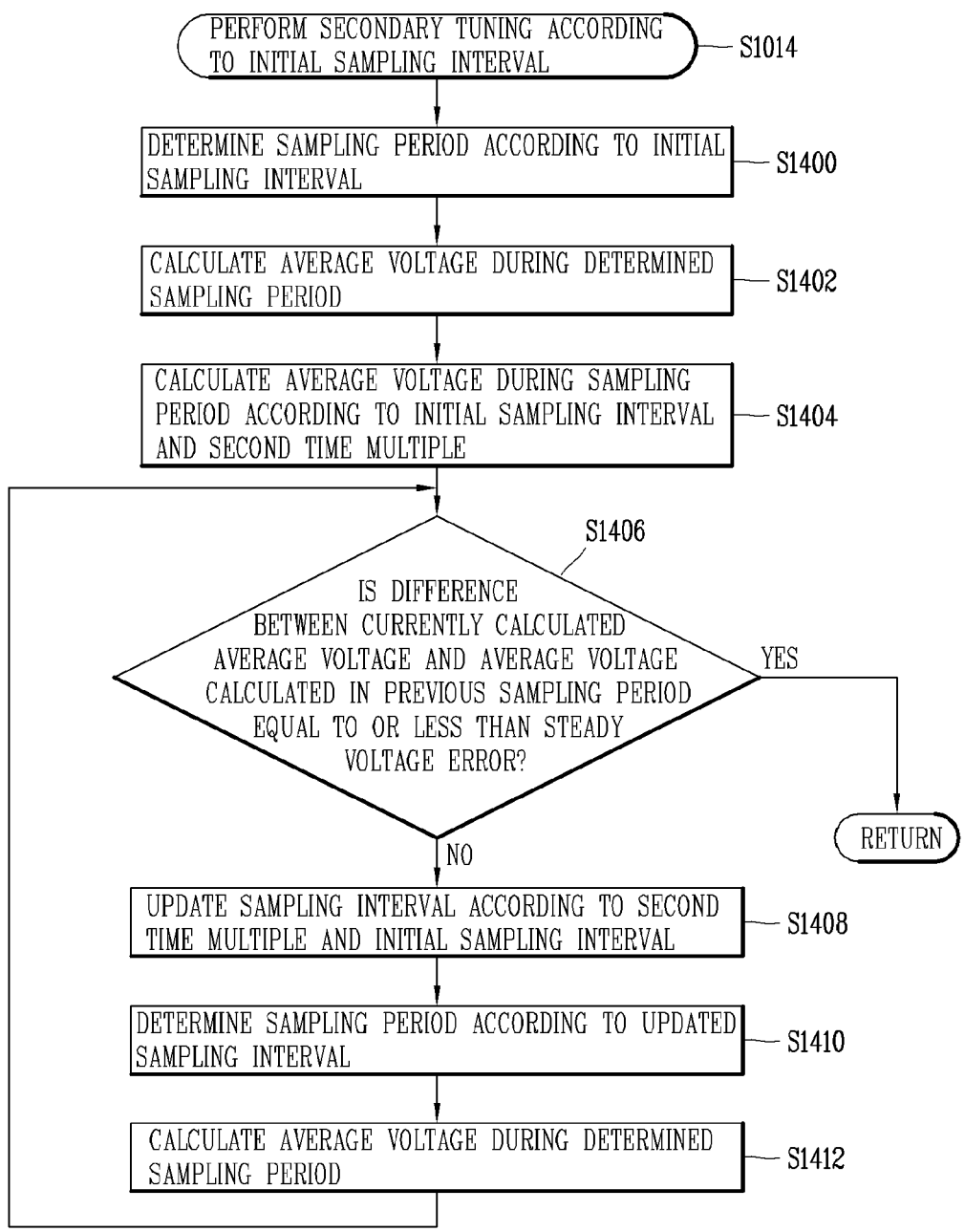
FIG. 14 is a flowchart illustrating a secondary tuning process for detecting average voltages satisfying a steady voltage error condition from sampling periods determined according to a preset time magnification in the insulation monitoring device according to the second implementation.

FIG. 14 is a flowchart illustrating an operation process of performing the secondary tuning according to a preset initial sampling interval due to difficulty in calculating the time constant, which results from that the calculated slope ratio is less than the threshold value, in the insulation monitoring device 10 according to the second implementation.

Referring to FIG. 14, when it is difficult to calculate the time constant as the calculated slope ratio is less than the threshold value, the control unit 100 may directly perform the secondary tuning process according to the second time multiple without resetting the initial sampling interval.

The control unit 100 may first determine a sampling period according to the initial sampling interval tn0 (S1400). In this case, the initial sampling interval tn0 may be the sampling interval calculated in step S1002 of FIG. 10A.

When the initial sampling interval is calculated in step S1400, the control unit 100 may calculate an average voltage during the sampling period according to the calculated initial sampling interval (S1402). In addition, the control unit 100 may determine the next sampling period based on the initial sampling interval tn0 and the second time multiple set for the secondary tuning. The control unit 100 may calculate an average voltage by averaging voltages detected during the determined sampling period (S1404).

When the average voltage is calculated in step S1404, the control unit 100 may determine whether the difference between the currently calculated average voltage and the average voltage calculated in the previous sampling period is equal to or less than the steady voltage error (S1406). When the calculated difference between the average voltages is less than or equal to the steady voltage error as a result of the determination in step S1406, the control unit 100 may go to step S1016 of FIG. 10A, to determine the currently calculated voltage as a stabilized voltage, namely, a steady-state voltage according to the pulse signal generated in step S1000 of FIG. 10A.

On the other hand, when the difference between the average voltages calculated in step S1406 exceeds the steady voltage error, the control unit 100 may update the sampling interval based on the length of the currently set sampling period and the second time multiple (S1408). The control unit 100 may re-determine the next sampling period according to the updated sampling interval (S1410). The control unit 100 may recalculate the average voltage during the sampling period determined in step S1410 according to the updated sampling interval (S1412).

When the average voltage during the newly determined sampling period is calculated in step S1412, the control unit 100 may go back to step S1406 to determine whether the difference between the currently calculated average voltage and the average voltage calculated in the previous sampling period is equal to or less than the steady voltage error. The control unit 100 may perform the process from step S1408 to step S1412 again according to a result of the determination.

Meanwhile, in the description of FIG. 10A, the calculation of the final insulation resistance based on the plurality of insulation resistances in step S1026 of FIG. 10A when the plurality of initial insulation resistances are calculated has been described. However, when a difference between the plurality of insulation resistances is equal to or greater than a preset threshold value, the control unit 100 may not calculate the final insulation resistance according to the currently calculated initial insulation resistances.

Figure 15:
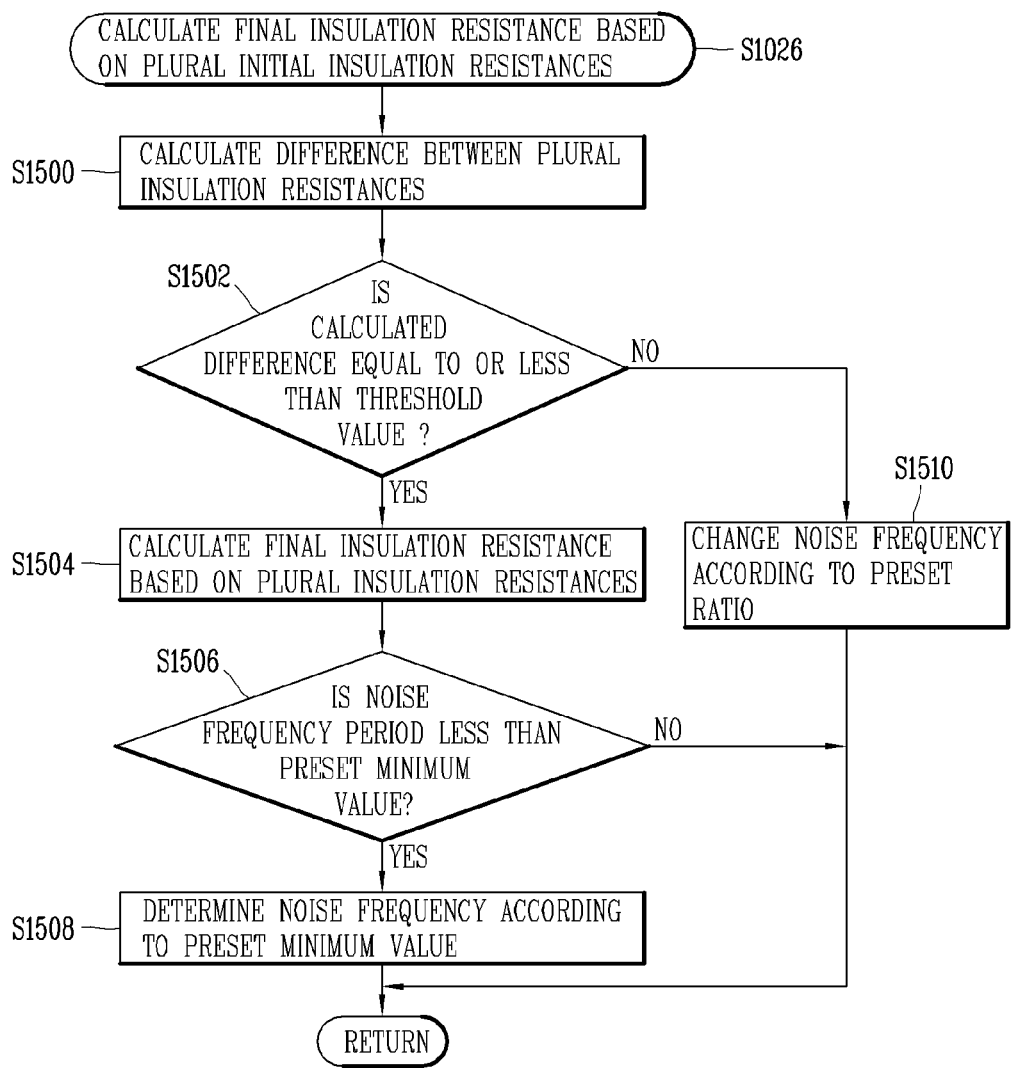
FIG. 15 is a flowchart illustrating an operation process of calculating final insulation resistance based on a preset number of initial insulation resistances calculated according to the process of FIG. 10A in the insulation monitoring device according to the second implementation.

FIG. 15 is a flowchart illustrating an operation process of calculating final insulation resistance based on a preset number of initial insulation resistances calculated according to the process of FIG. 10A in the insulation monitoring device 10 according to the second implementation.

Referring to FIG. 15, the insulation monitoring device 10 according to the second implementation may calculate a difference between a preset number of initial insulation resistance values, that is, a plurality of initial insulation resistance values (S1500). For example, when the preset number is two, the control unit 100 may calculate a difference between a first initial insulation resistance Re1 and a second initial insulation resistance Re2 successively calculated after the first initial insulation resistance Re1 is calculated.

On the other hand, when the difference between the plurality of initial insulation resistance values exceeds the preset threshold value, the control unit 100 may change the noise frequency according to a preset ratio (S1510).

For example, the control unit 100 may reduce the noise frequency by 50%, and may recalculate the initial insulation resistance based on the reduced noise frequency. In this case, as the noise frequency is reduced to ½, the period of the noise frequency may be doubled, so that the initial sampling interval tn0 can be changed according to the length of the noise frequency period.

For example, when the period of the noise frequency increases, the initial sampling interval tn0 may be changed to the increased period of the noise frequency. Accordingly, the reference points determined according to the initial sampling interval tn0 can be changed, and thus slopes for calculating the slope ratio can also be changed. In this case, when the slope ratio is changed, the time constant may also be changed.

Meanwhile, when the noise frequency is changed in step S1510, the control unit 100 may perform the process of FIG. 10A again. When the preset number of initial insulation resistances is calculated again, the control unit 100 may recalculate the difference between the initial insulation resistances in step S1500 of FIG. 15, and may redetermine whether the difference exceeds the threshold value.

The previous description has been given under the assumption that the reduction ratio of the noise frequency is 50%, but this is merely illustrative for convenience of description, and the present disclosure may not be limited thereto. That is, of course, the noise frequency may be reduced according to another reduction ratio other than 50%.

Meanwhile, when the difference between the plurality of initial insulation resistance values is less than or equal to the preset threshold value, the control unit 100 may calculate the final insulation resistance based on a preset number of initial insulation resistances which is currently calculated (S1504). For example, the control unit 100 may calculate the final insulation resistance by calculating an average of the preset number of initial insulation resistances.

When the final insulation resistance is calculated, the control unit 100 may check whether a currently set noise frequency is less than a preset minimum value (S1506). For example, as illustrated in step S1510, when the difference between the preset number of initial insulation resistances exceeds the preset threshold value, the control unit 100 may reduce the noise frequency and re-detect the preset number of initial insulation resistances based on the reduced noise frequency. Therefore, the noise frequency can be continuously reduced according to the difference between the detected initial insulation resistances. And initial insulation resistances according to the reduced noise frequency may be detected.

In the case where the final insulation resistance is calculated, when the currently set noise frequency is less than the preset minimum value as a result of the check in step S1506, the control unit 100 may determine the noise frequency according to the preset minimum value (S1508). Accordingly, in the insulation monitoring device 10 according to the second implementation, when the final insulation resistance is calculated, the noise frequency can be determined to be a frequency higher than or equal to the preset minimum value. The control unit 100 may then perform the process of FIG. 10A again to continuously monitor the insulation state between the electric line 170 and the ground.

According to the foregoing description, it has been mentioned that the time constant can be calculated only when the slope ratio is equal to or greater than a preset threshold value. That is, in order to calculate the time constant, the slope ratio calculated in step S1008 must be greater than or equal to the preset threshold value. Therefore, the insulation monitoring device 10 according to the second implementation may further include a configuration for increasing the slope ratio.

First, the relationship between a time constant and a voltage across the insulation resistance will be expressed by Equation 7 below.

$$U_m = U_p \frac{R_m}{R_e + R_m + R_c} - \left[ U_p \frac{R_m}{R_e + R_m + R_c} \left( 1 - \frac{R_e + R_m + R_c}{R_m + R_c} \right) e^{-\frac{R_e + R_m + R_c}{R_e(R_m + R_c)}} \right]$$ [Equation 7]

where Um denotes a steady voltage, Re denotes insulation resistance, Rm denotes detection resistance, Rc denotes a resistance value of a coupler resistor, Up denotes an amplitude of a test pulse, and t denotes a steady voltage measurement time.

Figure 16:
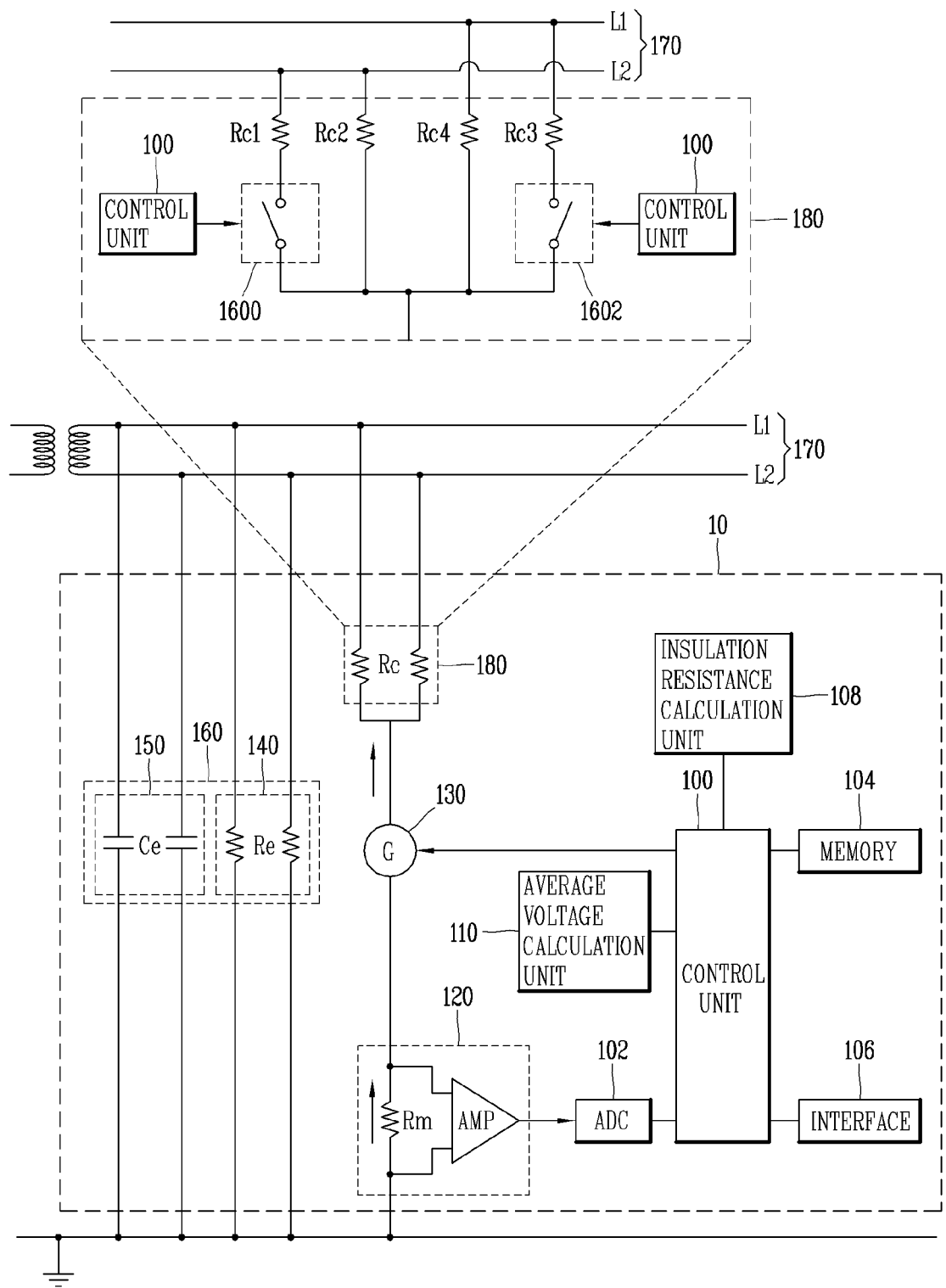
FIG. 16 is an exemplary diagram illustrating a structure of the insulation monitoring device according to the second implementation configured to change a resistance value of a coupler resistor.
Figure 17:
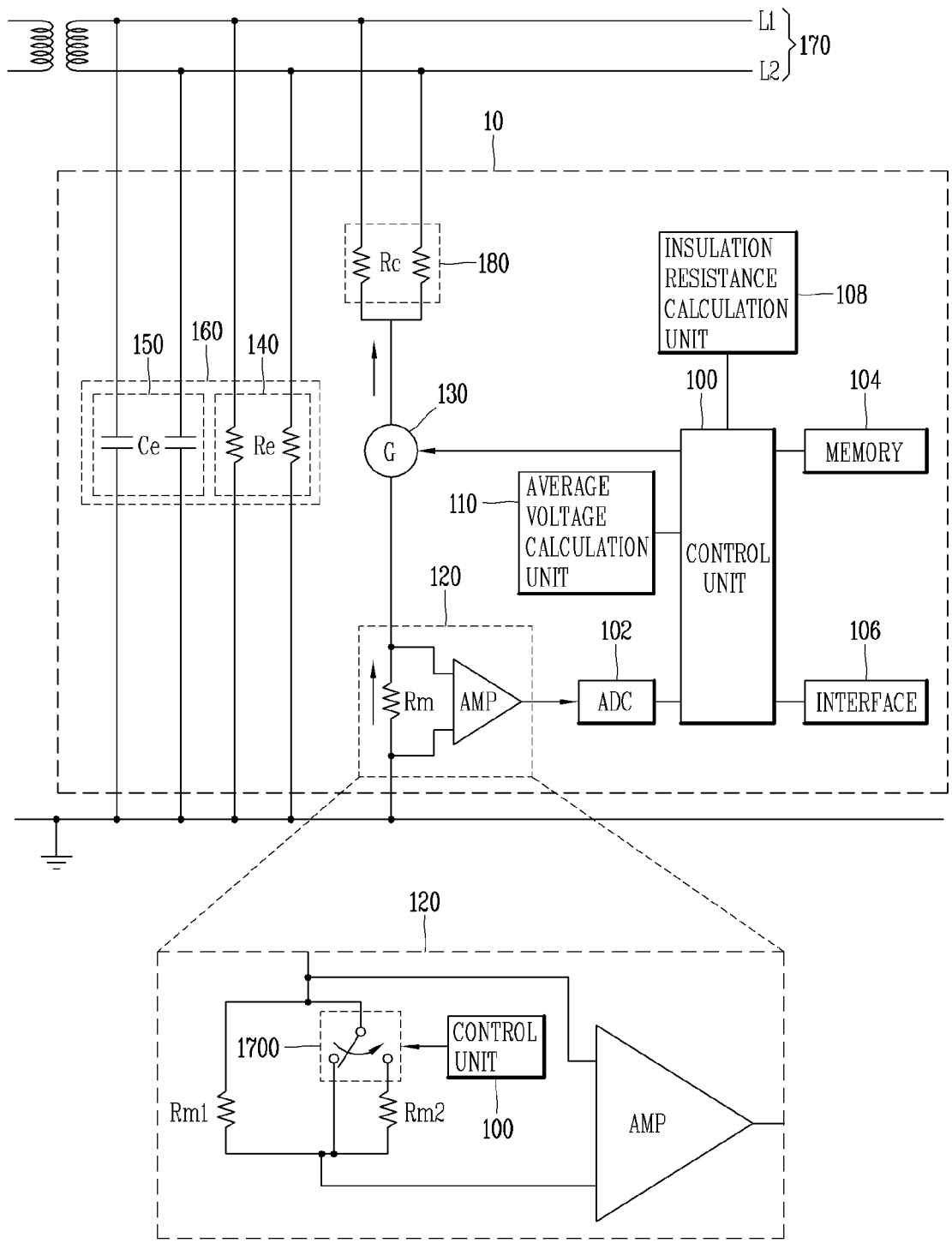
FIG. 17 is an exemplary diagram illustrating a structure of the insulation monitoring device according to the second implementation configured to change a value of detection resistance.

Referring to Equation 7, when the value of the test pulse UP is increased, the detection resistance value of the detection resistor Rm is increased, or the resistance value of the coupler resistor Rc is decreased, the slope of the stead voltage Um can be increased. Accordingly, the insulation monitoring device 10 according to the second implementation may further include a structure capable of reducing the resistance value of the coupler resistor or increasing the value of the insulation resistance. FIGS. 16 to 17 illustrate examples of such cases.

First, FIG. 16 is an exemplary diagram illustrating a structure of the insulation monitoring device according to the second implementation configured to change a magnitude of coupler resistance.

Referring to FIG. 16, the coupler resistor 180 of the insulation monitoring device 10 according to the second implementation may include a plurality of resistors that may be connected in parallel to each of the electric lines. In addition, some resistors may be connected through switches, so as to implement a structure in which the plurality of resistors can be connected to the respective electric lines 170 in parallel under the control of the control unit 100.

More specifically, as illustrated in FIG. 16, when the electric line 170 of the system is a single-phase electric line, a first coupler resistor Rc1 and a second coupler resistor Rc2 may be connected in parallel to the second electric line L2. Of them, the first coupler resistor Rc1 may be connected to the second electric line L2 through a first switch 700. Similarly, a third coupler resistor Rc3 and a fourth coupler resistor Rc4 may be connected in parallel to the first electric line L1. Of them, the third coupler resistor Rc3 may be connected to the first electric line L1 through a second switch 702.

The first switch 700 and the second switch 702 may operate in cooperation with each other. That is, when the first switch 700 is open, that is, the connection of the first coupler resistor Rc1 is cut off, the second switch 702 may also be open to cut off the connection of the third coupler resistor Rc3. In addition, when the first switch 700 is closed, that is, when the first coupler resistor Rc1 and the second electric line L2 are connected, the second switch 702 may also be closed and the third coupler resistor Rc3 and the first electric line L1 may be connected.

Meanwhile, when the final insulation resistance is calculated through step S1026 of FIG. 10A, the control unit 100 may determine whether the current time constant is calculated. When the time constant is not calculated, the resistance value of the coupler resistor may be reduced by controlling the first switch 1600 and the second switch 1602.

In this case, the first switch 1600 and the second switch 1602 may be maintained in an open state as an initial state. In this case, the control unit 100 may close both the first switch 1600 and the second switch 1602 to further connect the first coupler resistor Rc1 to the second electric line L2 and the third coupler resistor Rc3 to the first electric line L1. Accordingly, the third coupler resistor Rc3 and the fourth coupler resistor Rc4 can be connected in parallel to the first electric line L1, which can reduce the resistance value of the coupler resistors connected to the first electric line L1. Also, the first coupler resistor Rc1 and the second coupler resistor Rc2 can be connected in parallel to the second electric line L2, which can also reduce the resistance value of the coupler resistors connected to the second electric line L2.

The decrease in the resistance value of the coupler resistors can lead to an increase in the slope ratio. In this case, when the increased slope ratio is equal to or greater than the threshold value, the control unit 100 may perform step S1012 other than step S1014 of FIG. 10A when the process of FIG. 10A is performed again to calculate the insulation resistance, and accordingly, the control unit 100 may calculate the time constant and perform the secondary tuning according to the calculated time constant.

Meanwhile, FIG. 16 assumes that the system has the single-phase electric line, but the present disclosure may not be limited thereto. That is, when the electric line of the system is a three-phase electric line, a plurality of resistors may be connected in parallel to each of the electric lines of R, S, and T phases, and some of those resistors may be connected through switches so as to allow the control of the connection with the electric lines by the control unit 100.

Meanwhile, in the description of FIG. 16, it is assumed that two resistors are connected in parallel to each electric line, but the present disclosure may not be limited thereto. That is, any number of resistors can be connected in parallel to each electric line.

FIG. 17 is an exemplary diagram illustrating a structure of the insulation monitoring device according to the second implementation configured to change a value of detection resistance.

Referring to FIG. 17, a detection resistor disposed on the signal measurement unit 120 of the insulation monitoring device 10 according to the second implementation may include a plurality of resistors that may be connected in parallel to the signal generation unit 130. In addition, some of the plurality of resistors may be connected through switches to have a structure in which the plurality of resistors can be connected in parallel under the control of the control unit 100.

In more detail, as illustrated in FIG. 17, the detection resistor may include a first electric path including a first detection resistor Rm1 and a second detection resistor Rm2, a second electric path that does not include the second detection resistor Rm2, and a changeover switch 1700 forming a circuit by being connected to the first detection resistor Rm1 through one of the first electric path and the second electric path. In this case, the changeover switch 1700 may be maintained in a state connected to the first electric path as an initial state. In this case, since the first detection resistor Rm1 and the second detection resistor Rm2 are connected in parallel, detection resistance that is calculated as combined resistance of the first detection resistor Rm1 and the second detection resistor Rm2 can have a value smaller than that of the first detection resistor Rm1.

Meanwhile, when the final insulation resistance is calculated through step S1026 of FIG. 10A, the control unit 100 may determine whether the current time constant is calculated. When the time constant is not calculated, the control unit 100 may, of course, control the changeover switch 750 to form a circuit with the second electric path without including the second detection resistor Rm2. In this case, since the first detection resistor Rm1 is connected in series, the detection resistance can further increase.

Since the detection resistance value increases, the slope ratio can increase. In this case, when the increased slope ratio is equal to or greater than the threshold value, the control unit 100 may perform step S1012 other than step S1014 of FIG. 10A when the process of FIG. 10A is performed again to calculate the insulation resistance. Accordingly, the control unit 100 may calculate the time constant and perform the secondary tuning according to the calculated time constant.

Also, in order to increase the slope ratio, the control unit 100 may control the signal generation unit 130 to further increase an amplitude of a test pulse. As the amplitude of the test pulse increases, the slope ratio can increase. In this case, when the increased slope ratio is equal to or greater than the threshold value, the control unit 100 may perform step S1012 other than step S1014 of FIG. 10A when the process of FIG. 10A is performed again to calculate the insulation resistance. Accordingly, the control unit 100 may calculate the time constant and perform the secondary tuning according to the calculated time constant.

On the other hand, when the calculation of the final insulation resistance is completed, if the time constant is not calculated, the control unit 100 can also simultaneously control the first switch 1600 and the second switch 1602 illustrated in FIG. 16, and at least one of the changeover switch 1700 and the amplitude of the test pulse illustrated in FIG. 17, in order to increase the slope ratio. That is, the control unit 100 may also control only the first and second switches 1600 and 1602 or only the changeover switch 1700 to increase the slope ratio. Alternatively, the control unit 100 may increase only the amplitude of the test pulse.

In addition, the control unit 100 may simultaneously control the first switch 1600, the second switch 1602, and the changeover switch 1700. Alternatively, the control unit 100 may control the first switch 1600 and the second switch 1602 and simultaneously increase the amplitude of the test pulse. Alternatively, the control unit 100 may control the changeover switch 170 and simultaneously increase the amplitude of the test pulse. Alternatively, the control unit 100 may control the first switch 1600 and the second switch 1602, control the changeover switch 1700, and increase the amplitude of the test pulse all at the same time. That is, of course, all three methods may be used together. As such, when two or more methods are simultaneously controlled, it may be, of course, possible to increase the slope ratio more effectively than controlling only one way.

Alternatively, the control unit 100 may first calculate the final insulation resistance by using only one method, and then use a plurality of methods at the same time if the time constant is not calculated even though the one method is used. That is, when the time constant is not calculated in the process of calculating the final insulation resistance, the control unit 100 may first increase the slope ratio by using only one of the first switch 1600 and the second switch 1602, the changeover switch 1700, or the test pulse amplitude control. Nevertheless, when the time constant is not calculated in the process of calculating the next final insulation resistance, the control unit 100 may increase the slope ratio by simultaneously using two methods. And when the time constant is still not calculated in the process of calculating the next final insulation resistance, the control unit 100 may increase the slope ratio by using all of the three methods together.

Meanwhile, the implementation illustrates the configuration of performing the secondary tuning according to the initial sampling interval tn0 when the slope ratio calculated in step S1008 of FIG. 10A is less than the preset threshold value. However, unlike this, when the calculated slope ratio is less than the threshold value, a preset minimum slope ratio value may be applied. Then, the time constant can be calculated according to the operation result of the natural logarithm ln for the minimum slope ratio value and a time interval between the first reference point and the starting point. According to the calculated time constant, the initial sampling interval can be reset and the secondary tuning can be performed according to the reset initial sampling interval, as described in FIG. 13A.

Hereinafter, a more detailed description will be given of the operation process of calculating a value of insulation resistance between the electric line 170 and the ground in an insulation monitoring device 10 according to a third implementation, with reference to a plurality of flowcharts.

Figure 18A:
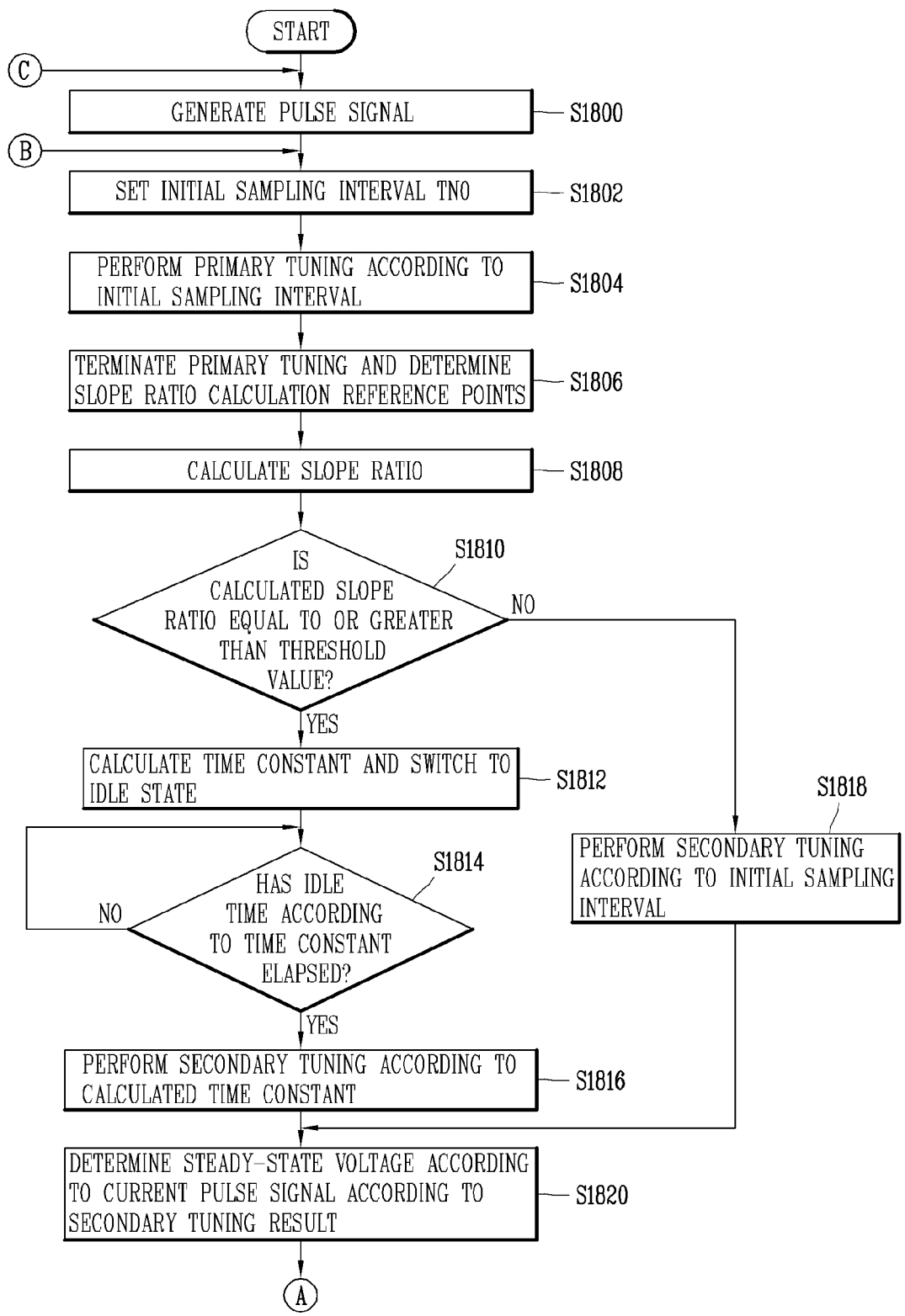
FIGS. 18A and 18B are flowcharts illustrating an operation process of calculating insulation resistance in an insulation monitoring device in accordance with a third implementation.
Figure 18B:
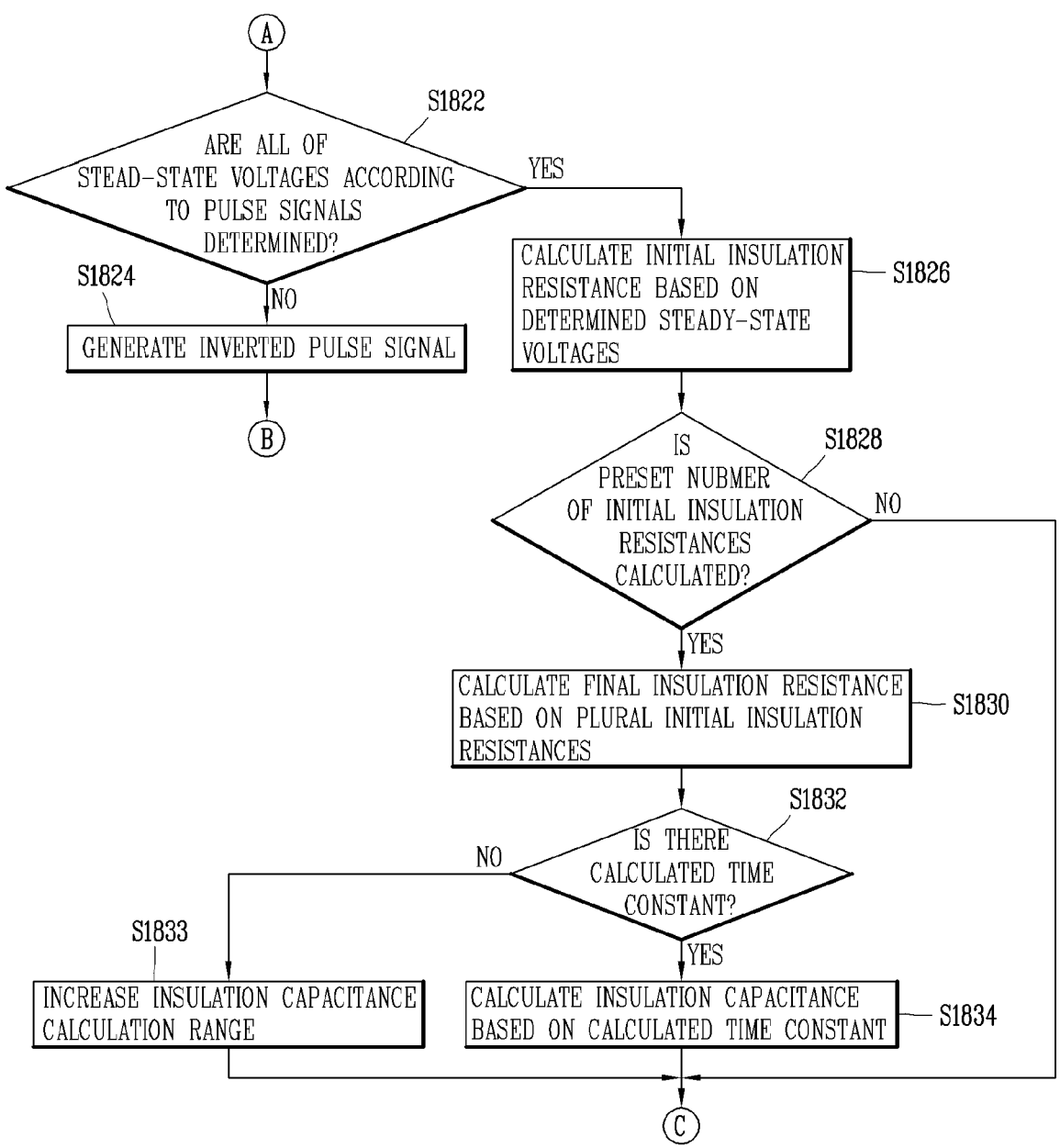

First, FIGS. 18A and 18B are flowcharts illustrating an operation process of calculating insulation resistance in an insulation monitoring device 10 in accordance with a third implementation.

First, referring to FIG. 18A, the control unit 100 of the insulation monitoring device 10 according to the third implementation may control the signal generation unit 130 to generate a pulse signal having a predetermined voltage (S1800). Then, the signal generation unit 130 may generate a signal (pulse signal) having a positive voltage or a negative voltage of a predetermined magnitude under the control of the control unit 100, and apply the generated signal to the electric line 170 through the coupler resistor Rc.

When the pulse signal is generated in step S1800, the control unit 100 may determine an initial sampling interval tn0 (S1802). For example, the control unit 100 may determine an initial value tk according to Equation 1, and determine the initial sampling interval tn0 according to the initial value tk.

Meanwhile, when the initial sampling interval tn0 is determined in step S1802, the control unit 100 may determine a starting point to, namely, the initial sampling starting point for measuring a voltage URm detected through the detection resistor Rm of the signal measurement unit 120. In this case, the control unit 100 may determine a point of time that a predetermined time has elapsed to from an inversion of a previous pulse signal as the starting point t0.

Meanwhile, when the starting point t0 is determined, the control unit 100 may perform a primary tuning process from the starting point t0 based on the initial sampling interval tn0 (S1804).

In step S1804, the control unit 100 may determine a period from the starting point t0 to a point of time that the initial sampling interval tn0 has elapsed from the starting point t0 as a sampling period. In addition, the control unit 100 may calculate an average voltage of voltages measured during the determined sampling period. The control unit 100 may then determine the length of the next sampling period based on the length of the current sampling period and a preset first time multiple, and determine the next sampling period according to the determined length. In addition, the control unit 100 may recalculate an average voltage of voltages measured during the determined sampling period. The control unit 100 may compare the currently calculated average voltage with an average voltage calculated in the previous sampling period, and calculate a difference between the average voltages.

Depending on whether the calculated difference is less than or equal to a preset first error, the control unit 100 may recalculate the average voltage by redetermining the next sampling period and re-compare the calculated average voltage with the previously calculated average voltage, or terminate the primary tuning process. Meanwhile, the first time multiple used in the first tuning process may have a value of '1'.

When the primary tuning process is terminated, the control unit 100, as illustrated in FIG. 10B, may determine reference points for calculating a slope ratio based on the voltage measured at a point of time that the primary tuning is terminated and the initial sampling interval (S1806). The control unit 100 may calculate a slope ratio based on the determined reference points and Equations 4 and 5 (S1808). However, when calculating the time constant τ as in Equation 5, the ratio of the second slope to the first slope may converge to 1 as the difference between the first slope and the second slope is smaller. Then, since ln is 1 and the denominator becomes 0, it may be difficult to calculate the time constant τ. Accordingly, the control unit 100 may further perform the process of determining whether the slope ratio calculated in step S1808 is equal to or greater than a preset threshold value (S1810). In addition, the time constant τ may be calculated only when the slope ratio is greater than the preset threshold value.

Meanwhile, when the time constant is calculated, the control unit 100 may determine an idle time based on the time constant. Here, the control unit 100 may determine the idle time as a time corresponding to a preset multiple of the calculated time constant. For example, according to a plurality of experiments performed in relation to the present disclosure, it may be most preferable that the idle time is determined as a time corresponding to five times (5τ) of the time constant τ. In this case, the control unit 100 may determine a time corresponding to five times of the calculated time constant as the idle time, and may switch the insulation monitoring device 10 to an idle state (S1812). Then, the operation mode of the insulation monitoring device 10 may be switched to a power saving mode.

Meanwhile, the control unit 100 may determine whether the determined idle time has elapsed in the state switched to the idle state. That is, after the insulation monitoring device 10 is switched to the idle state, the control unit 100 may determine whether the determined idle time has elapsed (S1814). When the idle time has not elapsed, the control unit 100 may maintain the idle state. On the other hand, when the idle time has elapsed, the control unit 100 may switch the operation state of the insulation monitoring device 10 into an active state and restart the operation of setting the sampling period and calculating the average voltage during the set sampling period.

Upon being switched to the active state, the control unit 100 may reset the initial sampling interval according to the calculated time constant. The control unit 100 may then perform secondary tuning based on the reset initial sampling interval and a second time multiple different from the first time multiple (S1816). The secondary tuning may be a tuning process using a time multiple different from that of the primary tuning process. Here, the second time multiple may have a greater value than the first time multiple. For example, the second time multiple may have a value of 1.33. In this case, as the second tuning time continues, the sampling period set according to the second time multiple may gradually extend.

When the secondary tuning is performed, the control unit 100 may set a point of time at which the operation state is switched to the active state as a starting time point of the secondary tuning. The control unit 100 may also determine a period from the starting time point of the secondary tuning to a point of time that the reset initial sampling interval has elapsed from the starting time point of the secondary tuning, to be the sampling period for the secondary tuning. In addition, the control unit 100 may calculate an average voltage of voltages measured during the determined sampling period. The control unit 100 may then determine the length of the next sampling period according to a time calculated based on the length of the current sampling period and the second time multiple, and determine the next sampling period according to the determined length. In addition, the control unit 100 may recalculate an average voltage of voltages measured during the determined sampling period. The control unit 100 may compare the currently calculated average voltage with an average voltage calculated in the previous sampling period, and calculate a difference between the average voltages.

When the calculated difference exceeds a preset steady voltage error, the control unit 100 may determine the next sampling period again so as to recalculate the average voltage and re-compare the calculated average voltage with the previously calculated average voltage. On the other hand, when the calculated difference is equal to or less than the steady voltage error, the control unit 100 may determine the currently calculated average voltage as the steady-state voltage according to the pulse signal generated in step S1800 (S1820).

Here, when the pulse signal generated in step S1800 is a positive pulse signal, the control unit 100 may determine the currently calculated average voltage as a positive steady-state voltage. On the other hand, when the pulse signal generated in step S1800 is a negative pulse signal, the control unit 100 may determine the currently calculated average voltage as a negative steady-state voltage.

On the other hand, when the calculated slope ratio is less than the threshold value as a result of the determination in step S1810, the control unit 100 may not calculate the time constant. In this case, since the time constant is not calculated, the control unit 100 may directly perform the secondary tuning process (S1818). The secondary tuning process performed in step S1818 may be performed based on the initial sampling interval set in step S1802 and the second time multiple. The control unit 100 may proceed to step S1820 according to whether the difference between the calculated average voltage and the average voltage calculated in the previous sampling period is equal to or less than the steady voltage error, to determine the currently calculated average voltage as the steady-state voltage according to the pulse signal generated in step S1800. The process of performing the secondary tuning according to the preset initial sampling interval when the calculated slope ratio is less than the threshold value will be described in detail later with reference to FIG. 20.

When the steady-state voltage according to the currently generated pulse signal is determined in step S1820, the control unit 100 may detect whether the steady-state voltages according to the positive and negative pulse signals have all been determined (S1822).

As a result of the detection in step S1822, when the steady-state voltage according to any one of the positive pulse signal or the negative pulse signal is not detected, the control unit 100 may control the signal generation unit 130 to invert the pulse signal (S1824). Then, the signal generation unit 130 may apply a pulse signal having an inverted voltage of the same magnitude to the electric line 170. Accordingly, the voltage detected in the signal measurement unit 120 may become unstable again due to a surge caused by the voltage inversion.

Then, the control unit 100 may repeat the process from step S1802 to step S1820 again according to the inverted pulse signal. In addition, if both the steady-state voltages according to the positive and negative pulse signals have been determined as a result of the detection in step S1820, the control unit 100 may control the insulation resistance calculation unit 108 to calculate initial insulation resistance based on the determined steady-state voltages (S1826).

In step S1826, the control unit 100 may calculate an average value of the currently determined steady-state voltages according to Equation 2. The control unit 100 may also calculate the initial insulation resistance based on the average steady-state voltages, which are calculated by Equation 2, according to Equation 3.

On the other hand, when the initial insulation resistance (the value of the initial insulation resistance) is calculated in step S1826, the control unit 100 may check whether the initial insulation resistance has been calculated as many as a preset number (S1828). And when it is checked in step S1828 that the preset number of initial insulation resistances is not calculated, the control unit 100 may go back to step S1800 and repeat the process from step S1800 to step S1826.

On the other hand, when it is checked in step S1826 that the preset number of initial insulation resistances is calculated, the control unit 100 may calculate final insulation resistance based on the preset number of initial insulation resistances, that is, a plurality of initial insulation resistances (S1830). Here, the step S1830 may be a step of calculating an average value of the plurality of initial insulation resistances.

Meanwhile, when the value of the final insulation resistance is calculated in step S1830, the control unit 100 may detect whether there is a currently calculated time constant (S1832). For example, when the slope ratio calculated in step S1810 is equal to or greater than a preset threshold value, there may be a calculated time constant. On the other hand, when the calculated slope ratio is less than the preset threshold value as a result of the determination in step S1810, there may be no calculated time constant.

When there is a calculated time constant as a result of the detection in step S1832, the control unit 100 may further detect capacitance, namely, leakage capacitance Ce of an insulation capacitor based on the calculated time constant, as illustrated in Equation 8 below (S1834).

$$C_e = \frac{\tau}{(R_e \| R_i)} \qquad \text{[Equation 8]}$$

where τ denotes a time constant, Re denotes a value of insulation resistance, and Ri denotes a value of internal resistance of the insulation monitoring device.

Then, the control unit 100 may display the calculated value of the final insulation resistance and the value of the leakage capacitance through the interface 106. The control unit 100 may go back to step S1800 and repeat the process from step S1800 to step S1830 to calculate the insulation resistance value. The insulation state between the electric line 170 and the ground can be monitored according to the calculated insulation resistance value.

On the other hand, if there is no calculated time constant as a result of the detection of step S1832, that is, when the time constant is not calculated since the calculated slope ratio is less than the preset threshold value as the result of the detection in step S1808, the control unit 100 may increase a range of the slope ratio for calculating the insulation capacitance, namely, a calculation range of the insulation capacitance (S1833).

As described above, the time constant can be calculated when the slope ratio is equal to or greater than the threshold value, and the insulation capacitance can be calculated when the time instance is calculated. Accordingly, the minimum value of the calculation range of the insulation capacitance may be the threshold value.

Therefore, when the slope ratio is smaller than the minimum value of the calculation range of the insulation capacitance, the control unit 100 may increase the slope ratio. In this case, when the slope ratio increases to be equal to or greater than the threshold value, the time constant can be calculated, and thus the insulation capacitance can be calculated. Hereinafter, the operation of the control unit 100 for increasing the slope ratio will be described as an operation process for increasing the calculation range of the insulation capacitance.

Meanwhile, in step S1833, the control unit 100 may use various methods in order to increase the slope ratio. For example, the control unit 100 may control the signal generation unit 130 to increase the amplitude of the pulse signal generated in step S1800. Alternatively, the control unit 100 may decrease the resistance value of the coupler resistor 180 or increase the resistance value of the detection resistor Rm included in the signal measurement unit 120 to increase the slope ratio as illustrated in FIGS. 16 and 17.

However, in contrast to this, when there is no time constant calculated as a result of the detection in step S1832, the control unit 100 may, of course, display only the calculated final insulation resistance value through the interface 106. The control unit 100 may go back to step S1800 and repeat the process from step S1800 to step S1830 to calculate the insulation resistance value. The insulation state between the electric line 170 and the ground can be monitored according to the calculated insulation resistance value.

Figure 19A:
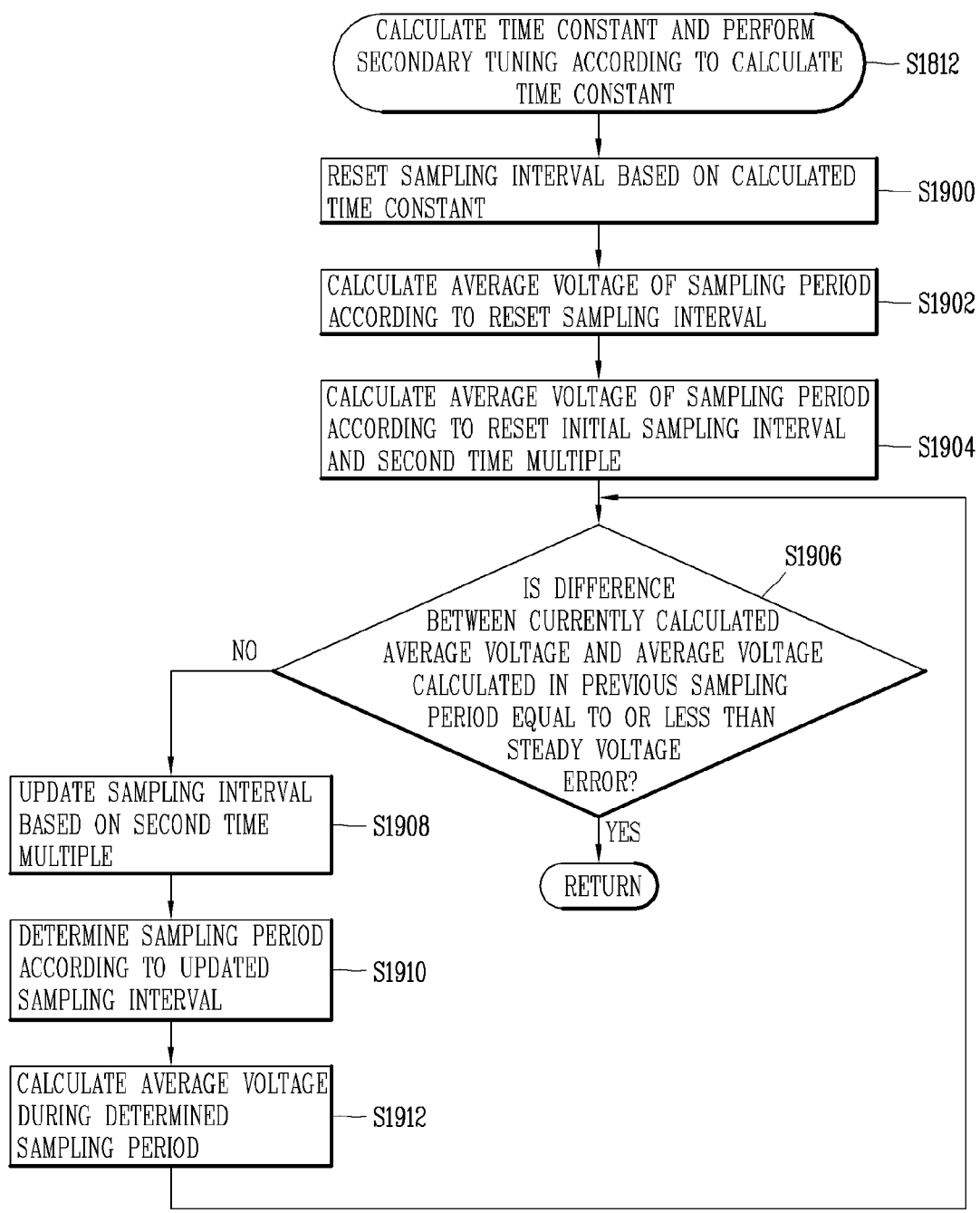
FIG. 19A is a flowchart illustrating an operation process of performing secondary tuning according to a sampling interval based on a calculated time constant and a preset second time multiple in the insulation monitoring device according to the third implementation.

FIG. 19A is a flowchart illustrating an operation process of performing a secondary tuning according to a sampling interval based on a calculated time constant and a preset second time multiple in the insulation monitoring device 10 according to the third implementation. Also, FIG. 19B is an exemplary diagram illustrating a secondary tuning process performed after an idle time determined according to a calculated time constant has elapsed in the insulation monitoring device 10 according to the third implementation.

The control unit 100 of the insulation monitoring device 10 according to the third implementation may calculate the time constant based on the slope ratio in step S1812 when the calculated slope ratio is equal to or greater than the threshold value as a result of the determination in step S1810 of FIG. 18A. In addition, the insulation monitoring device 10 may be switched into an idle state for the idle time determined according to the calculated time constant. In addition, when the insulation monitoring device 10 is switched to the active state as the idle time elapses, the control unit 100 may reset the initial sampling interval to be used in the secondary tuning process (S1900). For example, the control unit 100 may reset the reset initial sampling interval tn according to Equation 6.

In addition, the control unit 100 may set a sampling period according to the reset initial sampling interval and calculate an average of voltages detected during the set sampling period (S1902). The control unit 100 may determine the next sampling period for the secondary tuning by multiplying the sampling period according to the reset initial sampling interval by a preset second time multiple, and calculate an average voltage during the determined sampling period (S1904).

Figure 19B:
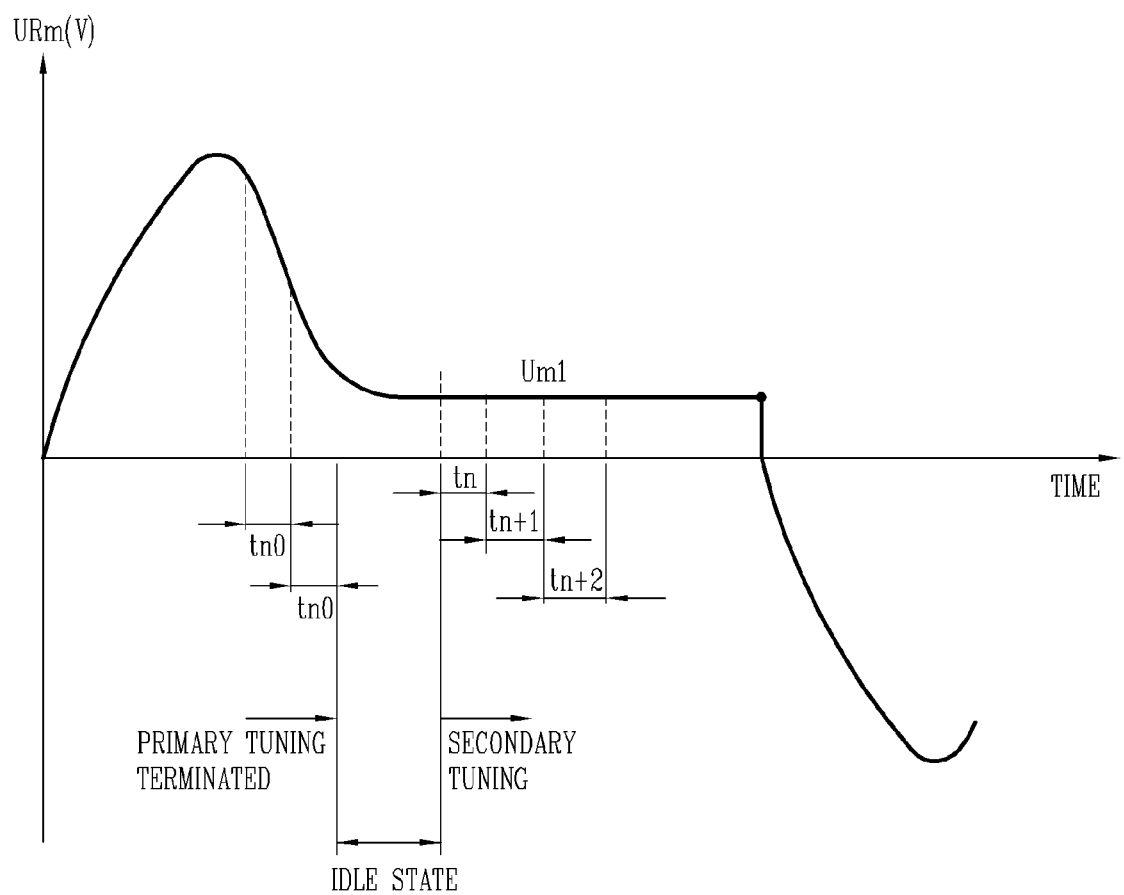
FIG. 19B is an exemplary diagram illustrating a secondary tuning process performed after an idle time determined according to a calculated time constant has elapsed in the insulation monitoring device according to the third implementation.

FIG. 19B illustrates an example in which the secondary tuning is performed after the primary tuning is terminated and the operation state is switched to the idle state according to the calculated time constant. In one example, when the first time multiple for the primary tuning is 1, as illustrated in FIG. 19B, sampling periods set during the primary tuning may be periods set according to the same sampling interval.

In this state, when the primary tuning is finished and the idle time is determined according to the calculated time constant, the control unit 100 may switch the insulation monitoring device 10 to a power saving mode (idle state) for the idle time. When the idle time elapses in the power saving mode, the control unit 100 may reset the initial sampling interval according to the time constant, and set the initial sampling period tn according to the reset initial sampling interval. The control unit 100 may then calculate an average voltage of voltages detected during the initial sampling period tn. In addition, the control unit 100 may set a next sampling interval tn+1 based on the initial sampling interval, that is, a time interval (length) during the initial sampling period tn and the preset second time multiple, and calculate an average voltage of voltages detected during the next sampling interval tn+1.

Then, the control unit 100 may calculate a difference between the currently calculated average voltage (the average voltage calculated during the sampling period tn+1) and the average voltage calculated in the previous sampling period tn, and detect whether the calculated difference between the average voltages is less than or equal to a preset steady voltage error (S1906). When the calculated difference between the average voltages is less than or equal to the preset steady voltage error, the control unit 100 may go to step S1820 of FIG. 18A, to determine the currently calculated voltage as a stabilized voltage, namely, a steady-state voltage according to the pulse signal generated in step S1800 of FIG. 18A.

On the other hand, when the difference between the average voltages calculated in step S1906 exceeds the steady voltage error, the control unit 100 may update the sampling interval based on the length of the currently set sampling period and the second time multiple (S1908). The control unit 100 may re-determine a next sampling period tn+2 according to the updated sampling interval (S1910).

In this case, the second time multiple may be a value greater than 1 (e.g., 1.33). Accordingly, as illustrated in FIG. 19B, the length (time) of the next sampling period tn+1 may be longer than that of the initial sampling period tn, and the length of the next sampling period tn+2 may be longer than that of the previous sampling period tn+1.

Meanwhile, the control unit 100 may recalculate an average voltage during the sampling period tn+2 determined according to the updated sampling interval (S1912). The control unit 100 may then go back to step S1906, to re-calculate the difference between the currently calculated average voltage (the average voltage calculated during the sampling period tn+2) and the previously calculated average voltage (the average voltage calculated during the sampling period tn+1). The control unit 100 may go back to step S1820 of FIG. 18A according to the calculated difference between the average voltages, to determine the currently calculated voltage as the steady-state voltage or go to step S1908 to update the sampling interval based on the length of the currently set sampling period and the second time multiple.

Figure 20:
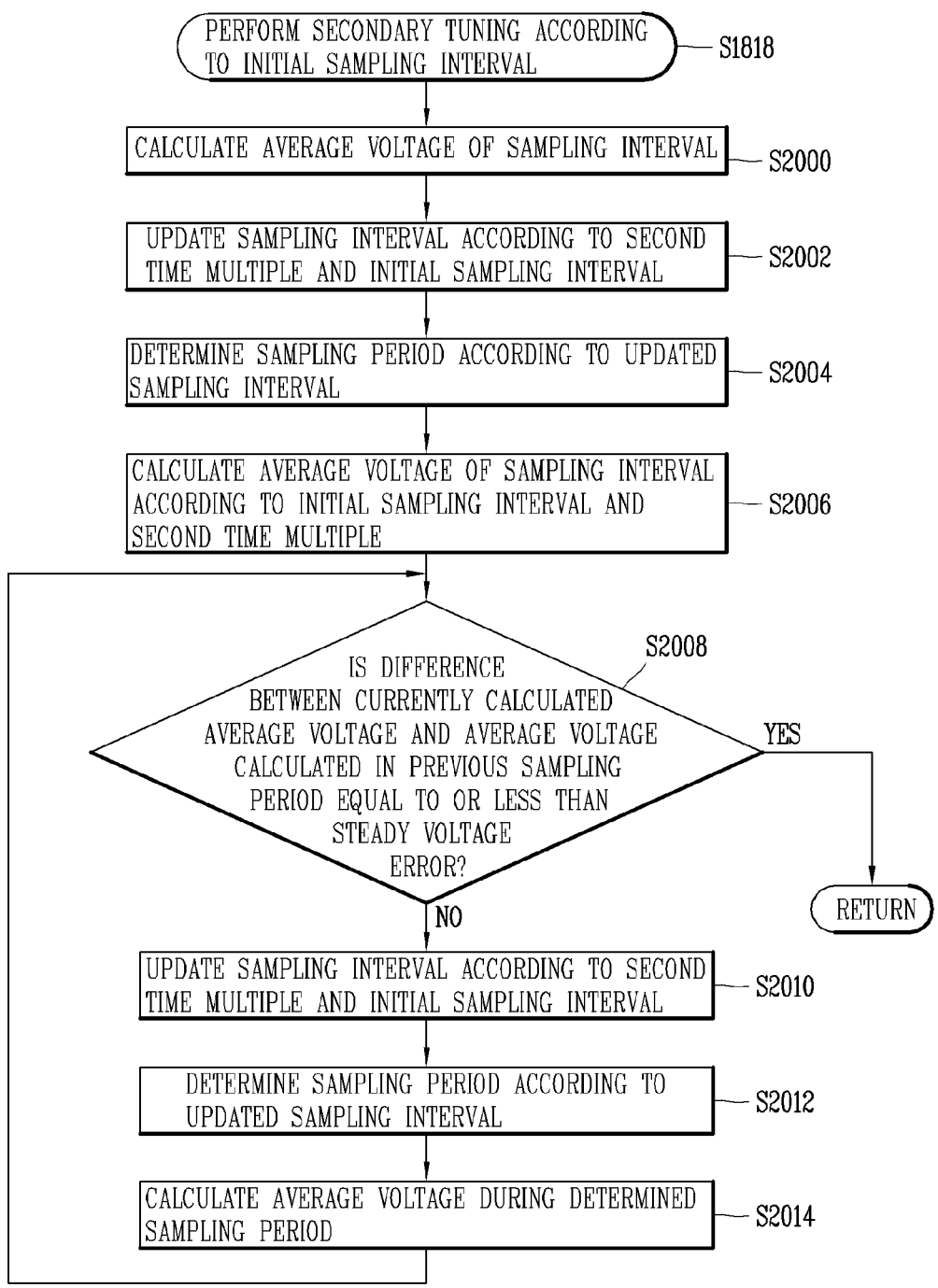
FIG. 20 is a flowchart illustrating an operation process of performing secondary tuning according to an initial sampling interval and a preset second time multiple in the insulation monitoring device according to the third implementation.

Meanwhile, FIG. 20 is a flowchart illustrating an operation process of performing secondary tuning according to the initial sampling interval and the preset second time multiple in the insulation monitoring device 10 according to the third implementation.

Referring to FIG. 20, when it is difficult to calculate the time constant as the calculated slope ratio is less than the threshold value, the control unit 100 may directly perform the secondary tuning process according to the second time multiple without resetting the initial sampling interval.

The control unit 100 may first determine a sampling period according to the initial sampling interval tn0. In this case, the initial sampling interval tn0 may be the sampling interval calculated in step S1802 of FIG. 18A.

When the initial sampling interval is calculated, the control unit 100 may calculate an average voltage during the sampling period according to the calculated initial sampling interval (S2000). In addition, the control unit 100 may determine a next sampling period based on the initial sampling interval tn0 and the second time multiple set for the secondary tuning (S2002, S2004). The control unit 100 may calculate an average voltage by averaging voltages detected during the determined sampling period (S2006).

When the average voltage is calculated in step S2006, the control unit 100 may determine whether the difference between the currently calculated average voltage and the average voltage calculated in the previous sampling period is equal to or less than the steady voltage error (S2008). When the calculated difference between the average voltages is less than or equal to the steady voltage error as a result of the determination in step S2008, the control unit 100 may go to step S1816 of FIG. 18A, to determine the currently calculated voltage as a stabilized voltage, namely, a steady-state voltage according to the pulse signal generated in step S1800 of FIG. 18A.

On the other hand, when the difference between the average voltages calculated in step S2008 exceeds the steady voltage error, the control unit 100 may update the sampling interval based on the length of the currently set sampling period and the second time multiple (S2010). The control unit 100 may re-determine a next sampling period according to the updated sampling interval (S2012). The control unit 100 may recalculate the average voltage during the sampling period determined in step S2010 according to the updated sampling interval (S2014).

When the average voltage during the newly determined sampling period is calculated in step S2014, the control unit 100 may go back to step S2008 to determine whether the difference between the currently calculated average voltage and the average voltage calculated in the previous sampling period is equal to or less than the steady voltage error. The control unit 100 may perform the process from step S2008 to step S2014 again according to a result of the determination.

Meanwhile, in the description of FIG. 18A, the calculation of the final insulation resistance based on the plurality of insulation resistances in step S1826 of FIG. 18A when the plurality of initial insulation resistances are calculated has been described. However, when a difference between the plurality of insulation resistances is equal to or greater than a preset threshold value, the control unit 100 may not calculate the final insulation resistance according to the currently calculated initial insulation resistances.

Hereinafter, the operation of the insulation monitoring device 10 according to the third implementation will be described with reference to FIG. 16. When the time constant is not calculated as a result of the detection in step S1832 of FIG. 18B, the control unit 100 may further perform a step (not illustrated) of reducing the resistance value of the coupler resistor by controlling the first switch 1600 and the second switch 1602.

In this case, the first switch 1600 and the second switch 1602 may be maintained in an open state as an initial state. In this case, the control unit 100 may close both the first switch 1600 and the second switch 1602 to further connect the first coupler resistor Rd to the second electric line L2 and the third coupler resistor Rc3 to the first electric line L1. Accordingly, the third coupler resistor Rc3 and the fourth coupler resistor Rc4 can be connected in parallel to the first electric line L1, which can reduce the resistance value of the coupler resistors connected to the first electric line L1. Also, the first coupler resistor Rc1 and the second coupler resistor Rc2 can be connected in parallel to the second electric line L2, which can also reduce the resistance value of the coupler resistors connected to the second electric line L2.

The decrease in the resistance value of the coupler resistors can lead to an increase in the slope ratio. In this case, once the increased slope ratio is equal to or greater than the threshold value, the control unit 100 may go to step S1812 of FIG. 18A to calculate the time constant when re-performing the process of FIG. 18A, and drive the insulation monitoring device 10 in the power saving mode for the idle time determined according to the time constant. This can reduce the power consumption of the insulation monitoring device.

Meanwhile, FIG. 16 assumes that the system has the single-phase electric line, but the present disclosure may not be limited thereto. That is, when the electric line of the system is a three-phase electric line, a plurality of resistors may be connected in parallel to each of the electric lines of R, S, and T phases, and some of those resistors may be connected through switches so as to allow the control of the connection with the electric lines by the control unit 100.

Meanwhile, in the description of FIG. 16, it is assumed that two resistors are connected in parallel to each electric line, but the present disclosure may not be limited thereto. That is, any number of resistors can be connected in parallel to each electric line.

Hereinafter, the operation of the insulation monitoring device 10 according to the third implementation will be described with reference to FIG. 17. The detection resistor disposed in the signal measurement unit 120 of the insulation monitoring device 10 may include a plurality of resistors that may be connected in parallel to the signal generation unit 130. In addition, some of the plurality of resistors may be connected through switches to have a structure in which the plurality of resistors can be connected in parallel under the control of the control unit 100.

In this case, when the time constant is not calculated as a result of the detection in step S1832 of FIG. 18B, the control unit 100 may further perform a step (not illustrated) of forming a circuit with the second electric path without including the second detection resistor Rm2 by controlling the changeover switch 1700. In this case, since the first detection resistor Rm1 is connected in series, the detection resistance may further increase.

Accordingly, the detection resistance value can increase, thereby increasing the slope ratio. In this case, once the increased slope ratio is equal to or greater than the threshold value, the control unit 100 may go to step S1812 of FIG. 18A to calculate the time constant when re-performing the process of FIG. 18A, and drive the insulation monitoring device 10 in the power saving mode for the idle time determined according to the time constant. This can reduce the power consumption of the insulation monitoring device.

On the other hand, in step S1833 of FIG. 18B, in order to increase the slope ratio, the control unit 100 can also simultaneously control at least one of the first switch 1600 and the second switch 1602 illustrated in FIG. 16, the changeover switch 1700 illustrated in FIG. 17, and the signal generation unit 130. That is, the control unit 100 may also control only the first and second switches 1600 and 1602 or only the changeover switch 1700 to increase the slope ratio. Alternatively, the control unit 100 may control only the signal generation unit 130 to increase the amplitude of the test pulse.

In addition, the control unit 100 may simultaneously control the first and second switches 1600 and 1602 and the changeover switch 1700. Alternatively, the control unit 100 may control the first switch 1600 and the second switch 1602 and simultaneously increase the amplitude of the test pulse. Alternatively, the control unit may also control the signal generation unit 130 to increase the amplitude of the test pulse while controlling the changeover switch 1700.

Alternatively, the control unit 100 may control the first switch 1600 and the second switch 1602, control the changeover switch 1700, and control the signal generation unit 130 to increase the amplitude of the test pulse all at the same time. That is, of course, all of the three control methods may be used together. As such, when two or more control methods are simultaneously used, it may be of course possible to increase the slope ratio more effectively than using only one control method.

Alternatively, the control unit 100 may first calculate the final insulation resistance by using any one control method (e.g., controlling any one of the first switch 1600 and the second switch 1602, the changeover switch 1700, and the signal generation unit 130), and then simultaneously use a plurality of control methods when the time constant is not calculated even though the one control method has been used.

That is, when the time constant is not calculated in the process of calculating the final insulation resistance, the control unit 100 may first increase the slope ratio by using only one of the first switch 1600 and the second switch 1602, the changeover switch 1700, or the signal generation unit 130. Nevertheless, when the time constant is not calculated in the process of calculating the next final insulation resistance, the control unit 100 may increase the slope ratio by simultaneously using two control methods. And when the time constant is still not calculated in the process of calculating the next final insulation resistance, the control unit 100 may increase the slope ratio by using all of the three control methods together.

Meanwhile, the implementation illustrates the configuration of performing the secondary tuning according to the initial sampling interval tn0 when the slope ratio calculated in step S1808 of FIG. 18A is less than the preset threshold value. However, unlike this, when the calculated slope ratio is less than the threshold value, a preset minimum slope ratio value may be applied. Then, the time constant can be calculated according to the operation result of the natural logarithm ln for the minimum slope ratio value and a time interval between the first reference point and the starting point. According to the calculated time constant, the initial sampling interval can be reset and the secondary tuning can be performed according to the reset initial sampling interval, as described in FIG. 19A.

Meanwhile, the foregoing description of the present disclosure has been given of the detailed implementations, but various modifications may be made without departing from the scope of the present disclosure. In particular, the implementation disclosed herein illustrates the case where the first error is 1% of the currently calculated average voltage and the second error is 5% of the currently calculated average voltage, but this is merely illustrative to help understanding of the present disclosure, and of course, the present disclosure may not be limited thereto.

In addition, the implementation disclosed herein assumes that the first time multiple is 1.66 and the second time multiple is 1.33, but this is merely illustrative to help understanding of the present disclosure, and of course, the present disclosure may not be limited thereto.

Also, it will be understood by those skilled in the art that various changes and modifications may be made without departing from the essential features of the invention. Therefore, the implementations disclosed in the present disclosure are not intended to limit the scope of the present disclosure but are merely illustrative, and it should be understood that the scope of the technical idea of the present disclosure is not limited by those implementations. That is, the scope of protection of the present disclosure should be construed according to the appended claims, and all technical ideas within the scope of equivalents thereof should be construed as being included in the scope of the present disclosure.

The invention claimed is:

1. An insulation monitoring device comprising insulation resistance disposed between an electric line of a system and a ground, the device comprising:
    a signal generation unit configured to apply a pulse signal having a voltage of a predetermined magnitude to the electric line;
    a signal measurement unit connected to the ground and configured to measure a voltage of the pulse signal applied from the ground when the pulse signal applied to the electric line is applied to the ground through the insulation resistance;
    an average voltage calculation unit configured to calculate an average voltage of voltages measured by the signal measurement unit during a sampling period according to a set sampling interval; and
    a control unit configured to calculate a sampling interval based on an initial sampling interval and a preset time multiple, calculate an average voltage as a first average voltage during a sampling period according to the calculated sampling interval, and detect the calculated first average voltage as a steady-state voltage according to whether a difference between the calculated first average voltage and a second average voltage calculated before the first average voltage is within a preset first error range, or update the sampling interval by applying a different time multiple according to the difference between the first average voltage and the second average voltage.

2. The insulation monitoring device of claim 1, wherein the control unit is configured to:
    update a sampling interval of a sampling period for calculating a next average voltage according to a first time multiple when the difference between the first average voltage and the second average voltage exceeds a preset second error range, and
    update the sampling interval of the sampling period for calculating the next average voltage according to a second time multiple when the difference between the first average voltage and the second average voltage is equal to or less than the preset second error range,
    wherein the second time multiple has a value smaller than the first time multiple, and
    wherein the second error range is larger than the first error range.

3. The insulation monitoring device of claim 1, further comprising a memory configured to store information related to different sampling intervals corresponding to a plurality of different time constants, respectively,
    wherein the control unit is configured to:
    calculate a first sampling interval according to one of an initial value calculated according to internal resistance of the insulation monitoring device, and a period of a preset noise frequency, which is greater than another,
    determine a plurality of interval determination time points for calculating a slope of a voltage measured by the signal measurement unit based on the first sampling interval,
    calculate a ratio between a first slope according to a voltage difference between interval determination time points including a plurality of first sampling intervals and a second slope according to a voltage difference between other interval determination time points including the plurality of first sampling intervals, and
    determine one of the different sampling intervals as the initial sampling interval based on a time constant corresponding to the calculated slope ratio.

4. The insulation monitoring device of claim 1, wherein the control unit is configured to:
    when the first average voltage is determined as a steady-state voltage according to a type of the applied pulse signal,
    control the signal generation unit to invert the pulse signal to a predetermined another type of pulse signal according to whether there is a steady-state voltage according to the predetermined another type of pulse signal, and control the signal measurement unit and the average voltage calculation unit to detect the steady-state voltage according to the another type of pulse signal.

5. The insulation monitoring device of claim 1, wherein the control unit is configured to:

control the signal generation unit, the signal measurement unit, and the average voltage calculation unit to check whether a preset number of insulation resistance values are calculated, and calculate the insulation resistance value again when the insulation resistance values less than the preset number are calculated, and calculate an average value of the calculated insulation resistance values so as to determine a final value of the insulation resistance when the preset number of insulation resistance values are calculated as a result of the check, control the signal generation unit, the signal measurement unit, and the average voltage calculation unit to calculate a difference between the calculated insulation resistance values when the preset number of insulation resistance values are calculated, change a noise frequency according to a preset ratio when the calculated difference exceeds a preset threshold value, and calculate the preset number of insulation resistance values again according to the changed noise frequency, and wherein the control unit is configured to:
check whether a period of the noise frequency is less than a preset minimum value when the final value of the insulation resistance is finally determined based on an average value of the preset number of insulation resistance values, and
determine the period of the noise frequency as the minimum value when the period of the noise frequency is less than the preset minimum value.

6. A method for controlling an insulation monitoring device comprising insulation resistance disposed between an electric line of a system and a ground, the method comprising:
applying a pulse signal having a voltage of a predetermined magnitude to the electric line;
determining an initial sampling interval;
calculating a sampling interval according to the determined initial sampling interval, calculating an average voltage during a sampling period according to the calculated sampling interval, and calculating an average voltage during a sampling period according to a sampling interval updated according to a first time multiple;
detecting whether a difference between a currently calculated first average voltage and a second average voltage measured before the first average voltage is within a preset first error range;
identifying the first average voltage as a steady-state voltage according to the applied pulse signal or updating the sampling interval by applying a different time multiple according to the difference between the first average voltage and the second average voltage, as a result of the detection;
repeatedly performing those steps of calculating the average voltage during the sampling period according to the updated sampling interval, detecting whether the difference between the voltages is within the preset first error range until the steady-state voltage is identified, and updating the sampling interval by applying the different time multiple;
detecting whether there is a steady-state voltage according to a pre-identified another type of pulse signal when the steady-state voltage is identified;
identifying the steady-state voltage according to the another type of pulse signal by inverting the pulse signal to the pre-identified another type of pulse signal and re-performing the determination of the initial sampling interval and the repeatedly performing step when the pre-identified another type of pulse signal is present as a result of detecting whether there is the steady-state voltage according to the pre-identified another type of pulse signal; and
calculating a value of the insulation resistance based on steady-state voltages according to different types of pulse signals when the pre-identified another type of pulse signal is present as a result of the detection of the step of detecting whether there is the steady-state voltage according to the pre-identified another type of pulse signal.

7. An insulation monitoring device comprising insulation resistance disposed between an electric line of a system and a ground, the device comprising:
a signal generation unit configured to apply a pulse signal having a voltage of a predetermined magnitude to the electric line;
a signal measurement unit connected to the ground and configured to measure a voltage of the pulse signal applied from the ground when the pulse signal applied to the electric line is applied to the ground through the insulation resistance;
an average voltage calculation unit configured to calculate an average voltage of voltages measured by the signal measurement unit during a sampling period according to a set sampling interval; and
a control unit configured to calculate a sampling interval based on an initial sampling interval and a preset time multiple, calculate an average voltage as a first average voltage during a sampling period according to the calculated sampling interval, performing a tuning process for comparing the calculated first average voltage with a second average voltage calculated before the first average voltage, and detect the second average voltage as a steady-state voltage according to whether a time elapsed from a sampling starting time point is a predetermined time or longer when the difference between the average voltages is within a preset error range, or re-performing the tuning process.

8. The insulation monitoring device of claim 7, wherein the control unit is configured to:
perform a primary tuning process according to a preset first time multiple,
perform a secondary tuning process for determining a sampling interval of a sampling period for calculating an average voltage according to a second time multiple different from the first time multiple when the difference between the first average voltage and the second average voltage is equal to or less than a preset first error range according to a result of the primary tuning, and
detect the second average voltage as a steady-state voltage according to whether the predetermined time has elapsed from a starting time point of the second tuning when the difference between the first average voltage and the second average voltage is equal to or less than a preset steady-state voltage error according to a result of the secondary tuning.

9. The insulation monitoring device of claim 8, wherein the control unit is configured to:
terminate the primary tuning when the difference between the first average voltage and the second average voltage is equal to or less than the preset first error as the result of the primary tuning,
determine at least one reference point based on a starting time point of the primary tuning, the initial sampling interval, and a termination time point of the primary tuning, to calculate a plurality of voltage slopes based on a voltage difference between voltages according to the determined at least one reference point, and calculate a time constant based on a slope ratio according to the calculated voltage slopes, to determine the predetermined time based on the calculated time constant.

10. The insulation monitoring device of claim 9, wherein the control unit is configured to:
determine, when the primary tuning is terminated, the starting time point of the primary tuning, a point of time that the initial sampling interval has elapsed from the starting point, the termination time point of the primary tuning, a point of time before the initial sampling interval from the termination time point of the primary tuning, as the reference points, to calculate the slope ratio according to Equation below based on the determined reference points $$\text{First slope} = \frac{\text{Second voltage} - \text{Starting voltage}}{\text{Second reference point} - \text{Starting point}} \quad \text{[Equation]}$$

$$\text{Second slope} = \frac{\text{Third voltage} - \text{First voltage}}{\text{third reference point} - \text{First reference point}}$$

$$\text{Slope ratio} = \frac{\text{Second slope}}{\text{First slope}}$$

where the starting point denotes a point of time at which the sampling is started, the first reference point denotes a point of time that an initial sampling interval has elapsed from the starting point, the third reference point denotes the termination time point of the primary tuning, the second reference point denotes a point of time before the initial sampling interval from the third reference point, the start voltage denotes a voltage of the starting point, the first voltage denotes a voltage of the first reference point, the second voltage denotes a voltage of the second reference voltage, and the third voltage denotes a voltage of the third reference point.

11. The insulation monitoring device of claim 10, wherein the control unit is configured to calculate a time constant τ according to an operation result of a natural logarithm (ln) with respect to the slope ratio and a time interval between the first reference point and the starting point, and determine the predetermined time based on a preset multiple of the calculated time constant.

12. The insulation monitoring device of claim 9, wherein the control unit is
configured to:
calculate the time constant according to whether the calculated slope ratio is equal to or greater than a preset threshold value, and
reset the initial sampling interval based on the calculated time constant and Equation below when the time constant is calculated, to perform the second tuning process based on the reset initial sampling interval,
perform the second tuning process based on the initial sampling interval when the time constant is not calculated according to a result of comparing the calculated slope ratio and the threshold value, and
when the calculated slope ratio is less than the preset threshold value, calculate a time constant according to an operation result of a natural logarithm (ln) with respect to a preset minimum slope ratio and a time interval between the starting time point of the primary tuning and a point of time that the initial sampling interval has elapsed from the starting time point $$t_n = -\ln(1 - 0.01) \times \tau \quad \text{[Equation]}$$

where $t_n$ denotes the reset initial sampling interval and τ denotes the time constant.

13. The insulation monitoring device of claim 12, further comprising a coupler resistor including a plurality of resistors connected in parallel to each electric line of the system, and a coupler resistor including switches for connecting some of the plurality of resistors to each electric line,
wherein the control unit controls the switches to connect the plurality of resistors in parallel to each electric line when the time constant is not calculated.

14. The insulation monitoring device of claim 12, further comprising a signal measurement unit including a first electric path including a first detection resistor and a second detection resistor, a second electric path not including the second detection resistor, and a changeover switch forming a circuit by being connected to the first detection resistor through one of the first electric path and the second electric path and configured to detect a voltage of the applied pulse signal based on a voltage across at least one detection resistor,
wherein the control unit controls the changeover switch to form a circuit by connecting the first detection resistor to the second electric path when the time constant is not calculated.

15. A method for controlling an insulation monitoring device comprising insulation resistance disposed between an electric line of a system and a ground, the method comprising:
applying a pulse signal having a voltage of a predetermined magnitude to the electric line;
determining an initial sampling interval;
performing primary tuning of calculating a sampling interval based on the initial sampling interval and a first time multiple, calculate an average voltage as a first average voltage during a sampling period according to the calculated sampling interval, and comparing the calculated first average voltage and a second average voltage calculated before the first average voltage;
detecting whether a difference between the first average voltage and the second average voltage is within a preset first error range as a result of the primary tuning;
terminating the primary tuning and performing secondary tuning of calculating a sampling interval based on a preset sampling interval and a second time multiple, calculating an average voltage as a third average voltage during a sampling period according to the calculated sampling interval, and comparing the calculated third average voltage and a fourth average voltage calculated before the third average voltage;
detecting whether a difference between the third average voltage and the fourth average voltage is within a steady voltage error range as a result of the secondary tuning;
detecting whether a predetermined time has elapsed from a starting time point of the secondary tuning when the difference between the third average voltage and the fourth average voltage is within the steady voltage error range, to detect the third average voltage as a steady-state voltage according to the applied pulse signal when the predetermined time has elapsed; and
repeatedly performing the secondary tuning when the difference between the third average voltage and the fourth average voltage exceeds the steady voltage error range as a result of the secondary tuning or when a predetermined time has not elapsed from the starting time point of the secondary tuning.

16. An insulation monitoring device comprising insulation resistance disposed between an electric line of a system and a ground, the device comprising:
   a signal generation unit configured to apply a pulse signal having a voltage of a predetermined magnitude to the electric line;
   a signal measurement unit connected to the ground and configured to measure a voltage of the pulse signal applied from the ground when the pulse signal applied to the electric line is applied to the ground through the insulation resistance;
   an average voltage calculation unit configured to calculate an average voltage of voltages measured by the signal measurement unit during a sampling period according to a set sampling interval; and
   a control unit configured to calculate a sampling interval based on an initial sampling interval and a preset time multiple, calculate an average voltage as a first average voltage during a sampling period according to the calculated sampling interval, performing a tuning process for calculating a difference between the calculated first average voltage and a second average voltage calculated before the first average voltage, and detect the first average voltage as a steady-state voltage when the difference between the average voltages satisfies a preset steady voltage error,
   wherein the control unit switches an operation state into a power saving mode for a preset idle time when the difference between the first average voltage and the second average voltage satisfies a preset error condition, and resumes a tuning process of detecting the steady-state voltage by calculating the average voltages when the idle time elapses.

17. The insulation monitoring device of claim 16, wherein the control unit is configured to:
   perform a primary tuning process according to a preset first time multiple, and switch the operation state to the power saving mode for the idle time when the difference between the first average voltage and the second average voltage is less than or equal to a preset first error, and
   perform a secondary tuning process of determining a sampling interval of a sampling period for calculating an average voltage according to a second time multiple different from the first time multiple when the tuning process is resumed.

18. The insulation monitoring device of claim 17, wherein the control unit is configured to terminate the primary tuning when the difference between the first average voltage and the second average voltage is equal to or less than the preset first error as a result of the primary tuning,
   determine at least one reference point based on a starting time point of the primary tuning, the initial sampling interval, and a termination time point of the primary tuning, and calculate a plurality of voltage slopes based on a voltage difference between voltages according to the determined at least one reference point, and
   calculate a time constant based on a slope ratio according to the calculated voltage slopes, and determine the idle time based on the calculated time constant,
   determine whether the time constant is calculated according to a result of comparing the calculated slope ratio with the preset threshold value, and when the time constant is not calculated according to the comparison result, calculate the time constant according to an operation result of a natural logarithm (ln) with respect to a preset minimum slope ratio and a time interval between a starting time point of the primary tuning and a point of time that the initial sampling interval has elapsed from the starting time point.

19. The insulation monitoring device of claim 18, wherein the control unit is configured to:
   determine whether the time constant is calculated according to a result of comparing the calculated slope ratio with a preset threshold value, and
   further calculate a value of leakage capacitance according Equation below based on the calculated time constant when the insulation resistance is calculated according to a steady-state voltage detected after the idle time determined according to the time constant has elapsed $$C_e = \frac{\tau}{(R_e \| R_i)} \quad \text{[Equation]}$$

where $\tau$ denotes the time constant, $R_e$ denotes a value of the insulation resistance, $R_i$ denotes a value of internal resistance of the insulation monitoring device, and the threshold value denotes a minimum value of a calculation range in which the leakage capacitance can be calculated.

20. The insulation monitoring device of claim 18, wherein the control unit is configured to determine whether the time constant is calculated according to a result of comparing the calculated slope ratio with the preset threshold value, and perform the secondary tuning process based on the initial sampling interval and the second time multiple when the time constant is not calculated according to the comparison result.

21. The insulation monitoring device of claim 20, further comprising a coupler resistor including a plurality of resistors connected in parallel to each electric line of the system, and a coupler resistor including switches for connecting some of the plurality of resistors to each electric line, and
   wherein the control unit controls the switches to connect the plurality of resistors in parallel to each electric line when the time constant is not calculated.

22. The insulation monitoring device of claim 20, further comprising a signal measurement unit including a first electric path including a first detection resistor and a second detection resistor, a second electric path not including the second detection resistor, and a changeover switch forming a circuit by being connected to the first detection resistor through one of the first electric path and the second electric path and configured to detect a voltage of the applied pulse signal based on a voltage across at least one detection resistor,
   wherein the control unit controls the changeover switch to form a circuit by connecting the first detection resistor to the second electric path when the time constant is not calculated.

23. A method for controlling an insulation monitoring device comprising insulation resistance disposed between an electric line of a system and a ground, the method comprising:
   applying a pulse signal having a voltage of a predetermined magnitude to the electric line;
   determining an initial sampling interval;

performing primary tuning of calculating a sampling interval based on the initial sampling interval and a first time multiple, calculating an average voltage as a first average voltage during a sampling period according to the calculated sampling interval, and comparing the calculated first average voltage and a second average voltage calculated before the first average voltage;

repeatedly performing the primary tuning when a difference between the first average voltage and the second average voltage exceeds a preset first error range as a result of the primary tuning;

determining at least one reference point when the difference between the first average voltage and the second average voltage is within the first error range as the result of the primary tuning, and calculating a slope ratio based on voltage slopes according to a voltage difference between voltages according to the at least one reference point;

calculating a time constant based on the calculated slope ratio;

switching an operation state of the insulation monitoring device to an idle state for an idle time determined according to the calculated time constant;

checking whether the idle time has elapsed, to switch the operation state to an active state according to a result of the check;

performing a secondary tuning of calculating a sampling interval based on a reset initial sampling interval and a second time multiple when the operation state is switched to the active state, calculating an average voltage as a third average voltage during a sampling period according to the calculated sampling interval, and comparing the calculated third average voltage and a fourth average voltage calculated before the third average voltage;

detecting the third average voltage as a steady-state voltage according to the applied pulse signal when the difference between the third average voltage and the fourth average voltage is within a steady voltage error range as a result of the secondary tuning; and repeatedly performing the secondary tuning when the difference between the third average voltage and the fourth average voltage exceeds the steady voltage error range as the result of the secondary tuning.

\* \* \* \* \*